(12) United States Patent
Tal et al.

(10) Patent No.: US 7,787,563 B2
(45) Date of Patent: Aug. 31, 2010

(54) TRANSMITTER FOR WIRELESS APPLICATIONS INCORPORATION SPECTRAL EMISSION SHAPING SIGMA DELTA MODULATOR

(75) Inventors: Nir Tal, Haifa (IL); Sameh S. Rezeq, Dallas, TX (US); Robert B. Staszewski, Garland, TX (US); Oren E. Eliezer, Plano, TX (US); Ofer Friedman, Yehud (IL)

(73) Assignee: Texas Instruments Incorporated, Dallas, TX (US)

( * ) Notice: Subject to any disclaimer, the term of this patent is extended or adjusted under 35 U.S.C. 154(b) by 1168 days.

(21) Appl. No.: 11/297,524

(22) Filed: Dec. 7, 2005

(65) Prior Publication Data

US 2006/0119493 A1    Jun. 8, 2006

Related U.S. Application Data

(60) Provisional application No. 60/634,658, filed on Dec. 8, 2004.

(51) Int. Cl.
    *H04L 25/49* (2006.01)
(52) U.S. Cl. ..................................... 375/297
(58) Field of Classification Search ................. 375/295, 375/296, 297; 341/143; 455/91, 102, 115, 455/118, 126; 332/126, 127; 327/127; 398/183, 398/185
    See application file for complete search history.

(56) References Cited

U.S. PATENT DOCUMENTS 5,917,440 A * 6/1999 Khoury ....................... 341/143

| 6,741,197 B1 * | 5/2004 | Melanson .................... 341/150 |
| 6,791,422 B2 | 9/2004 | Staszewski et al. ........ 331/36 C |
| 6,809,598 B1 | 10/2004 | Staszewski et al. ............ 331/16 |
| 7,346,122 B1 * | 3/2008 | Cao ............................ 375/296 |
| 7,359,680 B2 * | 4/2008 | Klemmer .................... 455/102 |
| 2004/0037363 A1 | 2/2004 | Norsworthy et al. ........ 375/259 |

(Continued)

OTHER PUBLICATIONS

R. Staszewski, D. Leipold, K. Muhammad, and P. Balsara, "Digitally Controlled Oscillator (DCO)-Based Architecture for RF Frequency Synthesis in a Deep-Submicrometer CMOS Process," Circuits and Systems II: Analog and Digital Signal Processing, IEEE Transactions on Circuits and Systems II, vol. 50, pp. 815-828, Nov. 2003.

(Continued)

*Primary Examiner*—Sam K Ahn
(74) *Attorney, Agent, or Firm*—Frederick J. Telecky, Jr.; Wade J. Brady, III

(57) ABSTRACT

A transmitter employing a sigma delta modulator having a noise transfer function adapted to shift quantization noise outside at least one frequency band of interest. A technique is presented to synthesize the controllers within a single-loop sigma delta modulator such that the noise transfer function can be chosen arbitrarily from a family of functions satisfying certain conditions. Using the novel modulator design technique, polar and Cartesian (i.e. quadrature) transmitter structures are supported. A transmitter employing polar transmit modulation is presented that shapes the spectral emissions of the digitally-controlled power amplifier such that they are significantly and sufficiently attenuated in one or more desired frequency bands. Similarly, a transmitter employing Cartesian transmit modulation is presented that shapes the spectral emissions of a hybrid power amplifier such that they are significantly and sufficiently attenuated in one or more desired frequency bands.

19 Claims, 27 Drawing Sheets

U.S. PATENT DOCUMENTS

2005/0099327 A1* 5/2005 Robinson et al. ............ 341/143
2006/0245517 A1* 11/2006 Ikedo et al. ................. 375/297

OTHER PUBLICATIONS

R. Staszewski, C. M. Hung, D. Leipold, and P. Balsara, "A First Multigigahertz Digitally Controlled Oscillator For Wireless Applications," Microwave Theory and Techniques, IEEE Transactions on Microwave Theory and Techniques, vol. 51, No. 11, pp. 2154-2164, Nov. 2003.

R. Staszewski, C.-M. Hung, K. Maggio, J. Wallberg, D. Leipold, and P. Balsara, "All-Digital Phase-Domain TX Frequency Synthesizer for Bluetooth Radios in 0.13μm CMOS," in Solid-State Circuits Conference, 2004. Digest of Technical Papers. ISSCC 2004 IEEE International Solid State Circuits Conference, vol. 1, Feb. 2004, pp. 272-527.

* cited by examiner

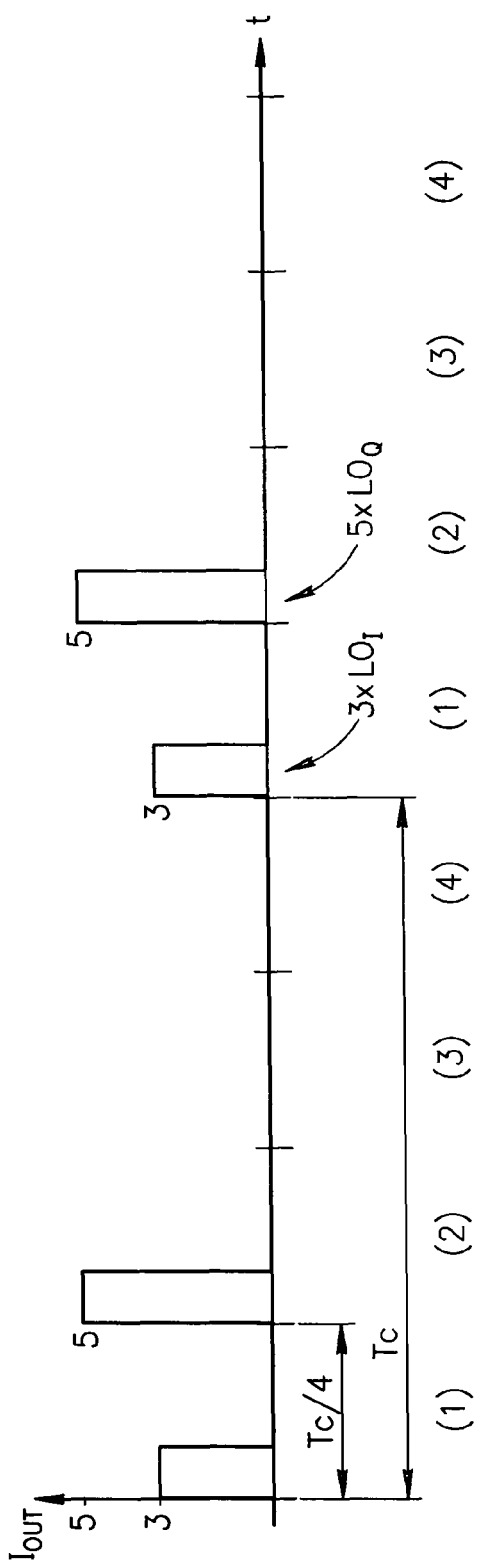
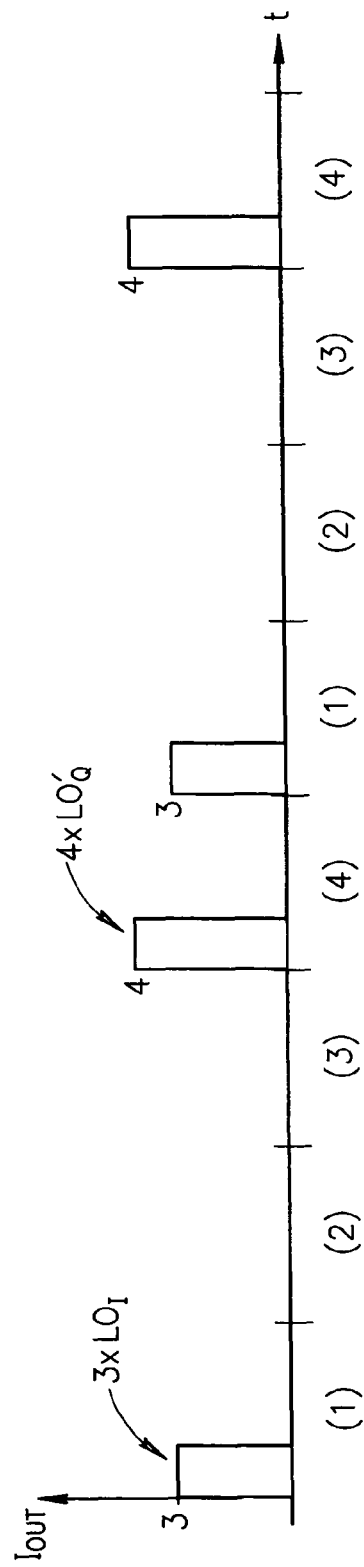
FIG. 40A
FIG. 40B

TRANSMITTER FOR WIRELESS APPLICATIONS INCORPORATION SPECTRAL EMISSION SHAPING SIGMA DELTA MODULATOR

REFERENCE TO RELATED APPLICATION

This application claims priority to U.S. Provisional Application Ser. No. 60/634,658, filed Dec. 8, 2004, entitled "Synthesis Of Sigma Delta Modulators From Arbitrary Noise Transfer Functions", incorporated herein by reference in its entirety.

FIELD OF THE INVENTION

The present invention relates to the field of data communications and more particularly relates to a transmitter employing a sigma delta modulator having a noise transfer function that is adapted to shift quantization noise outside at least one frequency band of interest.

BACKGROUND OF THE INVENTION

Digital RF Processor or Digital Radio Processor (DRP™) based transceivers are also known in the art. The performance of DRP based transmitters is typically limited by the quantization noise of the digital power amplifier (DPA). DPA architectures employing large bit widths, e.g., 10, 12 or more bits, incorporating many hundreds of transistors become unfeasible due to the level of quantization noise generated. The quantization noise generated is sufficient to cause the transmitter to fail to meet the specifications of cellular or other communications standards, depending on the particular application.

Sigma delta or delta sigma modulators are known in the art. Digital sigma delta modulators are currently used in CMOS wireless SoC designs to achieve high resolution data conversion while controlling the quantization noise spectrum. Conventional sigma delta modulators typically have a high pass transfer function. In other words, they amplify the noise (or push the noise into higher frequencies) as the frequency difference from the carrier frequency increases. In DRP applications, this characteristic is undesirable. In fact, the opposite is desired in certain frequency bands wherein noise is attenuated as the frequency increases from the center frequency.

Further, conventional sigma delta modulator structures designed to achieve such noise shaping are hardware intensive, are not designed to exhibit an arbitrary noise transfer function and typically do not meet the requirements of communication standards such as typical cellular standards.

Thus, there is a need for a technique for synthesizing a sigma delta modulator to have an arbitrary noise transfer function whereby quantization noise can be shifted from one frequency band to another. There is a further need for a DRP transmitter incorporating a spectral emission shaping sigma delta modulator that is able to shape the quantization noise of the transmitter so as to avoid certain frequency bands.

SUMMARY OF THE INVENTION

The present invention provides a solution to the problems of the prior art by providing a novel and useful transmitter employing a sigma delta modulator having a noise transfer function adapted to shift quantization noise outside at least one frequency band of interest. A technique is presented to synthesize the controllers within a single-loop delta sigma modulator such that the noise transfer function can be chosen arbitrarily from a family of functions satisfying certain conditions. Using the novel modulator design technique, a polar and Cartesian transmit modulation technique is presented. A transmitter employing polar transmit modulation is presented that shapes the spectral emissions of the digitally-controlled power amplifier such that they are significantly and sufficiently attenuated in one or more desired frequency bands. Similarly, a transmitter employing Cartesian transmit modulation is presented that shapes the spectral emissions of a hybrid power amplifier such that they are significantly and sufficiently attenuated in one or more desired frequency bands. This technique enables the designer to use virtually unfiltered amplitude modulation and create desired noise shaping using a digital sigma delta modulator.

Assuming a linear model (additive, signal independent uniform white quantization noise), the invention provides a technique to synthesize the controllers within a single-loop delta sigma modulator such that the noise transfer function can be chosen arbitrarily from a family of functions satisfying certain conditions.

In the case of a polar transmitter, the present invention is operative to shape the quantization noise through sigma delta modulation of the amplitude (i.e. the magnitude) so as to avoid one or more restricted bands wherein transmission noise must be kept below a specified level. Note that the noise is not necessarily made flat but rather noise is increased in certain places and reduced other in order to meet cellular or other communication standards requirements. Thus, the invention does not eliminate quantization noise but rather shifts it out of some bands and into others in accordance with the particular communication standard.

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the invention, a polar transmitter comprising a first input for receiving an amplitude information signal, a second input for receiving an angle information signal, a frequency synthesizer coupled to the second input and operative to generate an angle modulated carrier signal in accordance with the angle information signal, a sigma delta modulator having an associated noise transfer function, the sigma delta modulator coupled to the first input and operative to generate a dithered amplitude signal therefrom and to selectively attenuate the noise transfer function, an amplifier coupled to the frequency synthesizer and the sigma delta modulator, the amplifier operative to control the amplitude of the angle modulated carrier signal in accordance with the dithered amplitude signal and wherein quantization noise exhibited by the amplifier is significantly attenuated at one or more selected frequencies.

There is also provided in accordance with the invention, a radio frequency (RF) polar transmitter comprising a first digital input for receiving an amplitude control word signal, a second digital input for receiving a frequency control word signal, a frequency synthesizer coupled to the second digital input and operative to generate a phase modulated carrier signal in accordance with the frequency control word signal, a sigma delta modulator having an associated noise transfer function, the sigma delta modulator coupled to the first digital input and operative to generate a dithered amplitude control signal and to selectively attenuate the noise transfer function, a digitally controlled amplifier comprising a plurality of discrete levels of amplitude and coupled to the frequency synthesizer and the sigma delta modulator, the amplifier operative to control the amplitude of the phase modulated carrier signal in accordance with the dithered amplitude control signal and wherein quantization noise exhibited by the amplifier is significantly attenuated at one or more selected frequencies.

There is further provided in accordance with the invention, a method of polar modulation, the method comprising the steps of receiving an amplitude information signal, receiving an angle information signal, generating an angle modulated carrier signal in accordance with the angle information signal, inputting the angle modulated carrier signal to an amplifier having a plurality of discrete output amplitude levels, controlling the amplitude of the output of the amplifier in accordance with the amplitude information signal and wherein the step of controlling provides selective attenuation of a noise transfer function resulting in substantial attenuation of quantization noise exhibited by the amplifier at one or more selected frequencies.

There is also provided in accordance with the invention, a quadrature transmitter comprising a first input for receiving an in-phase information signal, a second input for receiving a quadrature information signal, a first sigma delta modulator having an associated first noise transfer function, the first sigma delta modulator coupled to the first input and operative to generate a dithered in-phase signal therefrom and to selectively attenuate the first noise transfer function, a second sigma delta modulator having an associated second noise transfer function, the second sigma delta modulator coupled to the second input and operative to generate a dithered quadrature signal therefrom and to selectively attenuate the second noise transfer function, an amplifier coupled to the first sigma delta modulator and the second sigma delta modulator, the amplifier operative to combine the output of the first sigma delta modulator and the second sigma delta modulator to yield a combined radio frequency output signal and wherein quantization noise exhibited by the amplifier is significantly attenuated at one or more selected frequencies.

There is further provided in accordance with the invention, a quadrature transmitter comprising a first input for receiving an I+Q information signal, a second input for receiving a I−Q information signal, a first sigma delta modulator having an associated first noise transfer function, the first sigma delta modulator coupled to the first input and operative to generate a dithered I+Q signal therefrom and to selectively attenuate the first noise transfer function, a second sigma delta modulator having an associated second noise transfer function, the second sigma delta modulator coupled to the second input and operative to generate a dithered I−Q signal therefrom and to selectively attenuate the second noise transfer function, an amplifier coupled to the first sigma delta modulator and the second sigma delta modulator, the amplifier operative to combine the output of the first sigma delta modulator and the second sigma delta modulator to yield a combined radio frequency (RF) output signal and wherein quantization noise exhibited by the amplifier is significantly attenuated at one or more selected frequencies.

There is also provided in accordance with the invention, a hybrid Cartesian/polar transmitter comprising a first input for receiving an in-phase information signal, a second input for receiving a quadrature information signal, a first sigma delta modulator having an associated first noise transfer function, the first sigma delta modulator coupled to the first input and operative to generate a dithered in-phase signal therefrom and to selectively attenuate the first noise transfer function, a second sigma delta modulator having an associated second noise transfer function, the second sigma delta modulator coupled to the second input and operative to generate a dithered quadrature signal therefrom and to selectively attenuate the second noise transfer function, means for generating an amplitude information signal and an angle information signal from the the output of the first sigma delta modulator and the output of the second sigma delta modulator, a frequency synthesizer operative to generate an angle modulated carrier signal in accordance with the angle information signal, a hybrid amplifier comprising a plurality of discrete levels of amplitude and coupled to the frequency synthesizer, the first sigma delta modulator and the second sigma delta modulator, the hybrid amplifier operative to dynamically switch between a polar operation and a Cartesian operation depending on the output of the first sigma delta modulator and to control the amplitude of the angle modulated carrier signal in accordance with the amplitude information signal and wherein the selective attenuation of the noise transfer functions of the first sigma delta modulator and the second sigma delta modulator is operative to substantially reduce quantization noise of the hybrid amplifier at one or more selected frequencies.

There is further provided in accordance with the invention, a polar transmitter comprising a first input for receiving an amplitude information signal, a second input for receiving an angle information signal, a frequency synthesizer coupled to the second input and operative to generate an angle modulated carrier signal in accordance with the angle information signal, a sigma delta modulator having an associated noise transfer function, the sigma delta modulator coupled to the first input and operative to generate a dithered amplitude signal therefrom and to encode data such that quantization noise exhibited by an amplifier is distributed outside at least one frequency band of interest, the sigma delta modulator comprising a programmable order low pass sigma delta stage, a programmable order band pass sigma delta stage, or any combination thereof, a comb filter, a combiner operative to combine the output of the programmable order low pass sigma delta stage, the programmable order band pass sigma delta stage and the comb filter and the amplifier comprising a plurality of discrete levels of amplitude and adapted to receive the output of the frequency synthesizer and the sigma delta modulator, the amplifier operative to control the amplitude of the angle modulated carrier signal in accordance with the output of the sigma delta modulator.

There is also provided in accordance with the invention, a polar transmitter comprising a first input for receiving an amplitude information signal, a second input for receiving an angle information signal, a frequency synthesizer coupled to the second input and operative to generate an angle modulated carrier signal in accordance with the angle information signal, a MASH type sigma delta modulator having an associated noise transfer function comprising one or more notches for providing significant attenuation at one or more selected frequencies, the sigma delta modulator coupled to the first input and operative to generate a dithered amplitude signal therefrom and to selectively attenuate the noise transfer function, the sigma delta modulator comprising at least one sigma delta stage, a comb filter, a combiner operative to combine the output of the at least one sigma delta stage and the comb filter and an amplifier comprising a plurality of discrete levels of amplitude and coupled to the frequency synthesizer and the sigma delta modulator, the amplifier operative to control the amplitude of the angle modulated carrier signal in accordance with the dithered amplitude signal.

BRIEF DESCRIPTION OF THE DRAWINGS

The invention is herein described, by way of example only, with reference to the accompanying drawings, wherein:

FIGS. 40A and 40B are diagrams illustrating waveforms of example outputs of the array for the modulator structure of FIG. 39.

DETAILED DESCRIPTION OF THE INVENTION

Notation Used Throughout

Figure 1:
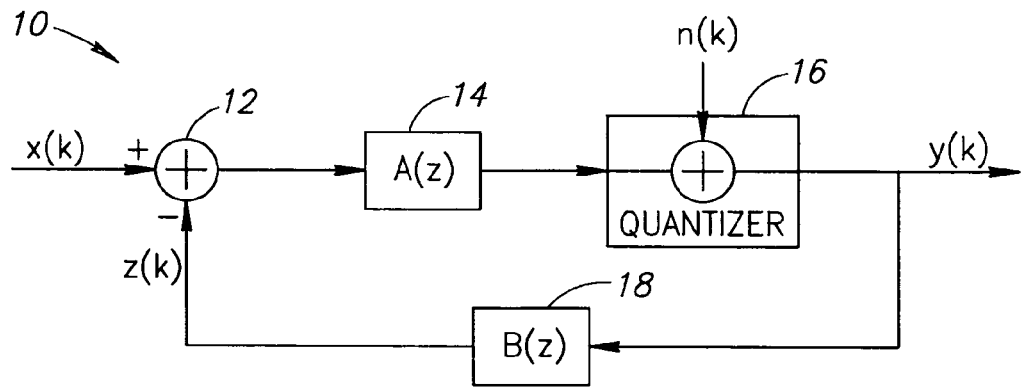
FIG. 1 is a block diagram illustrating a linear model of a single loop general $\Delta\Sigma$ modulator.

The following notation is used throughout this document.

| Term | Definition |
|---|---|
| ACW | Amplitude Control Word |
| ADC | Analog to Digital Converter |
| ADPLL | All Digital Phase Locked Loop |
| ASIC | Application Specific Integrated Circuit |
| AWG | Augmented Wiener Hopf |
| BIBO | Bounded Input/Bounded Output |
| BPSK | Binary Phase Shift Keying |
| CMOS | Complementary Metal Oxide Semiconductor |
| CORDIC | Coordinate Rotation Digital Computer |
| DAC | Digital to Analog Converter |
| DBB | Digital Baseband |
| DC | Direct Current |
| DCO | Digitally Controlled Oscillator |
| DCS | Digital Cellular System |
| DD | Decision Directed |
| DFE | Decision Feedback Equalizer |
| DNL | Differential Nonlinearity |
| DPA | Digital Power Amplifier |
| DRP | Digital RF Processor or Digital Radio Processor |
| DSB | Double Side Band |
| DSP | Digital Signal Processor |
| EDGE | Enhanced Data rates for Global Evolution |
| EVM | Error Vector Magnitude |
| FCW | Frequency Control Word |
| FFE | Feed Forward Equalizer |

-continued

| Term | Definition |
| --- | --- |
| FFT | Fast Fourier Transform |
| FM | Frequency Modulation |
| FPGA | Field Programmable Gate Array |
| GSM | Global System for Mobile Communication |
| HDL | Hardware Description Language |
| IIR | Infinite Impulse Response |
| INL | Integral Nonlinearity |
| LAN | Local Area Network |
| LO | Local Oscillator |
| LPF | Low Pass Filter |
| LTI | Linear Time Invariant |
| MSE | Mean Squared Error |
| NP | Noise Predictor |
| NTF | Noise Transfer Function |
| PA | Power Amplifier |
| PLL | Phase Locked Loop |
| PPA | Pre-Power Amplifier |
| PSD | Power Spectral Density |
| RF | Radio Frequency |
| RLS | Recursive Least Square |
| SAM | Sigma Delta Amplitude Modulation |
| SAW | Surface Acoustic Wave |
| SD | Sigma Delta |
| SNR | Signal to Noise Ratio |
| SoC | System on Chip |
| SSB | Single Side Band |
| STF | Signal Transfer Function |
| TNG | Total Noise Gain |
| UWB | Ultra Wideband |
| VCO | Voltage Controlled Oscillator |
| WCDMA | Wideband Code Division Multiple Access |
| WLAN | Wireless Local Area Network |

Detailed Description of the Invention

The present invention provides a solution to the problems of the prior art by providing a novel and useful transmitter employing a sigma delta modulator having a noise transfer function adapted to shift quantization noise outside at least one frequency band of interest. A technique is presented to synthesize the controllers within a single-loop delta sigma modulator such that the noise transfer function can be chosen arbitrarily from a family of functions satisfying certain conditions. Using the novel modulator design technique, a polar and Cartesian transmit modulation technique is presented. A transmitter employing polar transmit modulation is presented that shapes the spectral emissions of the digitally-controlled power amplifier such that they are significantly and sufficiently attenuated in one or more desired frequency bands. Similarly, a transmitter employing Cartesian transmit modulation is presented that shapes the spectral emissions of a hybrid power amplifier such that they are significantly and sufficiently attenuated in one or more desired frequency bands. This technique enables the designer to use virtually "unfiltered" (i.e. by continuous-time filtering) amplitude modulation and create desired noise shaping using a digital sigma delta modulator.

The sigma delta modulator circuit architecture can be used in a polar modulator in an ADPLL within a digital radio processor. To aid in understanding the principles of the present invention, the description of the spectral emission shaping sigma delta modulator is provided, in one example embodiment, in the context of an all digital PLL (ADPLL) based RF transmitter. An ADPLL suitable for use in the present invention is described in more detail in U.S. Pat. Nos. 6,791,422 and 6,809,598 and U.S. application Ser. No. 11/203,019, filed Aug. 11, 2005, entitled "Hybrid Polar/Cartesian Digital Modulator", all of which are incorporated herein by reference in their entirety.

The invention is intended for use in a radio transmitter and transceiver but can be used in other applications as well. It is appreciated by one skilled in the art that the spectral emission shaping sigma delta modulator scheme of the present invention is not limited for use with any particular communication standard (wireless or otherwise) can be adapted for use with numerous wireless (or wired) communications standards such as EDGE, extended data rate Bluetooth, WCDMA, Wireless LAN (WLAN), Ultra Wideband (UWB), coaxial cable, radar, optical, etc. Further, the invention is not limited for use with a specific modulation scheme but is applicable to other complex amplitude modulation schemes as well.

Note that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. In addition, the terms sigma delta ($\Sigma\Delta$) and delta sigma ($\Delta\Sigma$) are used interchangeably and are intended to 1 Synthesis of $\Delta\Sigma$ Modulators from Arbitrary Noise Transfer Functions Assuming a linear model (i.e. additive, signal independent uniform white quantization noise), the present invention provides a technique to synthesize the controllers within a single-loop Delta Sigma ($\Delta\Sigma$) modulator such that the noise transfer function can be picked arbitrarily from a family of functions satisfying certain conditions.

1.1 Introduction

Delta sigma ($\Delta\Sigma$) modulators have become basic building blocks in many fields in electronics (e.g., analog to digital and digital to analog converters, DC to DC converters). The concept of modulating a high frequency waveform with a low number of bits, while opting to shape the quantization noise away from the signal lends itself to low current, mid frequency and high resolution applications. Determining the spectrum of the noise depends on the input signal and is a difficult task due to the presence of a nonlinear quantizer in the feedback loop. Under the premise of a uniform, signal independent and additive white quantization noise (henceforth "the linear model") the system can easily be analyzed with linear system tools. Several works provide insight into the moments and spectra of the quantization noise under either a DC or sinusoidal input without the use of a signal-independent, white noise assumption for both single-loop as well as multi-loop $\Delta\Sigma$ modulators.

The linear model provides an approximation of the modulator behavior to signal excitations and output noise spectrum. This approximation has been shown to be quite good for several cases and very poor for others (e.g. DC). Several conditions with which the linear model approximation provides good results include:

1) The quantizer does not overload;
2) The quantizer has a large number of levels;
3) The bin width or distance between levels is small; and
4) The probability distribution of pairs of input samples is given by a smooth probability density function (PDF).

In most oversampled ΔΣ ADCs these assumptions are not likely to hold since usually a 1-bit (i.e. 2-level) quantizer is used, the bin width is not small and the quantizer is likely to overload. In other applications such as high-rate oversampled DACs using a multiple bit quantizers the assumptions may hold and the linear model may provide significant insight into the loop's behavior.

The invention assumes the linear model as the basis for the following analyses and provides a synthesis technique through which single-loop ΔΣ modulators with arbitrary noise transfer functions (NTF) can be synthesized.

Following is a brief outline of this work. Section 1.2 outlines the problem as well as the various conditions a solution (synthesis procedure) must meet. Section 1.3 shows the underlying mathematical foundations for the synthesis procedure in Section 1.4. A theorem is proven whereby the overall noise energy out of a ΔΣ modulator satisfying several conditions is always greater than or equal to the unmodulated noise energy. A sufficient no-overloading condition for such systems through non-linear analysis is provided. A numerical example is shown of an application of the synthesis procedure along with a comparison of the resultant modulator to a standard $4^{th}$ order ΔΣ modulator. Also described is a simulation of a communications system employing the modulator presented herein and a modified $4^{th}$ order modulator. The results are compared against well-known theoretical MSE results.

1.2 Statement of the Problem

A block diagram illustrating a linear model of a single loop general ΔΣ modulator is shown in FIG. 1. The model, generally referenced 10, comprises general single-loop ΔΣ modulator with arbitrary linear time-invariant (LTI), causal and Bounded Input Bounded Output (BIBO) stable controllers A 14 and B 18, characterized by their system functions (the z-transform of their respective impulse response) A(z) and B(z) respectively.

We assume that the quantizer 16 can be modeled as a uniform, signal independent and i.i.d additive noise source and is distributed $n(k) \sim U(-\Delta/2, \Delta/2)$. Where Δ is the quantizer step size.

The signal and noise transfer functions of such a system are given by:

$$STF(z) \stackrel{def}{=} \frac{Y(z)}{X(z)} = \frac{A(z)}{1 + A(z)B(z)} \quad (1)$$

$$NTF(z) \stackrel{def}{=} \frac{Y(z)}{N(z)} = \frac{1}{1 + A(z)B(z)} \quad (2)$$

Where Y(z), X(z) and N(z) are the z-transforms of y(k), x(k) and n(k) respectively.

Assuming that the controllers can be represented as a quotient of polynomials (of $z^{-1}$):

$$A(z) = \frac{W(z)}{Q(z)} \quad (3)$$

$$B(z) = \frac{P(z)}{R(z)} \quad (4)$$

We wish to synthesize a system {W(z),Q(z), P(z),R(z)} that satisfies the following conditions:

1) The system shall have an arbitrary given Noise Transfer Function (NTF):

$$NTF(z) = \frac{B_d(z)}{A_d(z)} \quad (5)$$

Where $B_d(z)$ and $A_d(z)$ are arbitrary polynomials of $z^{-1}$ and the desired NTF is a BIBO stable and causal system.

2) The system shall be causal.
3) The Signal Transfer Function (STF) shall have a unity gain at a given frequency $z=e^{j\theta}$ $$STF(z)|_{z=e^{j\theta}} \stackrel{def}{=} \frac{Y(z)}{X(z)}\bigg|_{z=e^{j0}} = 1 \quad (6)$$

4) All resultant controllers {W(z),Q(z), P(z),R(z)} shall be real (i.e. real functions of z).
5) The resultant (linear equivalent) system shall be BIBO stable to both signal and noise excitations.

1.3 Formulation

In this section, the underlying equations for the synthesis procedure in Section 1.4 are derived, following the conditions outlined in Section 1.2.

1.3.1 Condition 1—Noise Transfer Function

Substituting (3) and (4) into (1) and (2), we obtain:

$$STF(z) = \frac{R(z)W(z)}{R(z)Q(z) + W(z)P(z)} \quad (7)$$

$$NTF(z) = \frac{Q(z)R(z)}{R(z)Q(z) + W(z)P(z)} \quad (8)$$

Following (5):

$$NTF(z) = \frac{R(z)Q(z)}{R(z)Q(z) + W(z)P(z)} = \frac{B_d(z)}{A_d(z)} \quad (9)$$

Equating the numerator and denominator we obtain:

$$R(z)Q(z) = B_d(z) \quad (10)$$

$$W(z)P(z) = A_d(z) - B_d(z) \quad (11)$$

1.3.2 Condition 2—Causality

For the system of FIG. 1 to be causal and therefore implementation ready, the product of the impulse responses of A and B at the $0^{th}$ sampling instance must be zero. This means that controllers A and B should contain (or either one of their z-transforms be divisible by) a serial pure delay element ($z^{-1}$).

Proof: setting n(k)=0, since A is LTI and causal:

$$y(0) = h_A(0)[x(0) - z(0)] \quad (12)$$

Where $h_A(0)$ is the impulse response of A at the $0^{th}$ sampling instance. Since B is LTI and causal:

$$z(0)=h_B(0)y(0) \quad (13)$$

Where $h_B(0)$ is the impulse response of B at the $0^{th}$ sampling instance. Combining (12) and (13), we obtain:

$$y(0)=h_A(0)[x(0)-h_B(0)y(0)] \quad (14)$$

Since the output of a causal system depends only on its present and past inputs we obtain that $h_B(0)y(0)=0$, which means that either $h_B(0)=0$ or $\forall x(0), y(0)=0 \Rightarrow h_A(0)=0$. Therefore since $h_A(0), h_B(0)$ are finite:

$$h_A(0)h_B(0)=0 \quad (15)$$

Since both A and B are BIBO stable and causal, their regions of convergence (ROC) are the exterior of circles, which include the unit circle. We can thus invoke the initial value theorem:

$$h_A(0)h_B(0) = \lim_{z\to\infty} A(z) \lim_{z\to\infty} B(z) = \lim_{z\to\infty} A(z)B(z) = 0 \quad (16)$$

Combining (3), (4) and (16) we obtain that condition 2 can be met if and only if the following is true:

$$\lim_{z\to\infty} W(z)P(z) = 0 \quad (17)$$

substituting (17) into (11) we obtain:

$$\lim_{z\to\infty} A_d(z) = \lim_{z\to\infty} B_d(z) \quad (18)$$

Equation (18) implies that only a certain class of arbitrary noise transfer functions can be synthesized to satisfy the causality criterion. If this is not the case, any polynomial quotient transfer function can be normalized to satisfy this condition. Without loss of generality we can write that any polynomial quotient function satisfying condition (18), can be written as:

$$\frac{B_d(z)}{A_d(z)} = \frac{1 + \sum_{k=1}^{N_B} b_k z^{-k}}{1 + \sum_{k=1}^{N_A} a_k z^{-k}} \quad (19)$$

Where: $N_B$ and $N_A$ are the numerator and denominator respective polynomial degrees, and $b_k$, $k\in\{1 \ldots, NB\}$ and $a_k$, $k\in\{1 \ldots, NA\}$ are the numerator and denominator polynomial coefficients respectively.

1.3.3 Condition 3—STF Unity Gain at a Given Frequency

Assuming $W(z), P(z), R(z)$ and $Q(z)$ that satisfy conditions 1 and 2 have been synthesized and that the existing STF has a finite gain at frequency $z=e^{j\Theta}$, $R(z)$ and $Q(z)$ can be normalized by reciprocal factors such that the NTF remains unchanged but condition 3 is met. It is easily shown that if the following transformations are made: $R'(z)=\alpha R(z)$ and $Q'(z)=Q(z)/\alpha$ then the resultant STF is $STF'(z)=\alpha STF(z)$ and the resultant NTF remains unchanged $NTF'(z)=NTF(z)$.

1.3.4 Condition 4—Real Controllers

Since $B_d(z)$ and $A_d(z)$ are real functions of z, it is required to find two sets of real polynomials whose products are $B_d(z)$ and $A_d(z)-B_d(z)$:

$$R(z)Q(z)=B_d(z)$$

$$W(z)P(z)=A_d(z)-B_d(z) \quad (20)$$

Although it is generally desirable to have two equally complex controllers at each product, this is not a requirement. Therefore, a set of real controllers that satisfies (20) can always be produced by splitting the complex conjugate solution pairs of $B_d(z)$ and $A_d(z)-B_d(z)$ among $R(z)$, $Q(z)$ and $W(z)$, $P(z)$ respectively.

1.3.5 Condition 5—BIBO Stability

This requirement essentially stipulates that given a BIBO stable NTF, the synthesis procedure must synthesize a BIBO stable STF. We aim to show that this is an inherent property of this procedure and that requirement 5 is effectively redundant.

Proof: We are given a BIBO stable and causal NTF $B_d(z)/A_d(z)$. This means that the roots of $A_d(z)$ are inside the unit circle:

$$\forall p | A_d(z)|_{z=p}=0 \Rightarrow |p|<1 \quad (21)$$

Applying (21) to (9) we obtain:

$$\forall p | \{R(z)Q(z)+W(z)P(z)\}|_{z=p}=0 \Rightarrow |p|<1 \quad (22)$$

Therefore the STF given by (7) is BIBO stable.

1.4 Synthesis Procedure

The following procedure may be used to synthesize controller functions for an arbitrary noise transfer function.

1) Normalize the denominator:

$$B'_d(z) = B_d(z)\left(\frac{A_d(z)}{B_d(z)}\bigg|_{z\to\infty}\right) \quad (23)$$

2) Find the roots of $A_d(z)-B'_d(z)$ and $B'_d(z)$ ($p_i$ and $z_i$ respectively) such that:

$$A_d(z) - B'_d(z) = K_B z^{-1} \prod_{i=2}^{k} (z_i z^{-1} - 1) \quad (24)$$

$$A_d(z) = K_A \prod_{i=1}^{k} (p_i z^{-1} - 1) \quad (25)$$

3) Defining the sets $L=\{0, z_2, \ldots, z_k\}$ and $O=\{p_1, p_2, \ldots, p_k\}$. Split the members of L and O into two complementary mutually exclusive sets $L_1, L_2$ and $O_1, O_2$ respectively such that:

$$L=L_1 \cup L_2$$

$$O=O_1 \cup O_2$$

$$L_1 \cap L_2 = \phi$$

$$O_1 \cap O_2 = \phi$$

$$\forall x, x \in L_1 \exists y | y \in L_1, y = x^*$$

$$\forall x, x \in L_2 \exists y | y \in L_2, y = x^*$$

$$\forall x, x \in O_1 \exists y | y \in O_1, y = x^*$$

$$\forall x, x \in O_2 \exists y | y \in O_2, y = x^* \quad (26)$$

Where $x^*$ denotes the complex conjugate of x. The last 4 conditions in (26) assert that the resultant controllers shall be real functions of z.

4) Generate R(z)

$$R(z) = K_A \prod_{x_i \in L_1} M_{x_i}(z) \quad (27)$$

Where $M_x(z)$ is defined as:

$$M_x(z) = \begin{cases} z^{-1} & \text{for } x = 0 \\ (xz^{-1} - 1) & \text{else} \end{cases} \quad (28)$$

5) Generate Q(z)

$$Q(z) = \prod_{x_i \in L_2} M_{x_i}(z) \quad (29)$$

6) Generate W(z)

$$W(z) = K_B \prod_{x_i \in O_1} M_{x_i}(z) \quad (30)$$

7) Generate P(z)

$$P(z) = \prod_{x_i \in O_2} M_{x_i}(z) \quad (31)$$

8) Compute the existing signal gain at $z=e^{j\theta}$ $$G = \frac{R(z)W(z)}{R(z)Q(z) + W(z)P(z)} \bigg|_{z=e^{j\theta}} \quad (32)$$

9) Normalize the STF gain at $z=e^{j\theta}$ to unity $$R'(z) = \frac{R(z)}{G} \quad (33)$$

$$Q'(z) = GQ(z) \quad (34)$$

2 Transmitter with Spectral Emission Shaping ΔΣ Modulator

The modulator design technique described in Section 1 is used to construct a transmitter employing polar modulation, while shaping the emissions from the digitally-controlled power amplifier (DPA) so that they are significantly and sufficiently attenuated in several desired frequency bands. This novel technique enables the designer to use virtually unfiltered amplitude modulation and create the noise shaping using a digital ΔΣ modulator.

2.1 Polar Modulation

Delta Sigma (ΔΣ) modulators have become a common basic building block in the design of electronic systems. The techniques described in Sections 1 and 3 can be used to synthesize such modulators given any properly normalized noise transfer function. The resultant controllers satisfy a few requirements including real coefficients, causality and BIBO stability. While the common ΔΣ modulator used in analog-to-digital converters (ADCs) or digital-to-analog converters (DACs) has a typical high-pass noise shape, which assumes analog or digital filtering to filter out the unwanted noise in the high frequency areas, the technique of the present invention allows the designer to shape the noise into any shape or even make the noise shape software programmable.

A recent technique for cellular transmitters is the use of polar modulation, where instead of using quadrature (i.e. Cartesian) representation (I/Q) in a dual mixer configuration, the signal is represented by the amplitude signal r(t) and the phase signal θ(t), where:

$$s(t) = I(t) + jQ(t) = r(t)e^{j\theta(t)} \quad (35)$$

Where s(t) is the transmitted signal in complex envelope representation, I(t) and Q(t) are the in-phase and quadrature signal components, respectively, and $j=\sqrt{-1}$.

Figure 2:
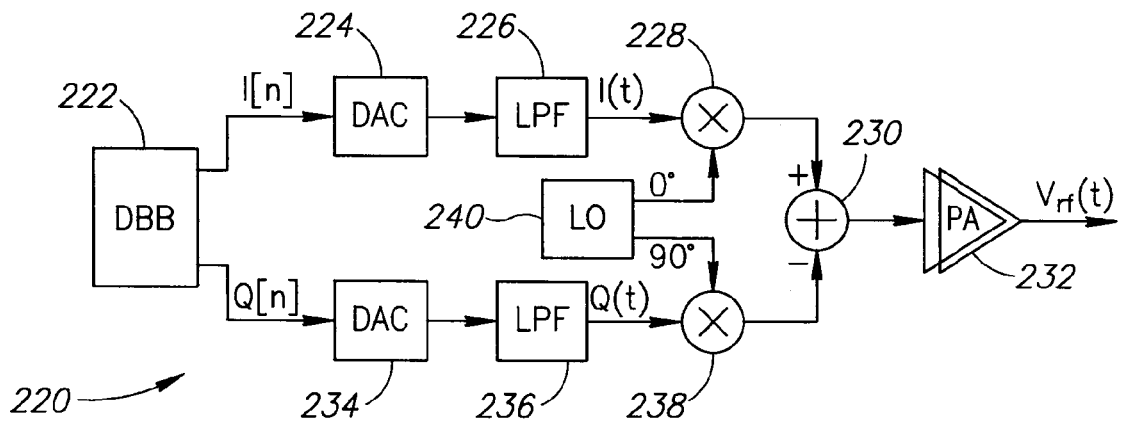
FIG. 2 is a block diagram illustrating a prior art IF transmitter architecture.

FIG. 2 shows the implementation of a prior art dual mixer transmitter (direct conversion in this case). A quadrature mixer transmitter, generally referenced 220, corresponding to an I/Q representation is shown. The transmitter comprises a digital baseband (DBB) 222, and I and Q paths. The in-phase path comprises DAC 224, LPF 226 and mixer 228, while the quadrature path comprises DAC 234, LPF 236 and mixer 238. The transmitter also comprises Local Oscillator (LO) 240, summer (i.e. combined) 230 and power amplifier 232.

The in-phase and quadrature components feed two separate mixers, which mix the signals with a local oscillator signal with a center frequency $f_c$ at 0 and 90 degree phase shifts. The result is a radio frequency (RF) signal centered around $f_c$, which is then amplified using a power amplifier (PA) and fed to an antenna (not shown) for RF transmission.

Figure 3:
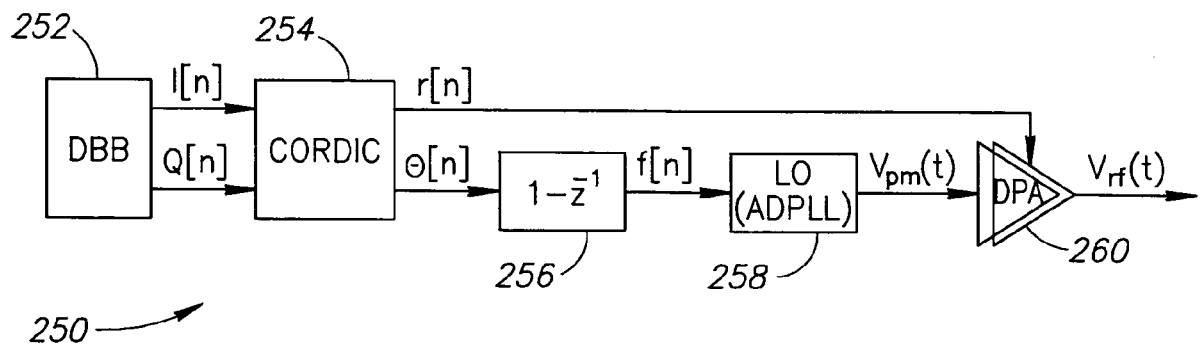
FIG. 3 is a block diagram illustrating an example of an all-digital polar modulator architecture.

FIG. 3 shows a polar modulator based all-digital transmitter, generally referenced 250, constructed in accordance with the present invention. The transmitter comprises a digital baseband 252, Cartesian to polar converter (CORDIC) 254, differentiator 256, ADPLL 258 and digital power amplifier 260. The I/Q signal is first converted into polar representation using a Cartesian to polar transformation (e.g., CORDIC). The instantaneous frequency signal f[n] is derived from the angle information by:

$$f[n] = \frac{1}{2\pi} \frac{\theta[n] - \theta[n-1]}{\Delta t} \quad (36)$$

where Δt is the sampling period. This signal is then fed into an all-digital phased-locked loop (ADPLL) acting as a phase modulator (PM), with a carrier frequency $f_c$. The output of the ADPLL is a constant envelope signal having a complex envelope of $\exp(j\theta[n])$. The ADPLL output voltage is given by $$v_{pm}(t) = \cos\left\{2\pi\left(f_n t + \sum_{k=0}^{\lfloor t/f_s \rfloor} f[k]T_s\right)\right\} \quad (37)$$

Where $f_n$ is the ADPLL natural frequency, $f_s=1/T_s$ is the sampling frequency and f[k] is the instantaneous frequency at sampling instance k. Equation (37) reveals that the ADPLL is analogous to a VCO but works in the discrete and digital domain. One implementation of the ADPLL employs a digitally-controlled oscillator (DCO), which translates a digital frequency control word (FCW) into an analog frequency using a bank of switched varactors. A more detailed description of the ADPLL can be found in U.S. application Ser. No. 11/203,019, cited supra.

The output of this device is fed into a power amplifier with a voltage controlled power. The power control is fed by r[n] and the output voltage is given by:

$$v_{rf}(t)=r[n]|_{n=\lfloor t/f_s \rfloor}v_{pm}(t) \quad (38)$$

where $v_{rf}(t)$ is the RF output voltage of the voltage controlled power amplifier.

An advantage of this system over the Cartesian transmitter is that while a major power drain in any wireless transmission system is its power amplifier (PA), in the polar representation, the PA can be kept in saturation (yielding high efficiency) and the saturation level is changed along with the power control. An example implementation of the digitally-controlled PA (DPA) is a class E power amplifier with a bank of gates controlling the amplitude according to a digital amplitude control word (ACW).

Another advantage of this method is that it maintains the efficiency of its analog counterpart, while the modulating signals are kept digital and so are most of the ADPLL circuits. This offers a clear migration path with process scaling and other advantages such as easy design for testing.

Figure 4:
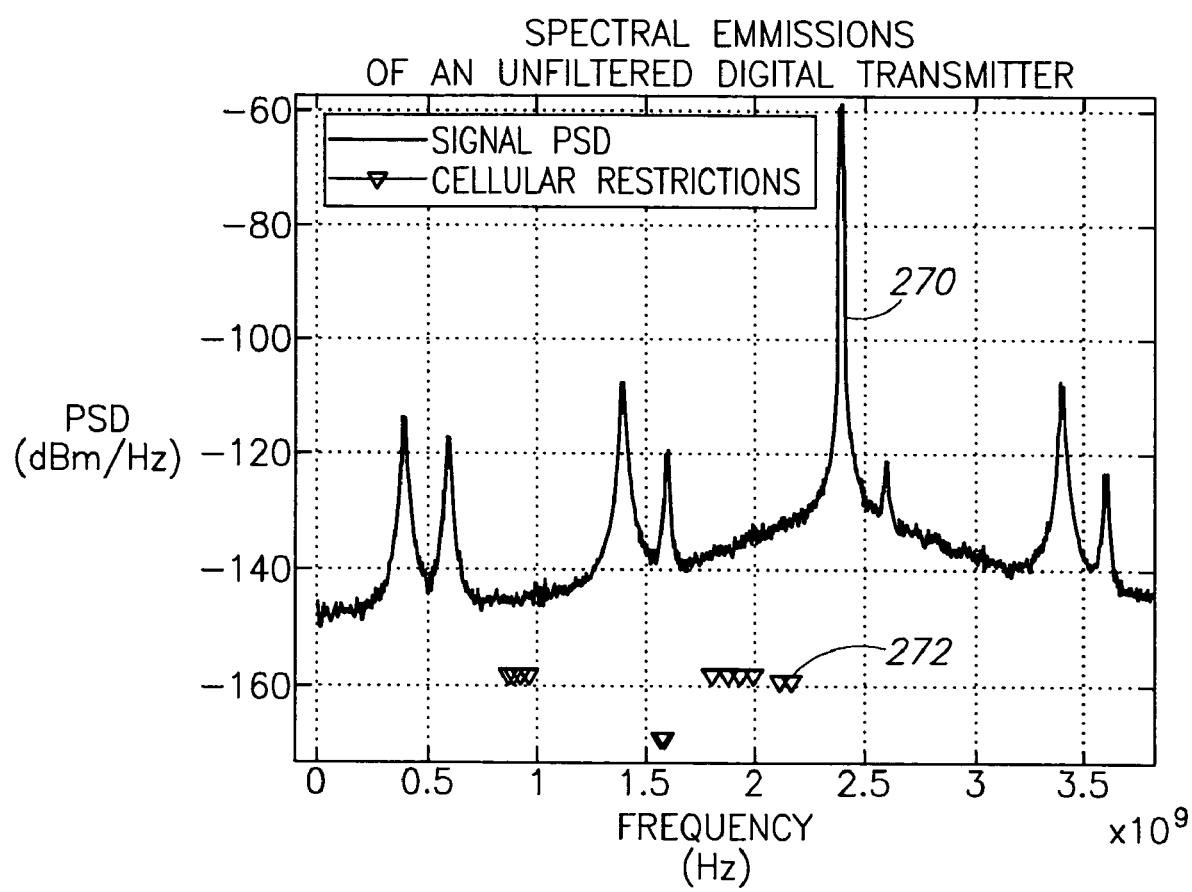
FIG. 4 is a diagram illustrating the spectral emissions from an unfiltered WLAN digital transmitter.

A drawback of this technique is that the DPA, having a finite set of amplitudes, generates quantization noise that fills up the spectrum, possibly causing unwanted disturbance. Furthermore, the digital discrete time nature of the DPA amplitude changes causes frequency replicas, similar to the spectrum of a sampled signal. FIG. 4 shows a typical spectrum of a DPA output. Here, the modulating signal was a WLAN 802.11g signal (20 MHz bandwidth), centered at $f_c$=2.4 GHz. The black 272 trace shows a typical set of cellular forbidden bands. Since filtering the output signal is problematic in terms of area and power, we would like a means to control the emission spectrum in a way where the designer could divert the noise from the undesired (forbidden) bands into other, less restrictive bands.

2.2 FIRST EXAMPLE EMBODIMENT

Figure 5:
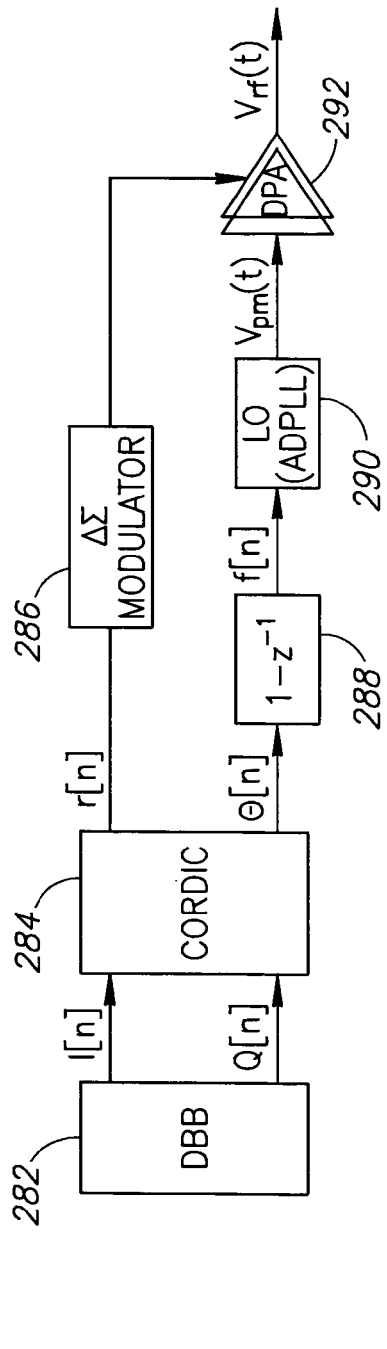
FIG. 5 is a block diagram illustrating an exemplary embodiment of the all-digital polar modulator architecture of the present invention incorporating a $\Delta\Sigma$ modulator in the amplitude path.

FIG. 5 shows a high level block diagram of a first example embodiment of the present invention. The polar transmitter, generally referenced 280, comprises a digital baseband 282 which generates I and Q data and a CORDIC 284 which converts the I/Q data to amplitude and phase information. In the amplitude path, the amplitude information (ACW) is fed to a ΔΣ modulator 286. In the phase path, the phase information is fed to a differentiator 288, which generates the instantaneous frequency and an ADPLL 290. The output of the ΔΣ modulator and the ADPLL are input to the digital power amplifier 292. The ACW undergoes ΔΣ modulation via the ΔΣ modulator 286. Although the overall ACW rate may be increased, the modulator shapes the noise in such a way that the noise is significantly attenuated for the restricted bands.

2.3 SECOND EXAMPLE EMBODIMENT

A second example embodiment, uses the DPA in a Cartesian or Cartesian/polar hybrid mode. The IQ samples directly modulate two orthogonal branches within the DPA, generating the composite RF signal. In this implementation, similar to the first example embodiment described in Section 2.2 above, the DPA quantization noise is virtually unfiltered and may fall directly onto restricted bands. The addition of a ΔΣ modulator to each branch and using the synthesis method described in Section 1 reduces the quantization noise in said bands dramatically.

Figure 6:
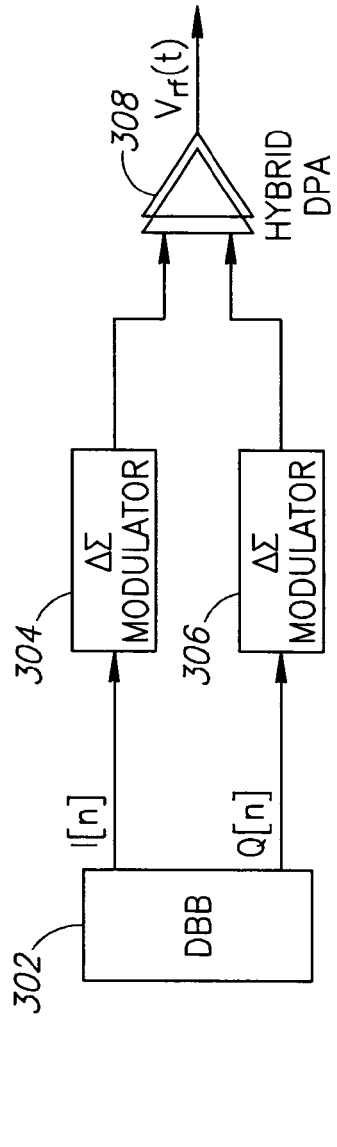
FIG. 6 is a block diagram illustrating an exemplary embodiment of the all-digital Cartesian modulator architecture of the present invention incorporating a $\Delta\Sigma$ modulator in the I and Q paths.

A high level block diagram illustrating this architecture is shown in FIG. 6. The transmitter, generally referenced 300, comprises a digital baseband 302, in phase ΔΣ modulator 304, quadrature ΔΣ modulator 306 and hybrid DPA 308. The IQ samples are dithered individually by identical ΔΣ modulators and their outputs drive a hybrid DPA.

2.4 Formulation

Since the goal is to prevent interference to neighboring cellular bands, we consider a dual notch ΔΣ modulator as an illustrative example. Note that it is not intended that the invention be limited to the examples presented herein. It is appreciated by one skilled in the art that ΔΣ modulators of different orders and having different spectral emission shaping may be constructed using the techniques presented herein without departing from the spirit and scope of the present invention.

The NTF is given by:

$$NTF(z)=(e^{j\theta_1}z^{-1}-1)(e^{-j\theta_1}z^{-1}-1)(e^{j\theta_2}z^{-1}-1)(e^{-j\theta_2}z^{-1}-1) \quad (39)$$

$\theta_1$ and $\theta_2$ are the discrete-time frequencies of the desired notch frequencies, where:

$$\theta_1 = 2\pi\frac{f_1}{f_s} \quad (40)$$

$$\theta_2 = 2\pi\frac{f_2}{f_s} \quad (41)$$

Where $f_1$ and $f_2$ are the analog equivalent notch frequencies and $f_s$ is the modulator sampling frequency. Please note that the four zeros in (39) are required to keep the NTF real. Collecting the terms relating to $\theta_1$ and $\theta_2$ separately in Equation (39) we obtain:

$$NTF(z)=(z^{-2}-2\cos(\theta_1)z^{-1}+1)(z^{-2}-2\cos(\theta_2)z^{-1}+1) \quad (42)$$

Applying the synthesis procedure described supra (see Equation (5)) we start out by writing the explicit form for the numerator and denominator of the desired transfer function $B_d$ and $A_d$, respectively, preceded by an expansion of Equation (42).

$$NTF(z)=z^{-4}-2(\cos(\theta_1)+\cos(\theta_2))z^{-3}+(4\cos(\theta_2)\cos(\theta_1)+2)z^{-2}-2(\cos(\theta_1)+\cos(\theta_2))z^{-1}+1 \quad (43)$$

$$B_d=z^{-4}-2(\cos(\theta_1)+\cos(\theta_2))z^{-3}+(4\cos(\theta_2)\cos(\theta_1)+2)z^{-2}-2(\cos(\theta_1)+\cos(\theta_2))z^{-1}+1 \quad (44)$$

$$A_d=1 \quad (45)$$

As can be seen, the NTF is properly normalized since:

$$\lim_{z\to\infty} A(z) = \lim_{z\to\infty} B(z) \qquad (46)$$

Therefore, step number one of the synthesis procedure can be skipped. Proceeding, we need to find the roots of $B_d$ and $A_d - B_d$, respectively:

$$A_d - B_d = -z^{-4} + 2(\cos(\theta_1) + \cos(\theta_2))z^{-3} - (4\cos(\theta_2)\cos(\theta_1) + 2)z^{-2} + 2(\cos(\theta_1) + \cos(\theta_2))z^{-1} \qquad (47)$$

$z_1 = e^{j\theta_1}$ $z_2 = e^{-j\theta_1}$ $z_3 = e^{j\theta_2}$ $z_4 = e^{-j\theta_2}$ $p_1 = 0$ $p_2 = \ldots$ $p_3 = p_2^*$ $p_4 = \alpha \qquad (48)$ Where $(\bullet)^*$ is the complex conjugate operator and $\alpha$ is a real scalar. $p_1$ and $\alpha$ can be solved through the use of well-known numeric or symbolic techniques. Steps 4-8 require that $z_i$ and $p_i$ be divided among two sets of mutually exclusive sets. There are several options to accomplish this task. Tables 4 and 5 list the possibilities of this split:

TABLE 4

Possibilities of performing step 3 for $L_1$ and $L_2$

| Option | Zeros of R | Zeros of Q |
|---|---|---|
| 1 | $L_1 = \{z_1, z_2, z_3, z_4\}$ | $L_2 = 0$ |
| 2 | $L_1 = 0$ | $L_2 = \{z_1, z_2, z_3, z_4\}$ |
| 3 | $L_1 = \{z_1, z_2\}$ | $L_1 = \{z_3, z_4\}$ |
| 4 | $L_1 = \{z_3, z_4\}$ | $L_1 = \{z_1, z_2\}$ |

TABLE 5

Possibilities of performing step 3 for $O_1$ and $O_2$

| Option | Zeros of W | Zeros of P |
|---|---|---|
| 1 | $O_1 = \{p_1, p_2, p_3, p_4\}$ | $O_2 = 0$ |
| 2 | $O_1 = 0$ | $O_2 = \{p_1, p_2, p_3, p_4\}$ |
| 3 | $O_1 = \{p_1, p_2, p_3\}$ | $O_2 = \{p_4\}$ |
| 4 | $O_1 = \{p_4\}$ | $O_2 = \{p_1, p_2, p_3\}$ |
| 5 | $O_1 = \{p_1, p_4\}$ | $O_2 = \{p_2, p_3\}$ |
| 6 | $O_1 = \{p_2, p_3\}$ | $O_2 = \{p_1, p_4\}$ |

To get maximum flatness in the STF we shall choose mode (2,2).

The controller functions obtained using mode (2,2) following the synthesis procedure presented supra are:

$$A(z) = \frac{1}{z^{-4} - 2(\cos(\theta_1) + \cos(\theta_2))z^{-3} + (4\cos(\theta_2)\cos(\theta_1) + 2)z^{-2} - 2(\cos(\theta_1) + \cos(\theta_2))z^{-1} + 1} \qquad (49)$$

$$B(z) = -z^{-4} + 2(\cos(\theta_1) + \cos(\theta_2))z^{-3} - (4\cos(\theta_2)\cos(\theta_1) + 2)z^{-2} + 2(\cos(\theta_1) + \cos(\theta_2))z^{-1} \qquad (50)$$

2.5 NUMERICAL EXAMPLE

Assuming $f_s = 1$ GHz and the notch frequencies are: $f_1 = 200$ MHz and $f_2 = 220$ MHz, we obtain:

$$\theta_1 = 0.4\pi \qquad (51)$$

$$\theta_2 = 0.44\pi \qquad (52)$$

$$NTF(z) = 1 - 0.9928z^{-1} + 2.232z^{-2} - 0.9928z^{-3} + z^{-4} \qquad (53)$$

The resultant controllers following (49) and (50) are:

$$A(z) = \frac{1}{1 - 0.9928z^{-1} + 2.232z^{-2} - 0.9928z^{-3} + z^{-4}} \qquad (54)$$

$$B(z) = 0.9928z^{-1} - 2.232z^{-2} + 0.9928z^{-3} - z^{-4} \qquad (55)$$

The resultant NTF is obviously given by (53) and the STF is given by:

$$STF = 1 \qquad (56)$$

Figure 7:
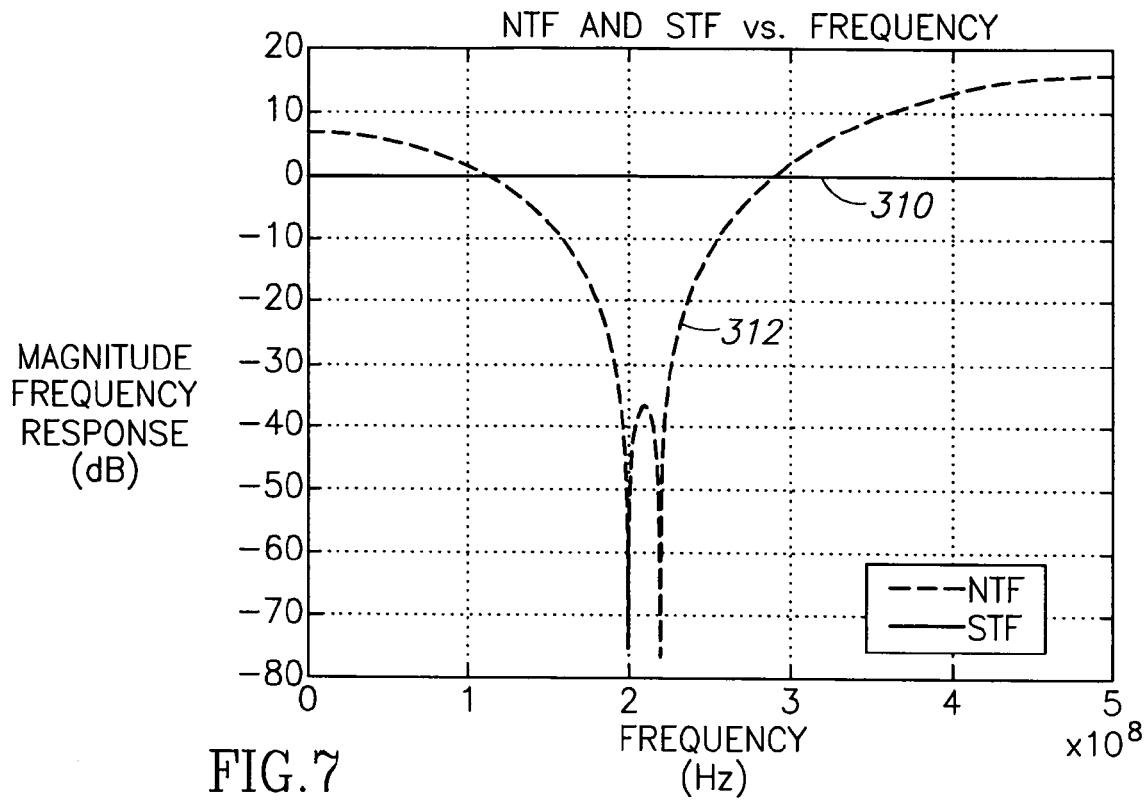
FIG. 7 is a diagram illustrating the NTF and STF magnitude response of the $\Delta\Sigma$ modulator versus frequency.

FIG. 7 shows a plot of the magnitude frequency responses of both the NTF as well as the STF. Two notches are clearly visible at 200 MHz and 220 MHz. Furthermore, there is a noise increase in the vicinity of the digital frequencies $\theta = 0; \pi$. If it is desired to transmit around one of these frequencies, there needs to be a sufficient SNR margin such that once degraded by the resultant NTF, the transmitted signal would have sufficient EVM and meet the close-in spectrum specification.

Figure 8:
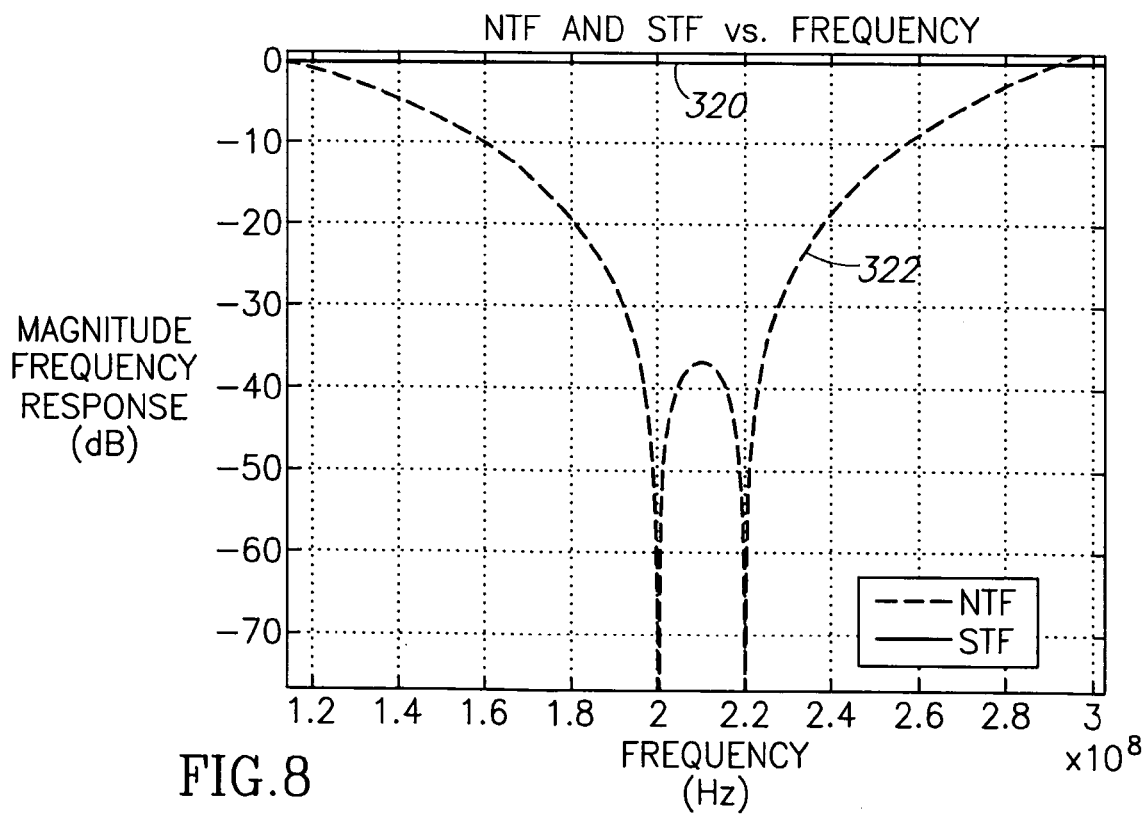
FIG. 8 is a diagram illustrating the NTF and STF magnitude response of the $\Delta\Sigma$ modulator versus frequency at the stop band.

FIG. 8 shows a region of the NTF and STF at the stop-band area in more detail. As can be seen, a rejection of well above 35 dB can be obtained at those frequencies.

2.6 Simulation Results

2.6.1 Simulation Methodology

The goal of the simulation presented in this section is to show that the techniques presented herein provide noise reduction in the desired bands. The simulation block diagram follows closely the system presented in FIG. 5 with an excitation signal of a filtered complex white Gaussian noise signal with a bandwidth of approximately 4 MHz (similar to WCDMA).

The simulation was run three times for different modulators (three scenarios):

1. A standard uniform 8-bit quantizer
2. A standard integrator-based 4$^{th}$ order $\Delta\Sigma$ modulator
3. The $\Delta\Sigma$ modulator of the present invention presented in Section 2.4.

Figure 9:
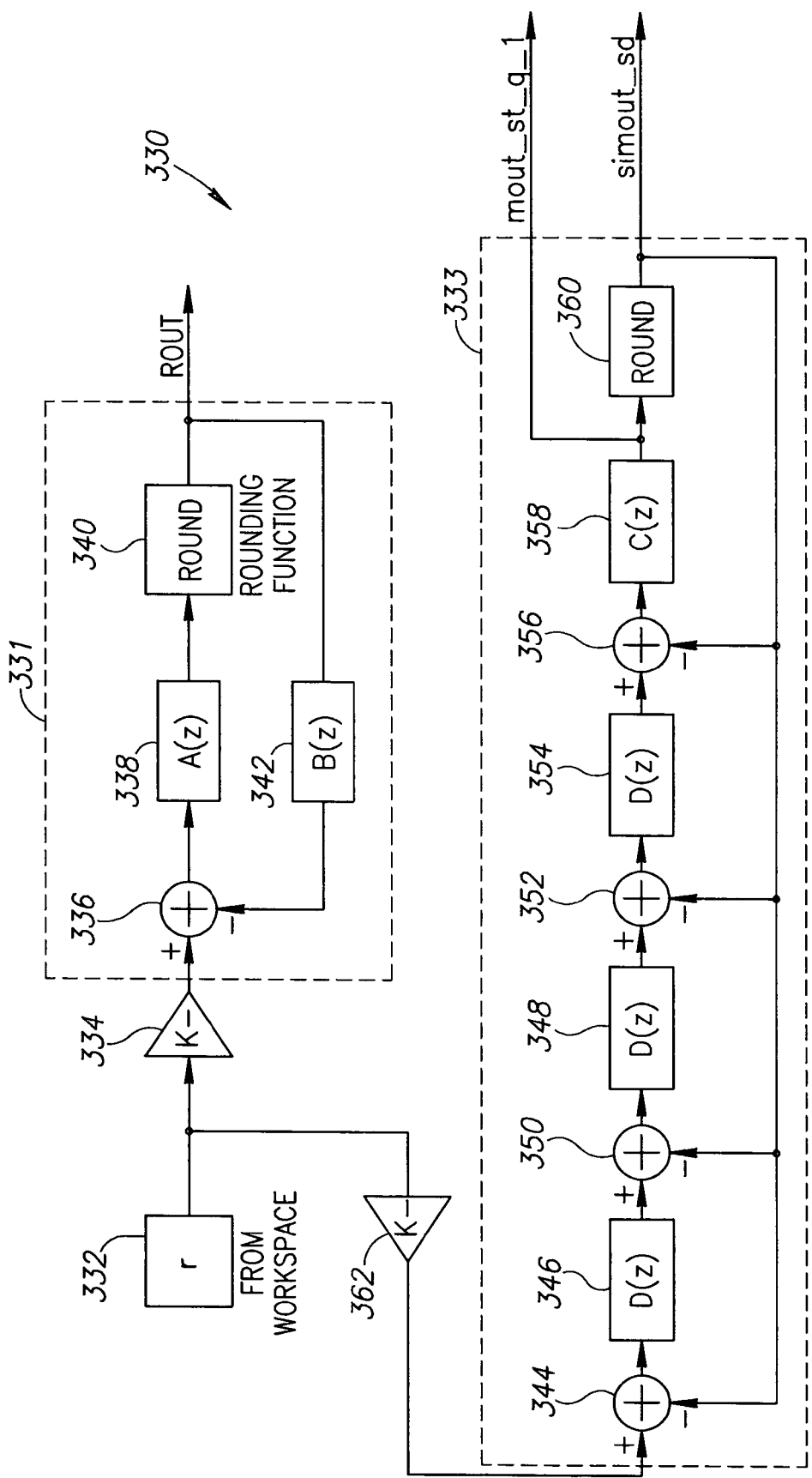
FIG. 9 is a block diagram illustrating the simulation model of the $\Delta\Sigma$ modulator of the present invention.

In every scenario $3.27 \times 10^6$ samples at a sampling frequency of $f_s = 1$ GHz were simulated. For both $\Delta\Sigma$ modulators, gain blocks preceded the actual modulator insuring that the output of the modulators would be limited to 8 unsigned bits. FIG. 9 shows the model used to simulate these modulators. The model, generally referenced 330, comprises input r 332 coupled to a $\Delta\Sigma$ modulator of the present invention 331 via gain block 334 and to a standard 4$^{th}$ order $\Delta\Sigma$ modulator 333 via gain block 362. Modulator 331 comprises summer 336, controllers A 338 and B 342 and rounding block 340. Modulator 333 comprises, summers 344, 350, 352, 356, integrators 346, 348, 354, 358, rounding block 360.

The upper modulator represents the novel $\Delta\Sigma$ modulator whose transfer functions are given by A(z) and B(z) in Equations (54) and (55), respectively. The bottom modulator is a standard $4^{th}$ order $\Delta\Sigma$ integrator based modulator, whose transfer functions are given by C(z) and D(z), respectively:

$$C(z) = \frac{z^{-1}}{1 - z^{-1}} \quad (57)$$

$$D(z) = \frac{1}{1 - z^{-1}} \quad (58)$$

The post processing included reconstruction of the signal (e.g., multiplying the modulated magnitude information by the angle information $\exp\{j\theta(t)\}$ and performing a long periodogram on the resultant signals. The length of the periodogram non-overlapping FFTs were $N=2^{17}=131072$ and the windowing function used was a Blackman-Harris type window.

2.6.2 Results

Figure 10:
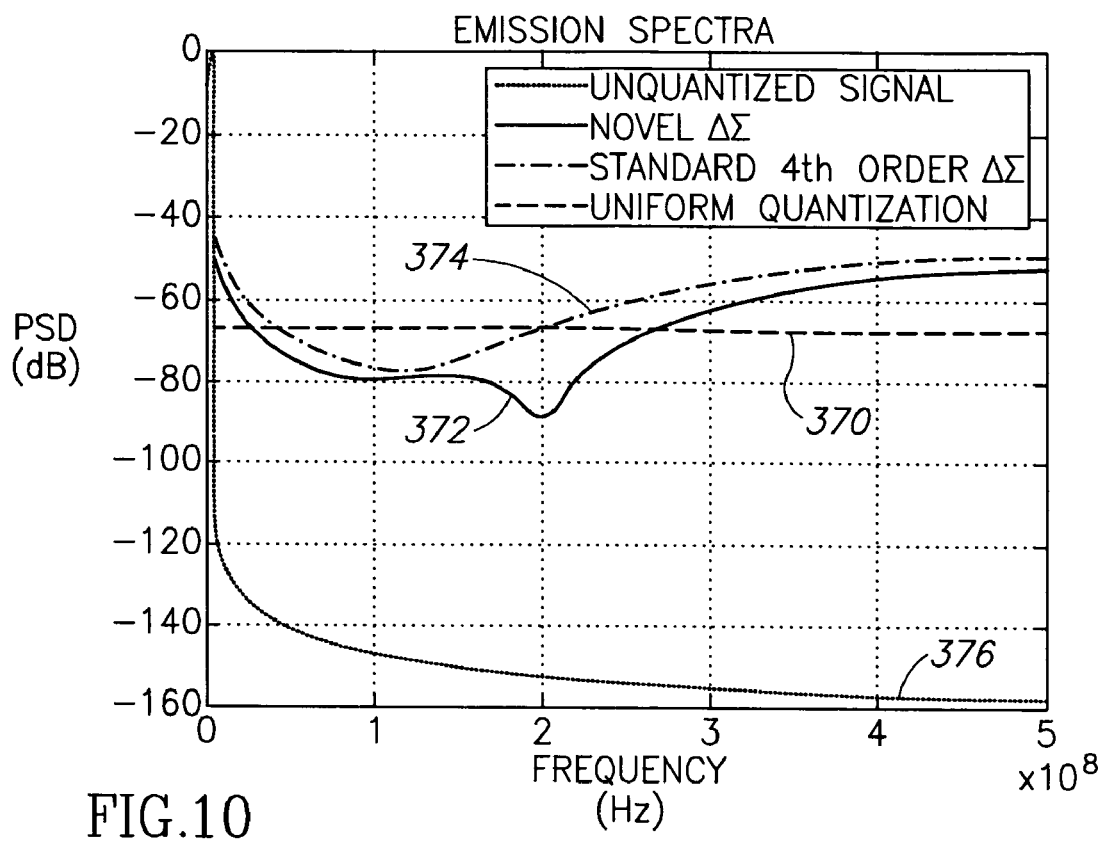
FIG. 10 is a diagram illustrating the power spectral density at the RF port.

FIG. 10 shows the spectra (power spectral density) for the various scenarios versus the distance from the carrier frequency. As expected, the uniform quantizer yields an almost white quantization noise, whereas the standard $\Delta\Sigma$ modulator shows a monotonous increase of the quantization noise from about 100 MHz up to 500 MHz. The novel modulator shows a relatively high rejection around the 200-220 MHz band (of about 20 dB relative to the standard modulator).

Figure 11:
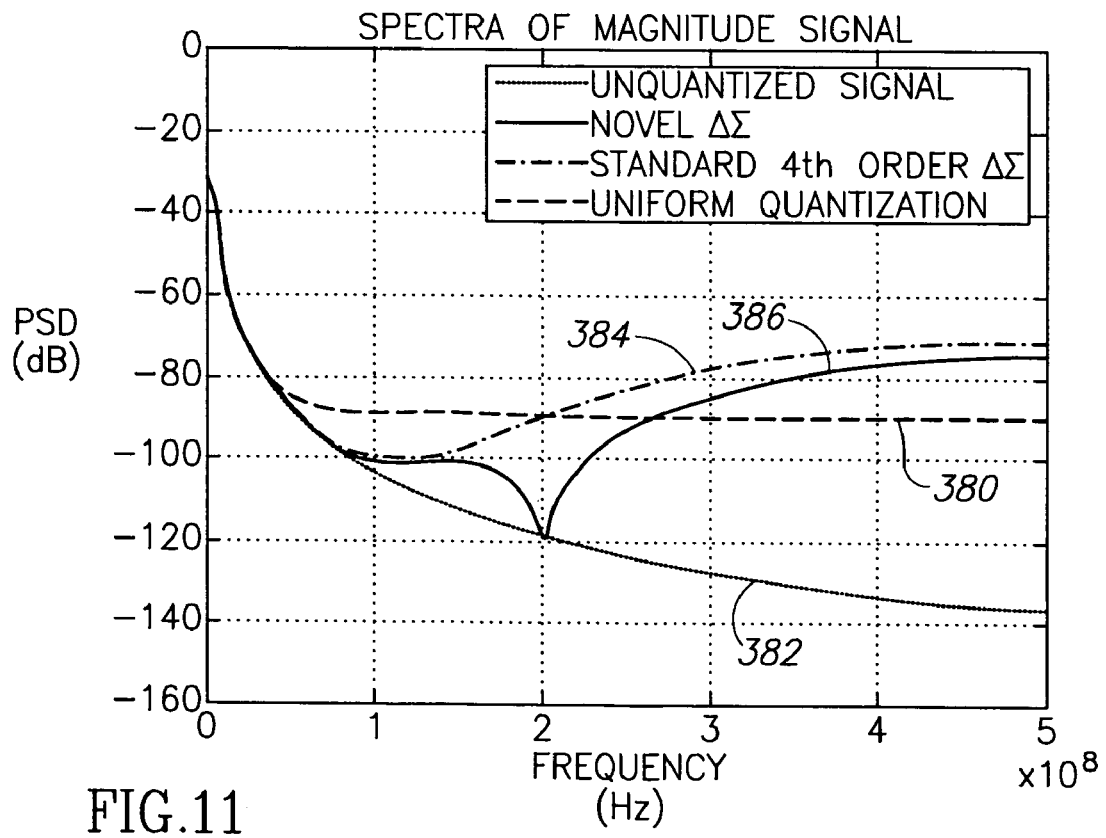
FIG. 11 is a diagram illustrating the spectral emissions of the magnitude (amplitude) signal.

The discrepancy between the shaped quantization noise spectrum shown in FIG. 10 and the NTF shown in FIG. 7 is due to the phase modulation effect in this scheme. The phase information signal $\exp\{j\theta(t)\}$ multiplies the shaped magnitude signal and therefore creates a convolution in the frequency domain of both shapes. FIG. 11 shows the spectra of the magnitude signal in the various scenarios. The deep null around 200 MHz is more prominent and extends down to the signal floor level.

2.7 Conclusion

It has therefore been shown above that polar modulation in conjunction with spectral noise shaping provided by appropriately configured $\Delta\Sigma$ modulation can be combined and implemented in digital transmitters for use in communication systems, including but not limited to, cellular, wireless, wired, cable, and other types as well. The invention is operative to combine (1) the efficiency of digital transmission as well as (2) the desired rejection in certain bands much like prior art analog transmitters.

3 Sigma Delta Amplitude Modulation—System Analaysis

With reference to FIG. 5, the polar transmitter suitable for use in a complex modulation Digital Radio Platform is operative to receive digital data from the DSP or other host (not shown), perform pulse shaping on the I/Q data and convert it to amplitude and phase information via the CORDIC. The amplitude and phase information each is processed for rate up-conversion (interpolation). Phase information is passed to the ADPLL as a frequency control word (FCW) which functions to modulate it on the carrier frequency. Amplitude information is passed through a sigma delta amplitude modulation (SAM) block to place the digital data in a form that the DPA can handle (i.e. substantially thermometer encoded), while providing resolution enhancements through sigma delta dithering. The DPA converts the digital amplitude data into an analog envelope on top of the FM modulated carrier presented at its input. The final RF output comprises the complex modulated carrier constructed in polar coordinates.

The DPA is described in more detail in U.S. application Ser. No. 11/115,815, filed Apr. 26, 2005, entitled "Low Noise High Isolation Transmit Buffer Gain Control Mechanism," incorporated herein by reference in its entirety. In the DPA, digital control bits represent amplitude data bits which are applied to a transistor array. Depending on the status of an amplitude bit, a corresponding transistor turns ON or OFF. The output power is proportional to the summation of the current output of each transistor turned ON. The current output of a certain transistor is proportional to the size of that transistor. Thus, the DPA can be constructed in one of the following three ways:

1. A thermometer coded DAC, i.e. a 10-bit DAC corresponding to 1024 same sized transistors. A drawback is that the high number of transistors makes routing and layout challenging.
2. A binary coded DAC, i.e. a 10-bit DAC corresponding to 10 transistors having different sizes depending on the bit location in the amplitude control word. The drawback with this approach is the mismatch that would be suffered in a practical on-chip implementation. For example, if a transistor is twice as big as an adjacent transistor, the output current is not exactly twice as much. This problem typically results in high Differential Non-Linearity (DNL) in the DAC. Furthermore, due to geometric inaccuracies and other sources of mismatch related with practical fabrication, a doubly sized transistor may not be exactly double in size in reality, thus resulting in a deviation from the nominal intended binary weighting.
3. A hybrid structure, which is a compromise between the above two structures. In this structure, a 10-bit DAC is implemented using 256 thermometer weighted (i.e. same size) transistors that yield a resolution of 8-bits and three ¼ sized transistors that provide an extra 2-bits of resolution. This structure suffers somewhat from the disadvantages of the previous two structures, but it provides results better than either one.

3.1 EDGE Frequency Emission Mask

For complex modulation standards, such as EDGE, the DAC in the DPA has high resolution to accommodate the spectral mask and the far out noise floor specifications. Alternatively, a SAW filter may be used at the output of the digital PPA to suppress far-out spurious emissions and noise. Table 6 presents the GSM/EDGE frequency bands.

TABLE 6

| | | | GSM/EDGE frequency bands | | | | |
|---|---|---|---|---|---|---|---|
| | | | TX | | | RX | |
| | | | Starts MHz | Ends MHz | Separation MHz | Starts MHz | Ends MHz |
| LB | GSM-850 | | 824 | 849 | 20 | 869 | 894 |
| | | Span | 25 | | | 25 | |
| | E-GSM | | 880 | 915 | 10 | 925 | 960 |
| | | Span | 35 | | | 35 | |

TABLE 6-continued

GSM/EDGE frequency bands

| | | TX | | | RX | |
|---|---|---|---|---|---|---|
| | | Starts MHz | Ends MHz | Separation MHz | Starts MHz | Ends MHz |
| HB | DCS-1800 | 1710 | 1785 | 20 | 1805 | 1880 |
| | Span | | 75 | | | 75 |
| | PCS-1900 | 1850 | 1910 | 20 | 1930 | 1990 |
| | Span | | 60 | | | 60 |

When the transmitter is on, the noise added to the receive band is preferably below −158 dBc/Hz for low band operation and −152 dBc/Hz for high band operation. The following shows the maximum and minimum frequency separation between different transmit channels and the receive bands.

(1) GSM-850:
  a. TX channel is at 824 MHz (lowest frequency in the band)
    i. RX band starts 45 MHz away
    ii. RX band ends 70 MHz away
  b. TX channel is at 849 MHz (highest frequency in the band)
    i. RX band starts 20 MHz away
    ii. RX band ends 45 MHz away
(2) E-GSM:
  a. TX channel is at 880 MHz (lowest frequency in the band)
    i. RX band starts 45 MHz away
    ii. RX band ends 80 MHz away
  b. TX channel is at 915 MHz (highest frequency in the band)
    i. RX band starts 10 MHz away (relaxed noise-level requirements)
    ii. RX band ends 45 MHz away
(3) DCS-1800:
  a. TX channel is at 1710 MHz (lowest frequency in the band)
    i. RX band starts 95 MHz away
    ii. RX band ends 170 MHz away
  b. TX channel is at 1785 MHz (highest frequency in the band)
    i. RX band starts 20 MHz away
    ii. RX band ends 95 MHz away
(4) PCS-1900:
  a. TX channel is at 1850 MHz (lowest frequency in the band)
    i. RX band starts 80 MHz away
    ii. RX band ends 140 MHz away
  b. TX channel is at 1910 MHz (highest frequency in the band)
    i. RX band starts 20 MHz away
    ii. RX band ends 80 MHz away

3.2 Sigma Delta Amplitude Modulation (SAM) Block

Figure 12:
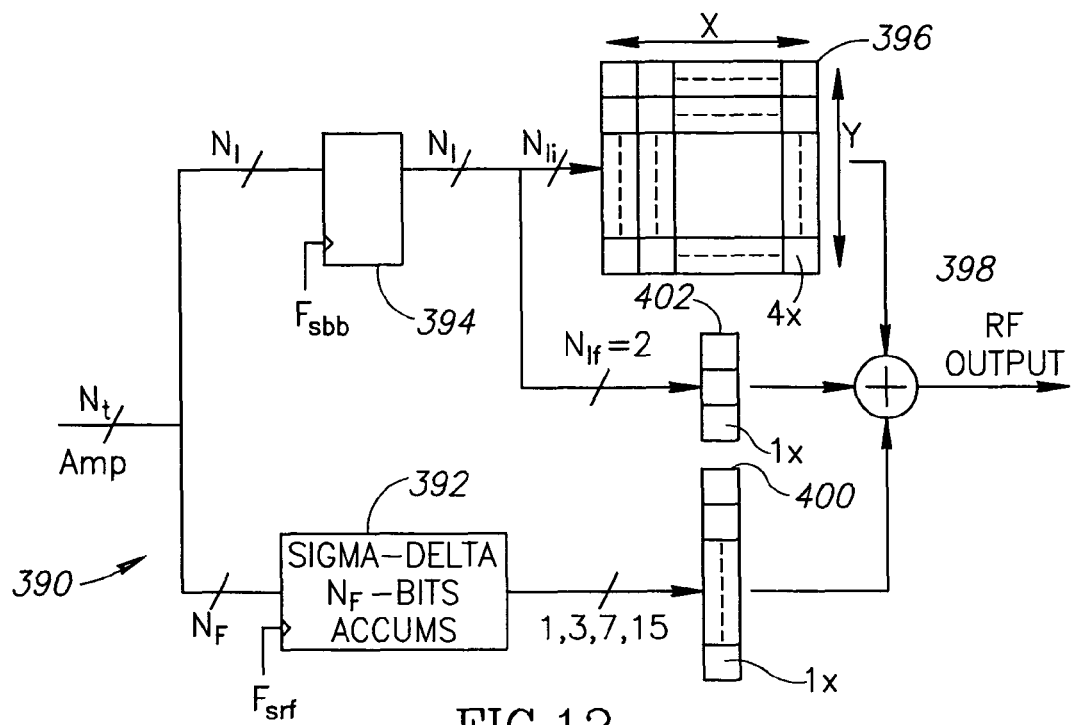
FIG. 12 is a block diagram illustrating a $\Sigma\Delta$ amplitude modulation (SAM) block.

A 10-bit DAC cannot realize all the requirements and specifications for EDGE transmission, if an analog filtering is not used, i.e. no SAW filter at the output of the PPA. To be able to achieve the higher resolution needed, thus eliminating the need for the analog filtering, a sigma delta modulator is added. FIG. 12 shows a block diagram of the SAM block, wherein the sigma delta dithering is realized. The SAM, generally referenced 390, comprises register 394, matrix arrays 396, 400, 402, ΣΔ modulator 392 and summer 398.

The input amplitude signal is represented by $N_t$ number of bits which are split into an integer part having $N_i$ bits and a fractional part having $N_f$ bits. $N_i$ splits into $N_{li}$ and $N_{lf}$. $N_{lf}$ is always 2, since it is fed to a 1× sized device. On the other hand, $N_{li}$ depends on particular routing and layout of the PPA transistors. In a preferred embodiment, $N_{li}$ is 8-bits, which translates to 256 transistors arranged in an array with X=32 columns and Y=8 rows.

The integer part is output to the PPA at the Nyquist sampling frequency, $Fs_{bb}$. The fractional part is typically output at the RF sampling frequency $Fs_{rf}$ after passing through the ΣΔ modulator. The effective amplitude resolution is equivalent to $N_t = N_i + N_f$ bits. Note that the SAM uses a hybrid PPA design.

To analyze the ΣΔ amplitude modulation (SAM) block three main components of the output spectrum need to be analyzed:

1. The noise shaping from the fractional low-pass sigma delta portion of the SAM.
2. The Nyquist quantization noise over the baseband sampling spectrum.
3. The zero-order hold effect due to the oversampling from the baseband sampling frequency $Fs_{bb}$ to the RF sampling frequency $Fs_{rf}$.

3.2.1 Component 1

Let the step size in the 1-bit quantizer $$\Delta = \left(\frac{2V}{2^N - 1}\right),$$

where the number of bits N=1, the amplitude signal peak V=1. Thus Δ=2 and the quantization noise variance $$\sigma_e^2 = \frac{\Delta^2}{12}.$$

A quantized signal sampled at frequency $F_S$ has all of its quantization noise power folded into the frequency band of $$0 \le f \le \frac{F_S}{2}.$$

Assuming that the noise is random, the spectral density of the noise is given by $E(f) = \sigma_e \sqrt{2T_s}$.

For a low pass first order ΣΔ modulator the noise is shaped by the transfer function $H(z) = (1 - Z^{-1})$. Converting the z-domain transfer function to the frequency domain yields:

$$H(\omega) = (1 - e^{(-j\omega T_S)}) \quad (59)$$

Therefore $$|H(\omega)| = |1 - e^{-j\omega T_S}| = \left|e^{-j\omega \frac{T_S}{2}}\right| \left|e^{j\omega \frac{T_S}{2}} - e^{-j\omega \frac{T_S}{2}}\right| = 2\sin\left(\frac{\omega T_S}{2}\right) \quad (60)$$

Combining the transfer function with the quantization noise spectral density, the first order sigma delta modulator noise spectral density is defined as:

$$|N(f)| = 2\sigma_e \sqrt{2T_{Srf}} \, \text{Sin}\left(\frac{\omega T_{Srf}}{2}\right) \quad (61)$$

where $T_{Srf}$ denotes the period of the sampling clock $= \frac{1}{Fs_{rf}}$, $$\omega = 2\pi f.$$

For higher order $\Sigma\Delta$ modulators, the spectral density function of the modulator noise is given by:

$$|N(f)| = \sigma_e \sqrt{2T_{Srf}} \left[2\text{Sin}\left(\frac{\omega T_{Srf}}{2}\right)\right]^L \quad (62)$$

where L denotes the order of the $\Sigma\Delta$ modulator order.

The total dynamic range for the input amplitude signal to the SAM block is $6 \cdot (N_i + N_f)$ dB. Thus, $|N(f)|$ is shifted by the integer part having a dynamic range of $6 \cdot N_i$ dB and 3 dB is subtracted due to the conversion from DSB to SSB. The final power spectral density of the fractional part is given by:

$$P_{SD}(f)_{dBc/Hz} = 20 \, \text{Log}_{10}(|N(f)|) - 6 \cdot N_i - 3 \quad (63)$$

$$P_{SD}(f)_{dBc/Hz} = 20\text{Log}_{10}\left|\sigma_e \sqrt{2T_{Srf}} \left[2\text{Sin}\left(\frac{\omega T_{Srf}}{2}\right)\right]^L\right| - 6 \cdot N_i - 3 \quad (64)$$

3.2.2 Component 2

The power spectral density of the Nyquist quantization noise of the input amplitude signal sampled using a clock running at frequency $Fs_{bb}$ is given by:

$$P_{Nyq}(f)_{dBc/Hz} = -6 \cdot (N_i + N_f) - 10\text{Log}_{10}\left(\frac{Fs_{bb}}{2}\right) - 3 + S_x \quad (65)$$

where the 3 dB subtracted is due to the conversion from DSB to SSB. If the signal is normalized, meaning $$s_n(t) = \frac{s(t)}{(\sqrt{2} \cdot STD(s(t)))} \quad (66)$$

where $STD(x)$ is the standard deviation of x, then $S_x = -3$ dB.

3.2.3 Component 3

The zero-order hold resulting from the over sampling of the amplitude signal from $Fs_{bb}$ to $Fs_{rf}$ can be considered as a cascade of impulse sampling with a zero-order hold rectangular filter, i.e. a filter with impulse response of:

$$h(t) = \Pi\left(\frac{\left(t - \frac{T_{sbb}}{2}\right)}{T_{sbb}}\right) \quad (67)$$

where $\Pi(t)$ is the rectangular pulse waveform.

Figure 13:
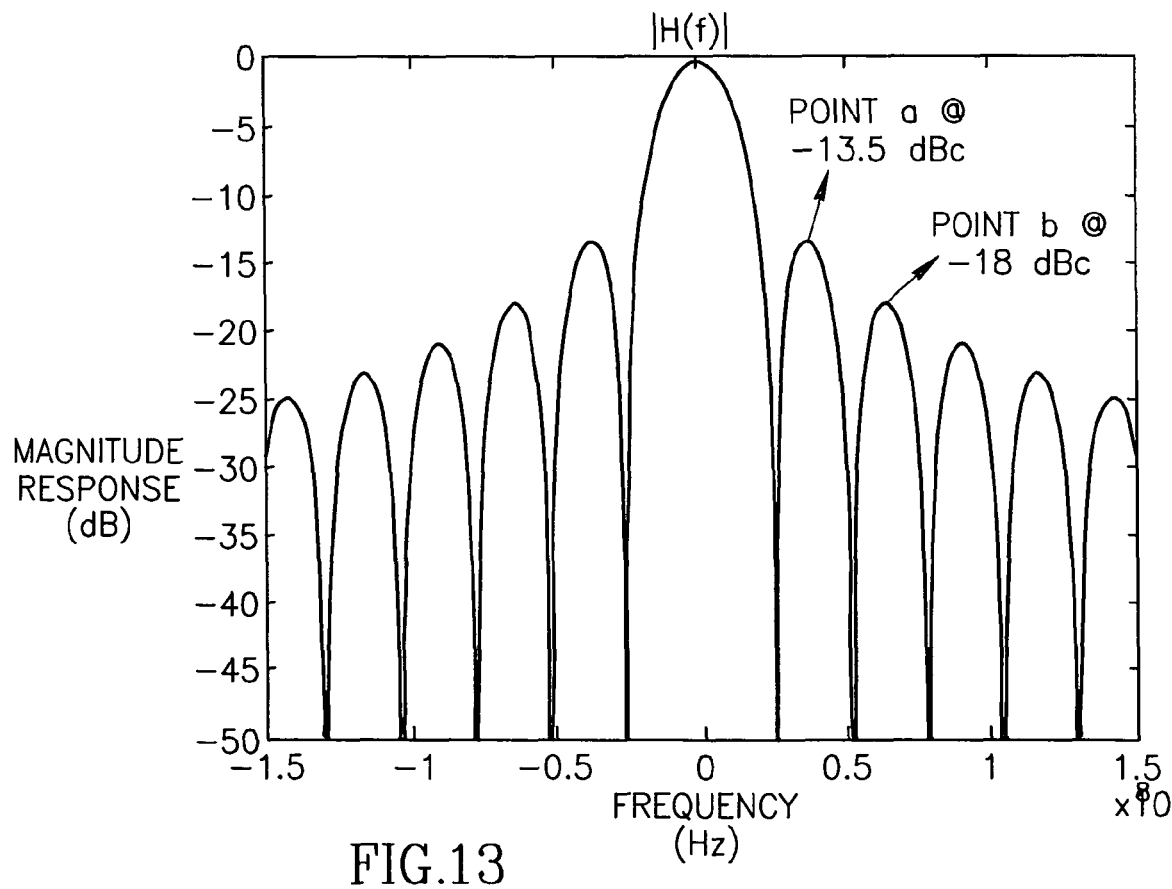
FIG. 13 is a plot illustrating the magnitude response of the zero-order hold filter at $F_{sbb}=26$ MHz.

The frequency response of this filter is given by:

$$H(f) = T_{sbb} \, e^{-j\pi T_{sbb} f} \frac{\text{Sin}(T_{sbb}\pi f)}{(T_{sbb}\pi f)} \quad (68)$$

where zero crossings occur at $f = nF_{sbb}$, $n = 1,2,3,\ldots$. The filter magnitude response $|H(f)|$ is shown in FIG. 13. Point (a) is at $f = 1.5 \cdot F_{sbb}$, resulting in $$|H(f)| = \frac{\text{Sin}(1.5 \cdot \pi)}{(1.5 \cdot \pi)} = -13.5 \text{ dBc}.$$

Point (b) is at $f = 2.5 \cdot F_{sbb}$, resulting in $|H(f)| = -17.9$ dBc.

Considering $x(t)$ to be the sampled amplitude signal, the impulse-sampled version of $x(t)$ can be written in the frequency domain as follows:

$$X_p(f) = \sum_{n=-\infty}^{+\infty} X(f - nF_{sbb}) \quad (69)$$

By passing this signal through the zero order hold, the output becomes:

$$X_{ZOH}(f) = \sum_{n=-\infty}^{+\infty} e^{-j\pi T_{sbb}} \frac{\text{Sin}(\pi T_{sbb})}{(\pi f T_{sbb})} X(f - nF_{sbb}) \quad (70)$$

Using (70) and (65), the noise spectral density for the input signal with $N_t = (N_i + N_f)$ number of bits oversampled from $Fs_{bb}$ to $Fs_{rf}$ is given by:

$$P_{Nyq(dBc/Hz)}(f) = \quad (71)$$

$$-6 \cdot (N_i + N_f) - 10\text{Log}_{10}\left(\frac{Fs_{bb}}{2}\right) - 3 + S_x + 20\text{Log}_{10}\left(\left|\frac{\text{Sin}(\pi f T_{sbb})}{(\pi f T_{sbb})}\right|\right)$$

Figure 14:
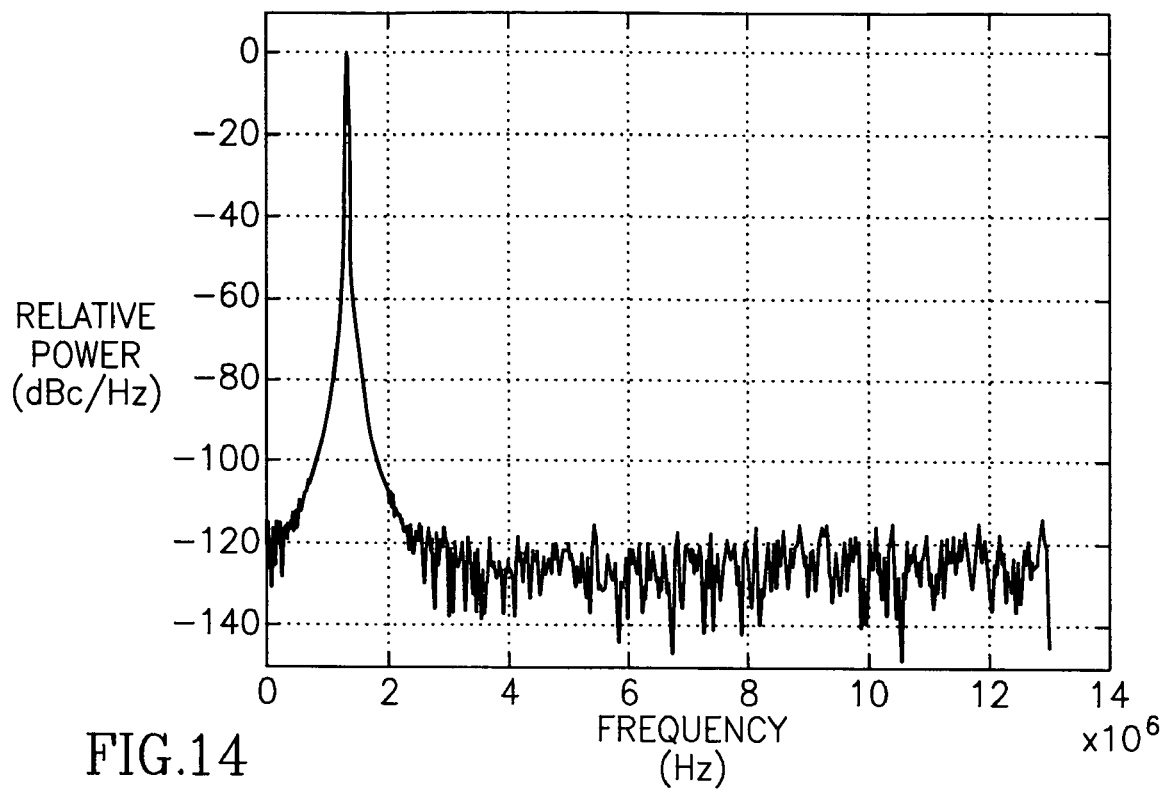
FIG. 14 is a plot illustrating the relative power of a 16-bit sine wave having frequency of 1.33 MHz and $F_S=26$ MHz.
Figure 15:
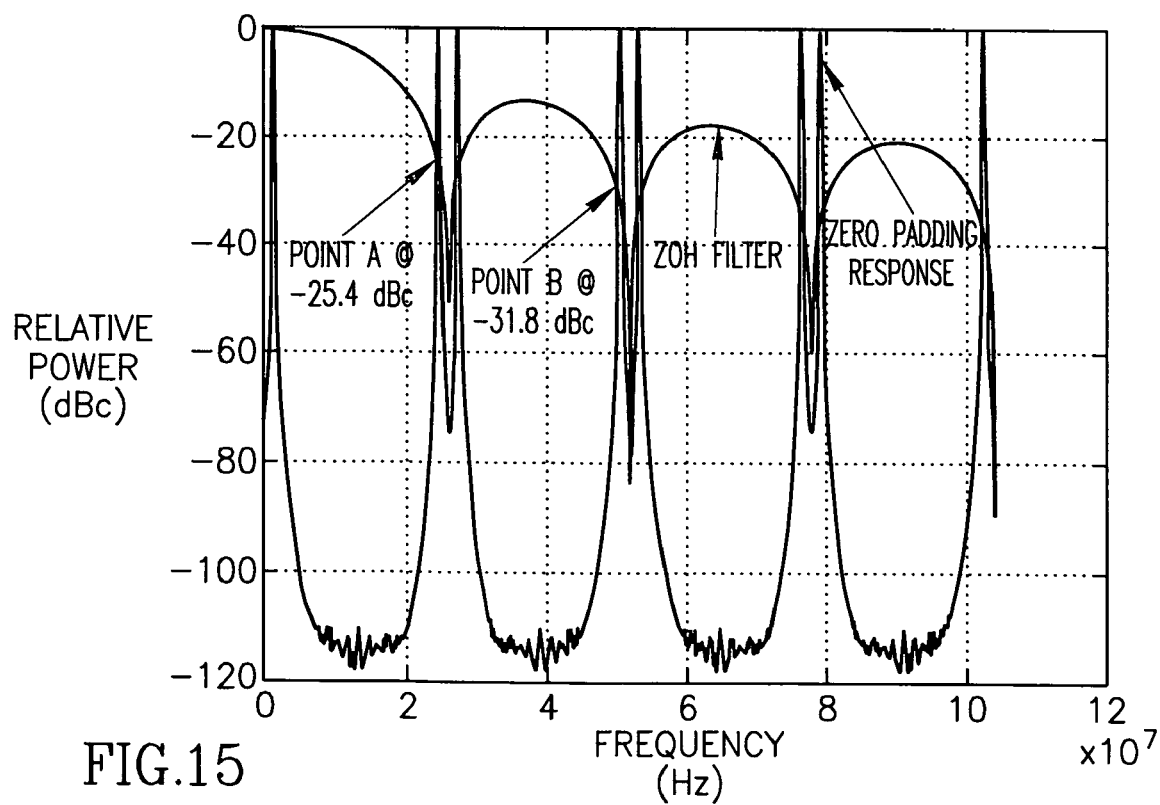
FIG. 15 is a plot illustrating the impulse response of the sine wave superimposed on the magnitude response of the zero-order hold filter response.
Figure 16:
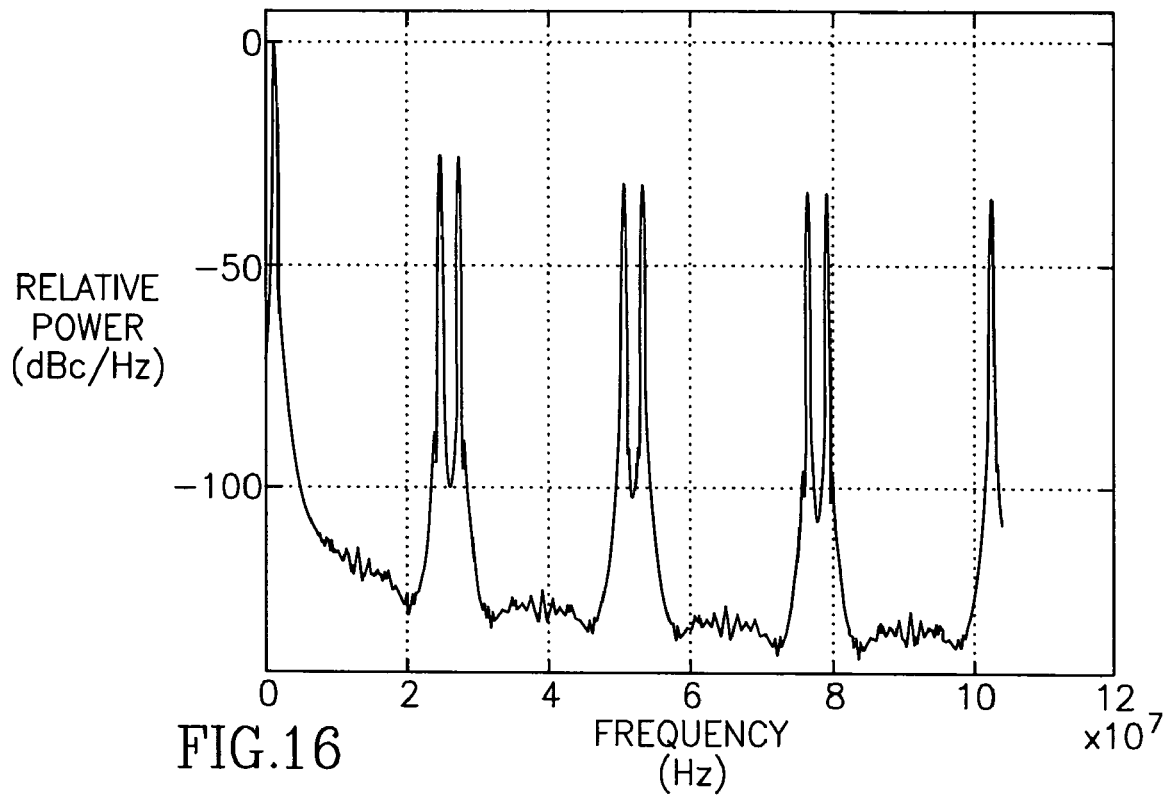
FIG. 16 is a plot illustrating the magnitude response of the over-sampled sine wave using a zero-order hold filter.

For example, consider $x(t)$, a 16-bit sine wave having a frequency of 1.33 MHz with a sampling frequency of 26 MHz, as shown in FIG. 14. The signal is up-sampled by 8 to 208 MHz by passing the impulse-sampled version of $x(t)$ through the zero-order hold filter as shown in FIG. 15. The output will be as shown in FIG. 16, which reflects the magnitude of Equation (71).

Point A in FIG. 15, which is the sampling frequency image located at $f = F_{sbb} - F_0$, can be calculated as follows: $Fs_{bb} = 26$ MHz, $F_0 = 1.33$ MHz, $X(f)_{impulse} = 0$ dB. Therefore, $$20\text{Log}_{10}(X(f)_{zoh@A}) = 20\text{Log}_{10}\left(\left|\frac{\text{Sin}(\pi(F_{sbb} - F_0)/F_{sbb})}{(\pi(F_{sbb} - F_0)/F_{sbb})}\right|\right) \quad (72)$$

$$= 20\text{Log}_{10}\left(\left|\frac{\text{Sin}(\pi(26e^6 - 1.33e^6)/26e^6)}{(\pi(26e^6 - 1.33e^6)/26e^6)}\right|\right)$$

$$= -25.4 \text{ dB}$$

Figure 17:
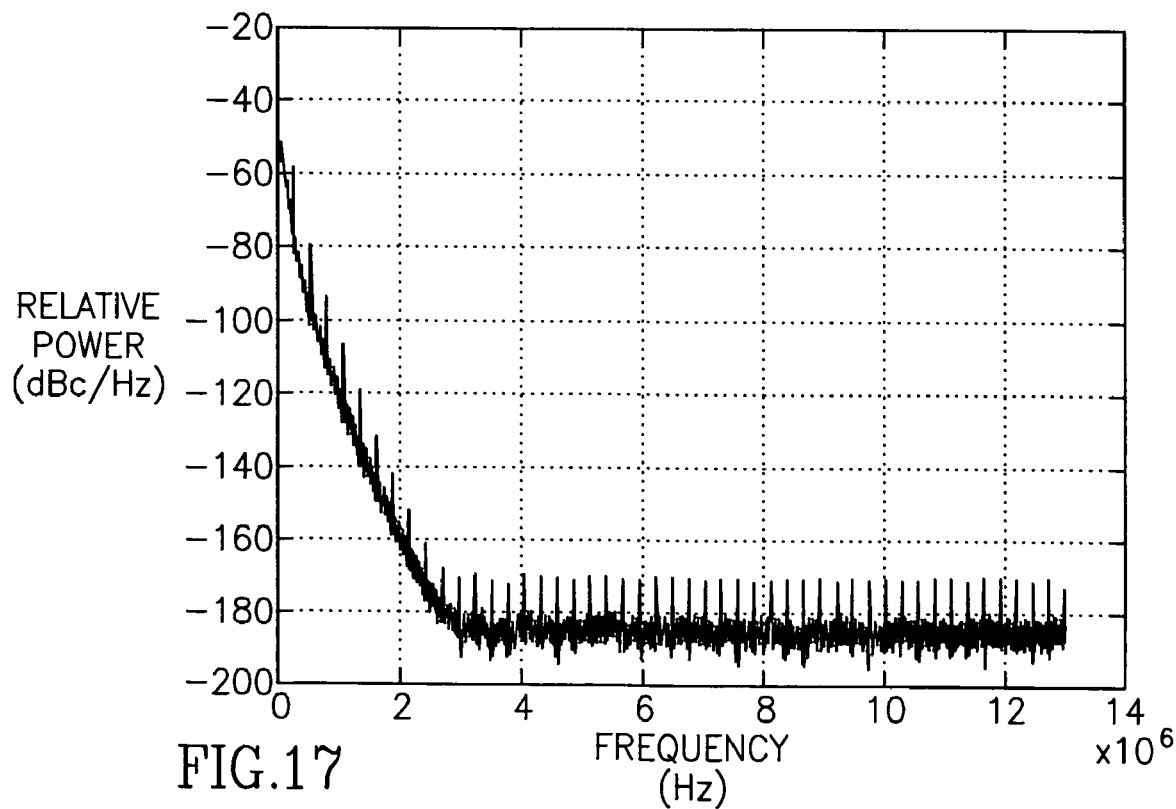
FIG. 17 is a plot illustrating the amplitude spectrum of a 16-bit EDGE signal sampled at 26 MHz.
Figure 18A:
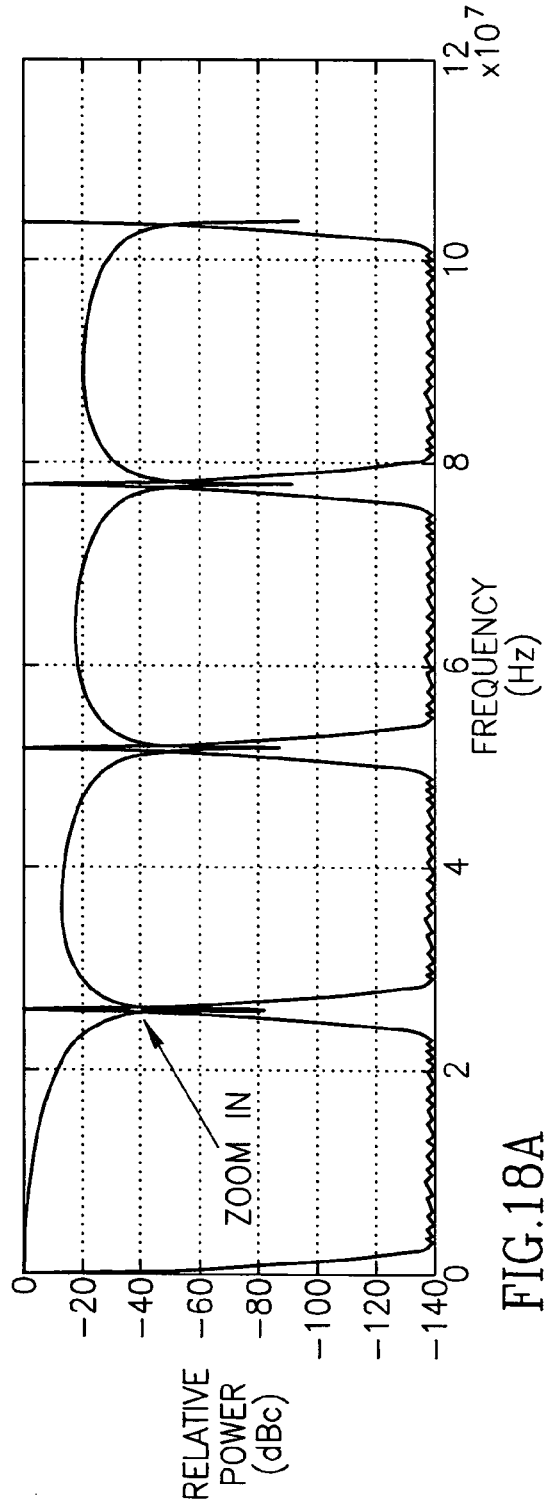
FIGS. 18A and 18B are plots of the spectrum of the zero-order hold filter versus the EDGE amplitude signal over-sampled by eight.
Figure 18B:
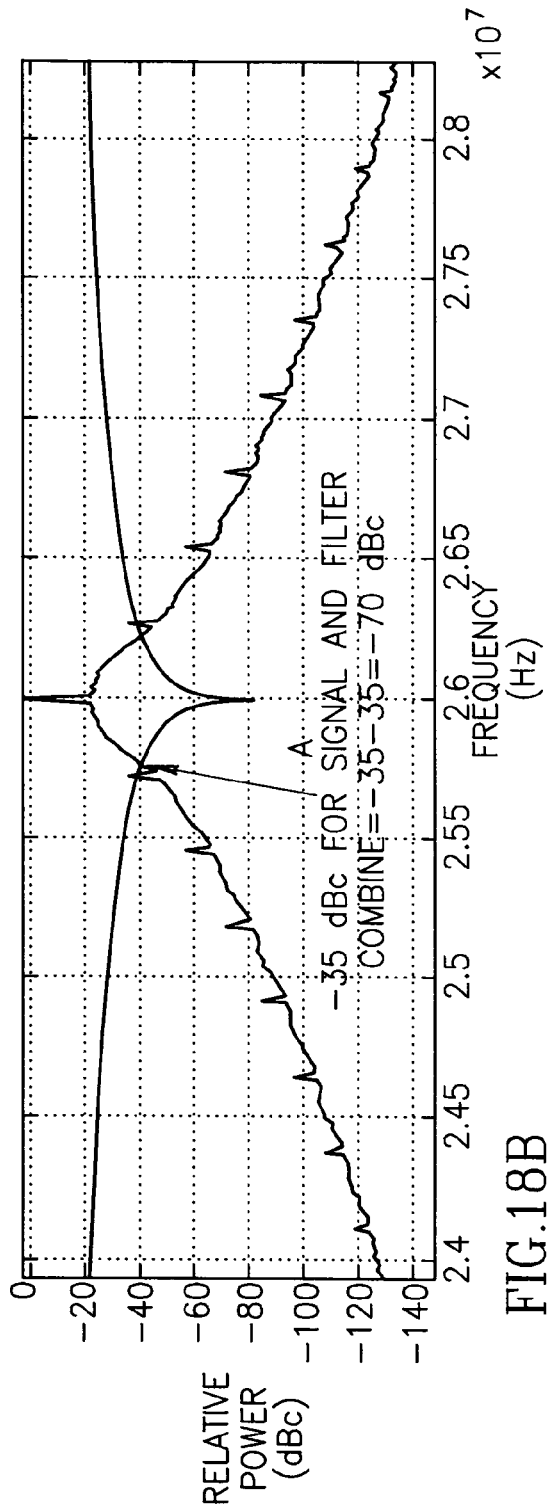
Figure 19:
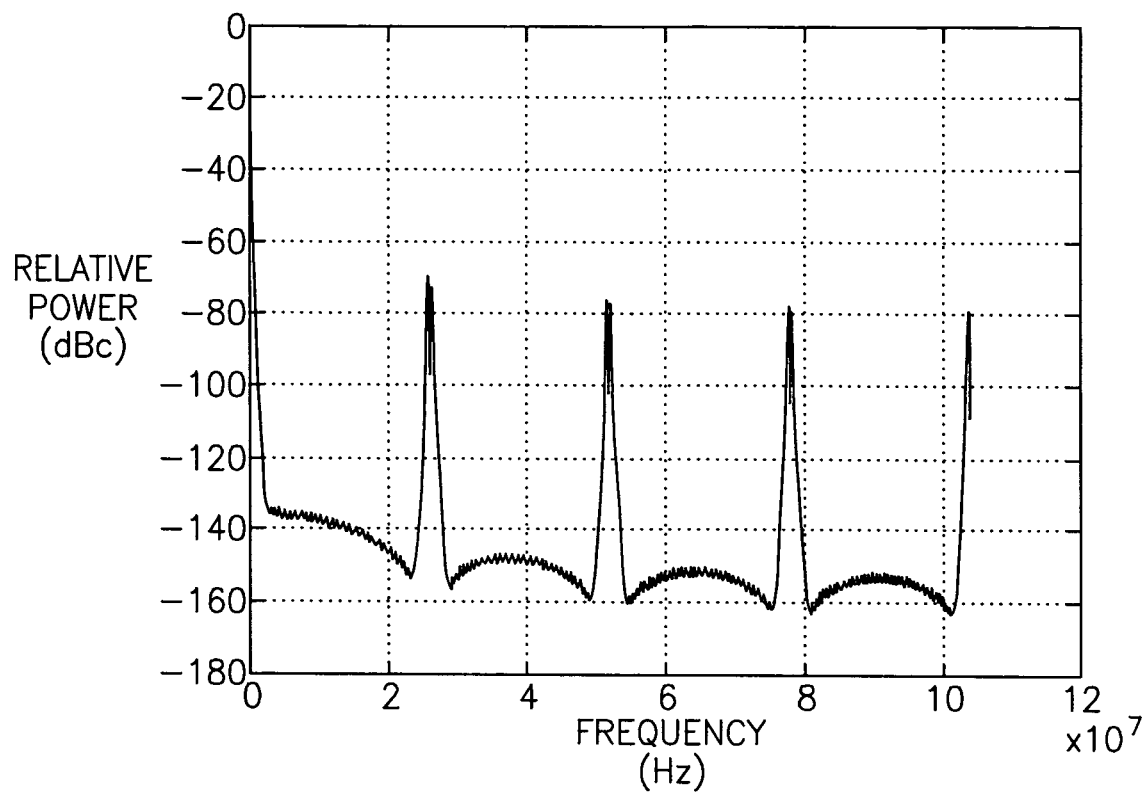
FIG. 19 is a plot illustrating the zero-order hold over-sampled EDGE amplitude signal sampled at 26 MHz.

The same can be done for an EDGE amplitude signal. FIG. 17 shows the spectrum for a 16-bit EDGE amplitude signal sampled at 26 MHz. FIGS. 18A and 18B show (1) the spectrum of the impulse-sampled EDGE envelope signal after over-sampling by eight by zero padding every sample, and (2) the spectrum for the output signal of the zero-order hold filter. FIG. 19 shows the end result for the zero-order hold over-sampled EDGE amplitude signal.

At point A in FIG. 18A, where the zero-order filter intersects with the first spectral replica of the spectrum of the sampled amplitude, the peak of the replica is at $-35-35=-70$ dBc.

3.3 Implementation of a MASH Low Pass $\Sigma\Delta$ Modulator

In this section the structure of a programmable order MASH sigma delta used in the SAM block of the present invention is presented.

3.3.1 $1^{st}$ Order Low Pass $\Sigma\Delta$ Using an Accumulator

Figure 20:
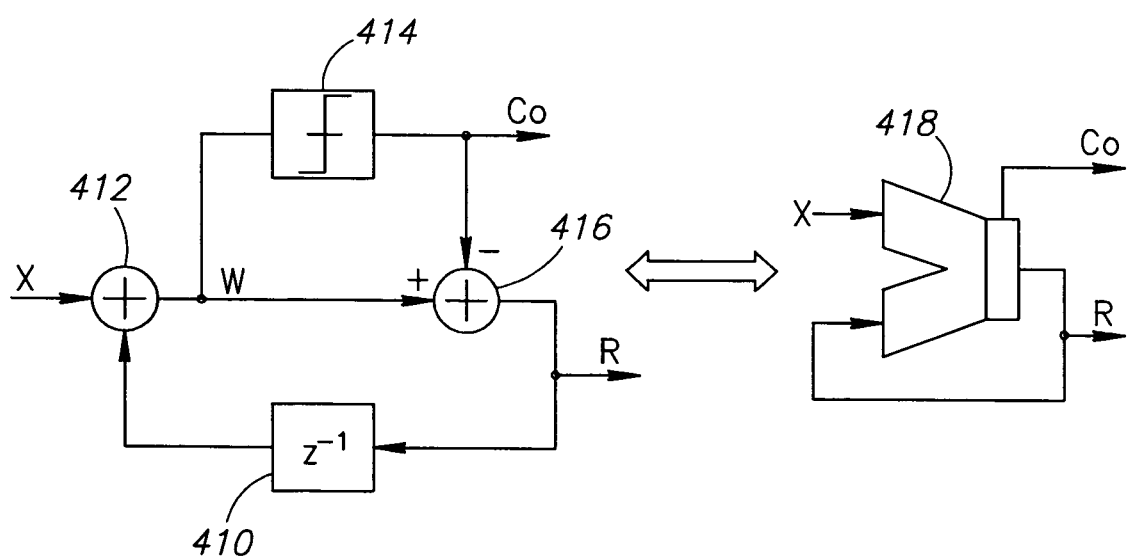
FIG. 20 is a block diagram illustrating a $1^{st}$ order $\Sigma\Delta$ converter using an accumulator.

A block diagram illustrating a $1^{st}$ order $\Sigma\Delta$ modulator is shown in FIG. 20. The $\Sigma\Delta$ converter comprises a delay element 410, summers 412, 416 and a comparator 414. The converter circuit can be equivalently represented as an accumulator 418. From the block diagram the following can be derived:

$$W_1(z) = X(z) + R_1(z)Z^{-1} \tag{73}$$

$$W_1(z) + E_1(z) = Co_1 \tag{74}$$

$$R_1(z) = W_1(z) - Co_1 \tag{75}$$

Substituting (75) into (73) results in:

$$W_1(z) = X(z) + (W_1(z) - Co_1)Z^{-1}$$

$$W_1(z) - W_1(z)Z^{-1} = X(z) - Co_1 Z^{-1}$$

$$W_1(z)(1-Z^{-1}) = X(z) - Co_1 Z^{-1} \tag{76}$$

From (74)$\rightarrow W_1(z) = Co_1 - E_1(z)$, substituting into (107) yields $$(Co_1 - E_1(z))(1-Z^{-1}) = X(z) - Co_1 Z^{-1}$$

$$Co_1(1-Z^{-1}) = X(z) - Co_1 Z^{-1} + E_1(z)(1-Z^{-1})$$

The equation for a first order low pass $\Sigma\Delta$ is therefore given by:

$$Co_1 = X(z) + E_1(z)(1-Z^{-1}) \tag{77}$$

From (76), $$W_1(z) = \frac{X(z) - CO_1 Z^{-1}}{(1-Z^{-1})}.$$

Substituting in (75) results in:

$$R_1(z) = \frac{X(z) - Co_1 Z^{-1}}{(1-Z^{-1})} - \frac{Co_1(1-Z^{-1})}{(1-Z^{-1})} = \frac{X(z) - Co_1}{(1-Z^{-1})} \tag{78}$$

Figure 21:
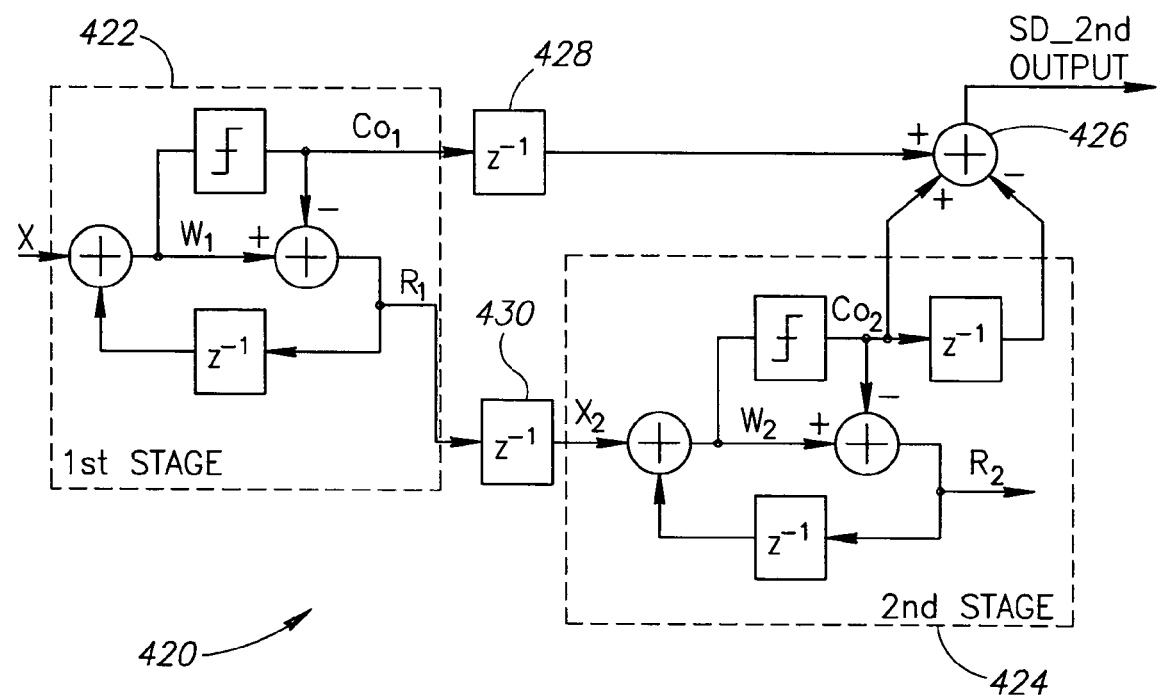
FIG. 21 is a block diagram illustrating a $2^{nd}$ order $\Sigma\Delta$ converter constructed using the $1^{st}$ order $\Sigma\Delta$ converter as a building block.

3.3.2 $2^{nd}$ Order Low Pass $\Sigma\Delta$ Converter Using the $1^{st}$ Order as a Building Block Treating the $2^{nd}$ stage as a $1^{st}$ order $\Sigma\Delta$, we can reuse the above equations. As shown in FIG. 21, $R_1(z)$ can be used as the input signal to the second block. The $2^{nd}$ order $\Sigma\Delta$ converter, generally referenced 420, comprises two $1^{st}$ order stages 422, 424 coupled via delay elements 428, 430. The output is generated by summer 426. From (78) we write:

$$X_2(z) = R_1(z)Z^{-1} = \frac{(X(z) - Co_1)Z^{-1}}{(1-Z^{-1})} \tag{79}$$

From (77) we write:

$$Co_2 = X_2(z) + E_2(z)(1-Z) \tag{80}$$

Substituting (78) into (77) gives $$Co_2 = \frac{(X(z) - Co_1)Z^{-1}}{(1-Z^{-1})} + E_2(z)(1-Z^{-1})$$

$$Co_2(1-Z^{-1}) = X_2(z)Z^{-1} - Co_1 + E_2(z)(1-Z^{-1})^2$$

Thus, the equation for a $2^{nd}$ order low pass $\Sigma\Delta$ is given by:

$$Co_2 - Co_2 Z^{-1} + Co_1 Z^{-1} = X_2(z)Z^{-1} + E_2(z)(1-Z^{-1}) \tag{81}$$

Figure 22:
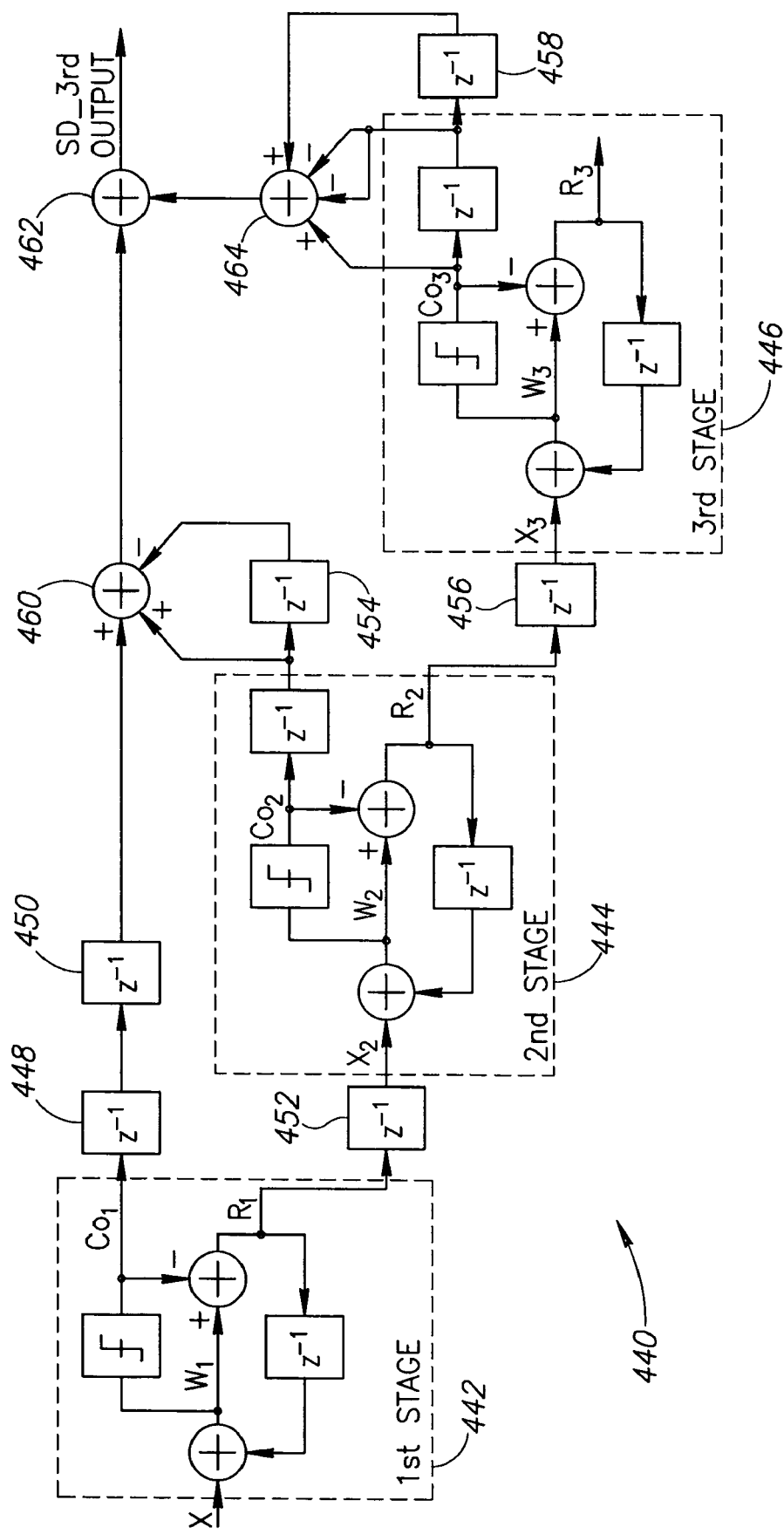
FIG. 22 is a block diagram illustrating a $3^{rd}$ order $\Sigma\Delta$ converter constructed using the $1^{st}$ order $\Sigma\Delta$ converter as a building block.

3.3.3 $3^{rd}$ Order Low Pass $\Sigma\Delta$ Converter Using the $1^{st}$ Order as a Building Block Treating the $2^{nd}$ and $3^{rd}$ stages as $1^{st}$ order $\Sigma\Delta$s, we can reuse the above equations. As shown in FIG. 22, R(z) can be used as the input signal to the second and third blocks. The $3^{rd}$ order $\Sigma\Delta$ converter, generally referenced 440, comprises three $1^{st}$ order stages 442, 444, 446, delay elements 448, 450, 452, 454, 456, 458 and summers 460, 462, 464. The output is generated by summer 462. From (78), $$R_2(z) = \frac{X_2(z) - Co_2}{(1-Z^{-1})}, \text{ since } X_2(z) = \frac{(X(z) - Co_1)Z^{-1}}{(1-Z^{-1})}$$

$$R_2(z) = \frac{\frac{(X(z) - Co_1)Z^{-1}}{(1-Z^{-1})} - Co_2}{(1-Z^{-1})} \tag{82}$$

$$X_3(z) = R_2(z)Z^{-1}$$

$$X_3(z) = \frac{(X(z) - Co_1)Z^{-2} - Co_2(1-Z^{-1})Z^{-1}}{(1-Z^{-1})^2}$$

Using (77), $Co_3 = X_3(z) + E_3(z)(1-Z^{-1})$, substituting (82) results in $$Co_3 = \frac{(X(z) - Co_1)Z^{-2} - Co_2(1-Z^{-1})Z^{-1}}{(1-Z^{-1})^2} + E_3(z)(1-Z^{-1})$$

$$Co_3(1-Z^{-1})^2 = X(z)Z^{-2} - Co_1 Z^{-2} - Co_2(1-Z^{-1})Z^{-1} + E_3(z)(1-Z^{-1})^3$$

Therefore, the equation for a $3^{rd}$ order low pass $\Sigma\Delta$ is given by:

$$Co_3(1-2Z^{-1}+Z^{-2}) + Co_1 Z^{-2} - Co_2(Z_{-1}Z^{-2}) = X(z)Z^{-2} + E_3(z)(1-Z^{-1})^3 \tag{83}$$

Figure 23:
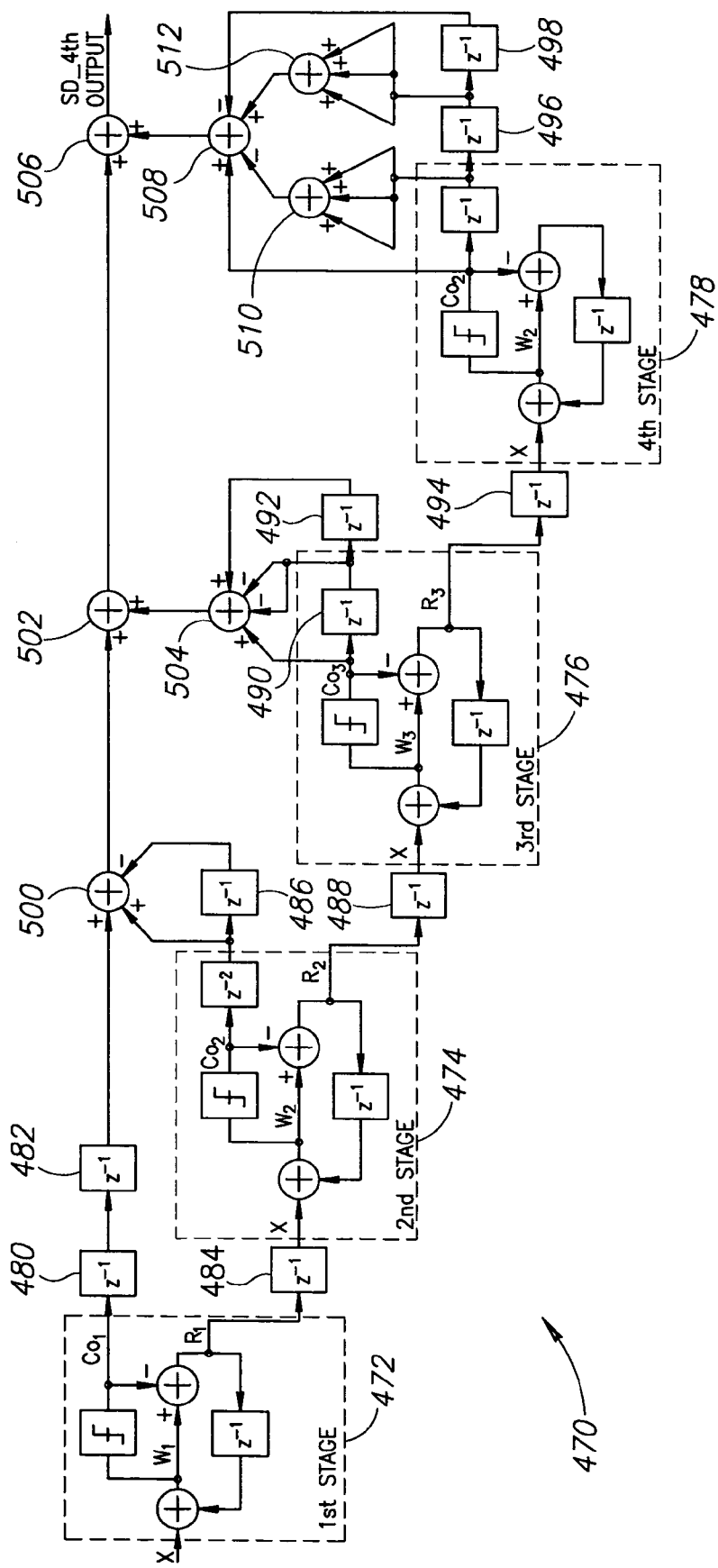
FIG. 23 is a block diagram illustrating a $4^{th}$ order low pass $\Sigma\Delta$ converter constructed using the $1^{st}$ order $\Sigma\Delta$ converter as a building block.

3.3.4 4th Order Low Pass ΣΔ Converter Using the 1st Order as a Building Block Treating the $2^{nd}$, $3^{rd}$ and $4^{th}$ stages as $1^{st}$ order ΣΔs, we can reuse the above equations. As shown in FIG. 23, R(z) can be used as the input signal to the second, third and fourth blocks. The $4^{th}$ order ΣΔ converter, generally referenced 470, comprises four $1^{st}$ order stages 472, 474, 476, 478, delay elements 480, 482, 484, 486, 488, 490, 492, 494, 496, 498 and summers 500, 502, 504, 506, 508, 510, 512. The output is generated by summer 506. From (109)

$$R_3(z) = \frac{X_3(z) - Co_3}{(1-Z^{-1})}, \quad (82)$$

since $X_3(z) = \frac{(X(z)-Co_1)Z^{-2} - Co_2(1-Z^{-1})Z^{-1}}{(1-Z^{-1})^2}$ from $$R_3(z) = \frac{\frac{(X(z)-Co_1)Z^{-2} - Co_2(1-Z^{-1})Z^{-1}}{(1-Z^{-1})^2} - Co_3}{(1-Z^{-1})} =$$

$$\frac{(X(z)-Co_1)Z^{-2} - Co_2(1-Z^{-1})Z^{-1} - Co_3(1-Z^{-1})^2}{(1-Z^{-1})^3}$$

$$X_4(z) = R_3(z)Z^{-1} =$$

$$\frac{(X(z)-Co_1)Z^{-3} - Co_2(1-Z^{-1})Z^{-2} - Co_3Z^{-1}(1-Z^{-1})^2}{(1-Z^{-1})^3}$$

$$Co_4 = X_4(z) + E_4(z)(1-Z^{-1}) =$$

$$\frac{(X(z)-Co_1)Z^{-3} - Co_2(1-Z^{-1})Z^{-2} - Co_3Z^{-1}(1-Z^{-1})^2}{(1-Z^{-1})^3} +$$

$$E_4(z)(1-Z^{-1})$$

$$Co_4(1-Z^{-1})^3 = X(z)Z^{-3} - Co_1Z^{-3} - Co_2(1-Z^{-1})Z^{-2} -$$

$$Co_3Z^{-1}(1-Z^{-1})^2 + E_4(z)(1-Z^{-1})^4$$

Thus, the equation for a $4^{th}$ order low pass ΣΔ is given by:

$$Co_4(1-3Z^{-1}+3Z^{-2}-Z^{-4})+Co_1Z^{-3}+Co_2(1-Z^{-1})Z^{-2}+$$
$$Co_3Z^{-1}(1-2Z^{-1}+Z^{-2})=X(z)Z^{-3}+E_4(z)(1-Z^{-1})^4$$

Figure 24A:
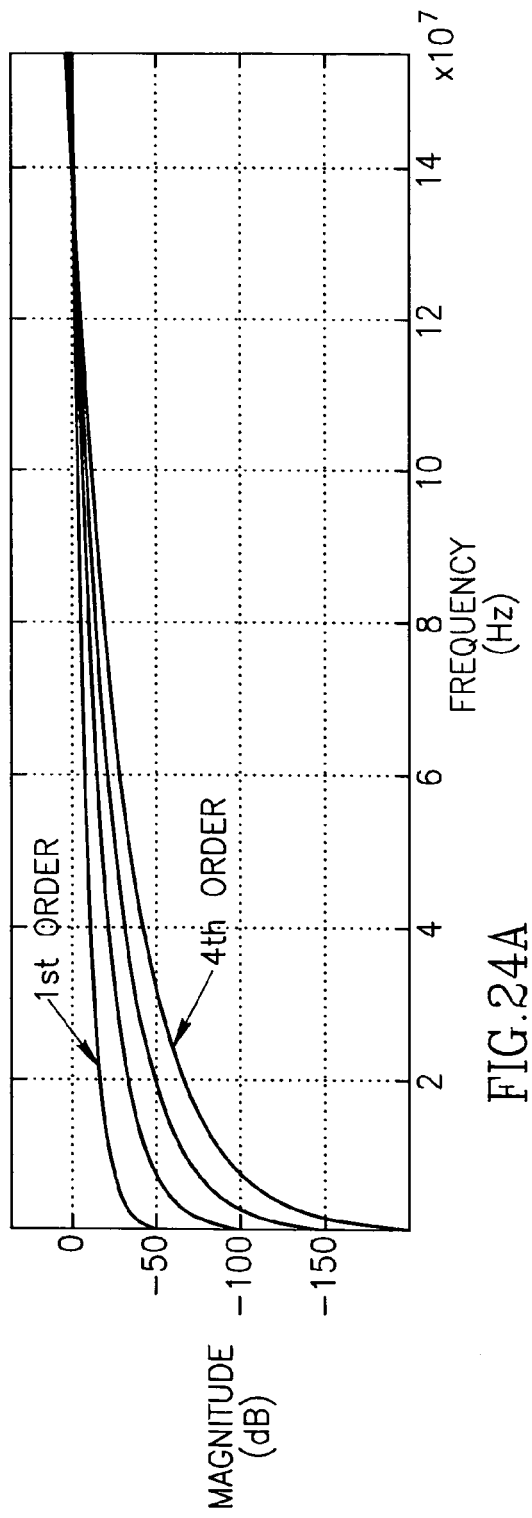
FIGS. 24A and 24B are plots illustrating the frequency response of $1^{st}$, $2^{nd}$, $3^{rd}$ and $4^{th}$ order $\Sigma\Delta$ modulators.
Figure 24B:
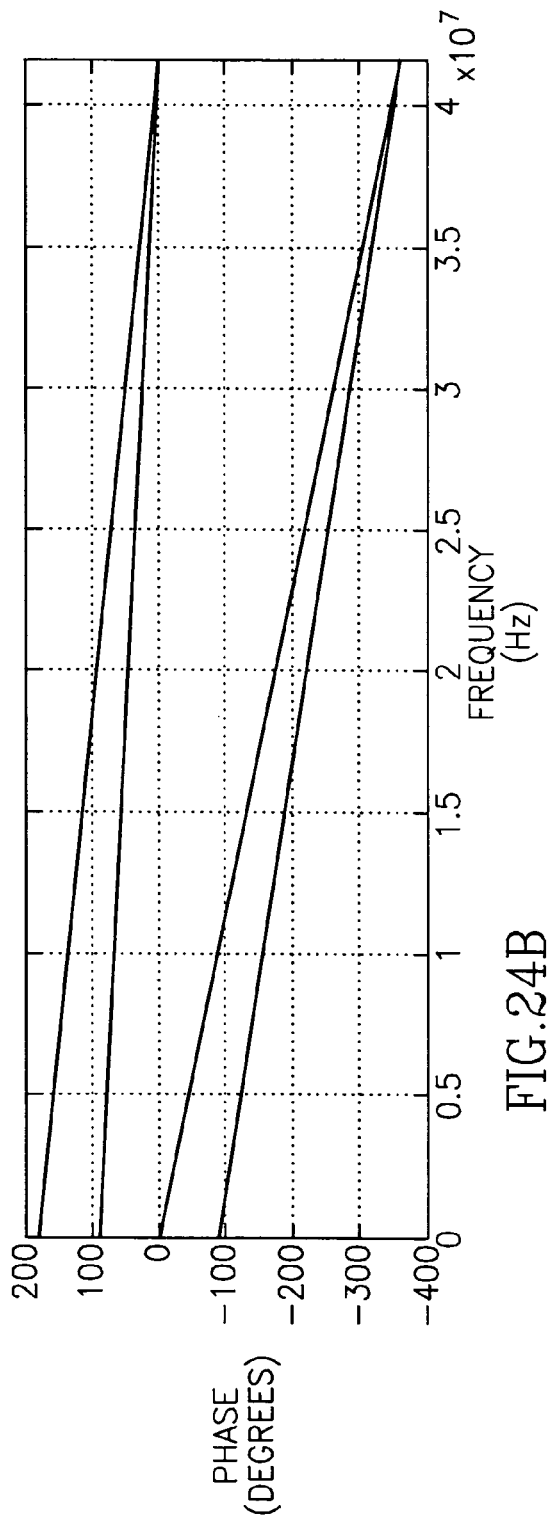

FIGS. 24A and 24B show the frequency response of the modulator with $1^{st}$, $2^{nd}$, $3^{rd}$ and $4^{th}$ orders.

3.4 SAM Block Performance

The performance of the SAM block output can be found by overlaying the noise density of Equation (64) on top of Equation (71). At each frequency point the power spectral density of (64) versus (71) is compared. The one with the highest value is selected to get the total theoretical power spectral density of the output of the SAM block.

Figure 25:
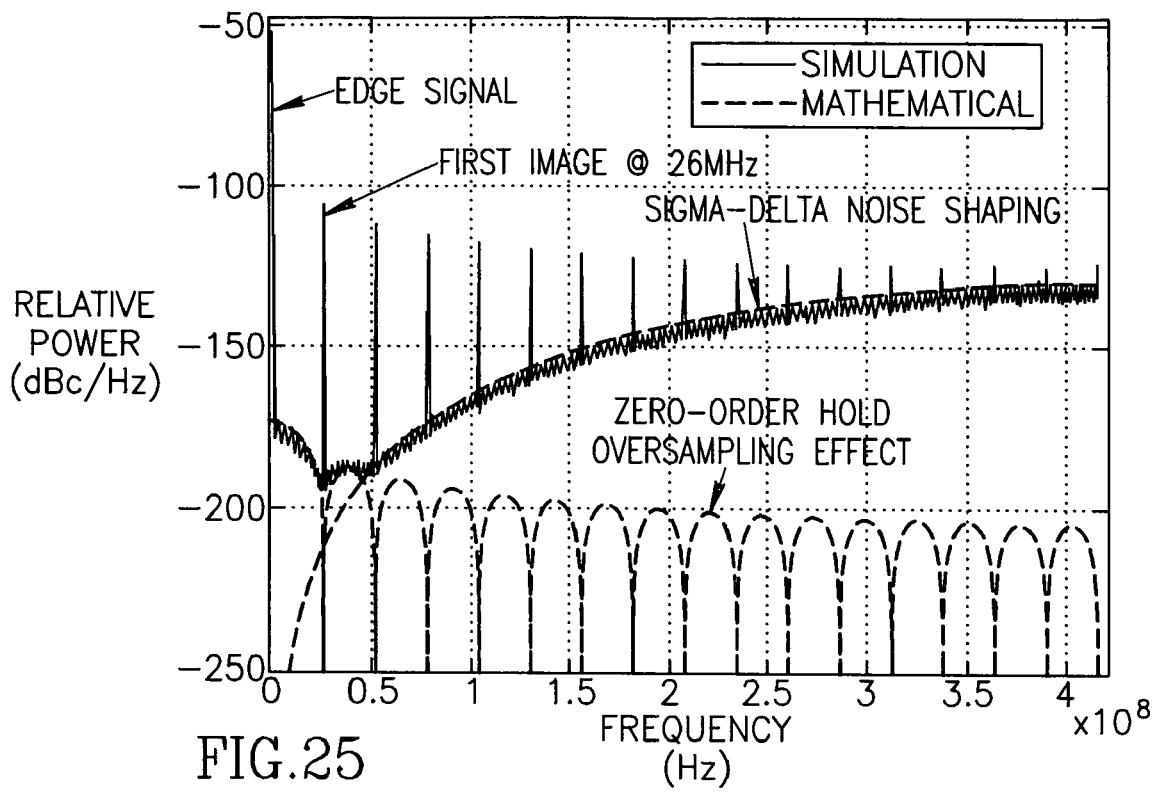
FIG. 25 is a plot illustrating the spectrum of the $4^{th}$ order $\Sigma\Delta$ modulator.

This section illustrates the performance of the SAM block under different scenarios. A comparison is drawn between simulation output and the combination of Equations (64) and (71). Note that:

$N_i$ is the integer number of bits
$N_f$ is the fractional number of bits
$Fs_{bb}$ is the baseband sampling frequency
$Fs_{rf}$ is the RF sampling frequency The following three cases are tested wherein $FS_{bb}$=26 MHz, $Fs_{rf}$=832 MHz is used for each case:

$4^{th}$ order sigma delta, $N_i$=10, $N_f$=6, $Fs_{bb}$=26 MHz, $Fs_{rf}$=832 MHz $2^{nd}$ order sigma delta, $N_i$=10, $N_f$=6, $Fs_{bb}$=26 MHz, $Fs_{rf}$=832 MHz $4^{th}$ order sigma delta, $N_i$=8, $N_f$=4, $Fs_{bb}$=26 MHz, $Fs_{rf}$=832 MHz For the first case, the following parameters were used: $N_i$=10, $N_f$=6, $Fs_{bb}$=26 MHz, $Fs_{rf}$=832 MHz, SD order=$4^{th}$. A spectrum plot of the relative power versus frequency for the $4^{th}$ order ΣΔ modulator is shown in FIG. 25.

Figure 26:
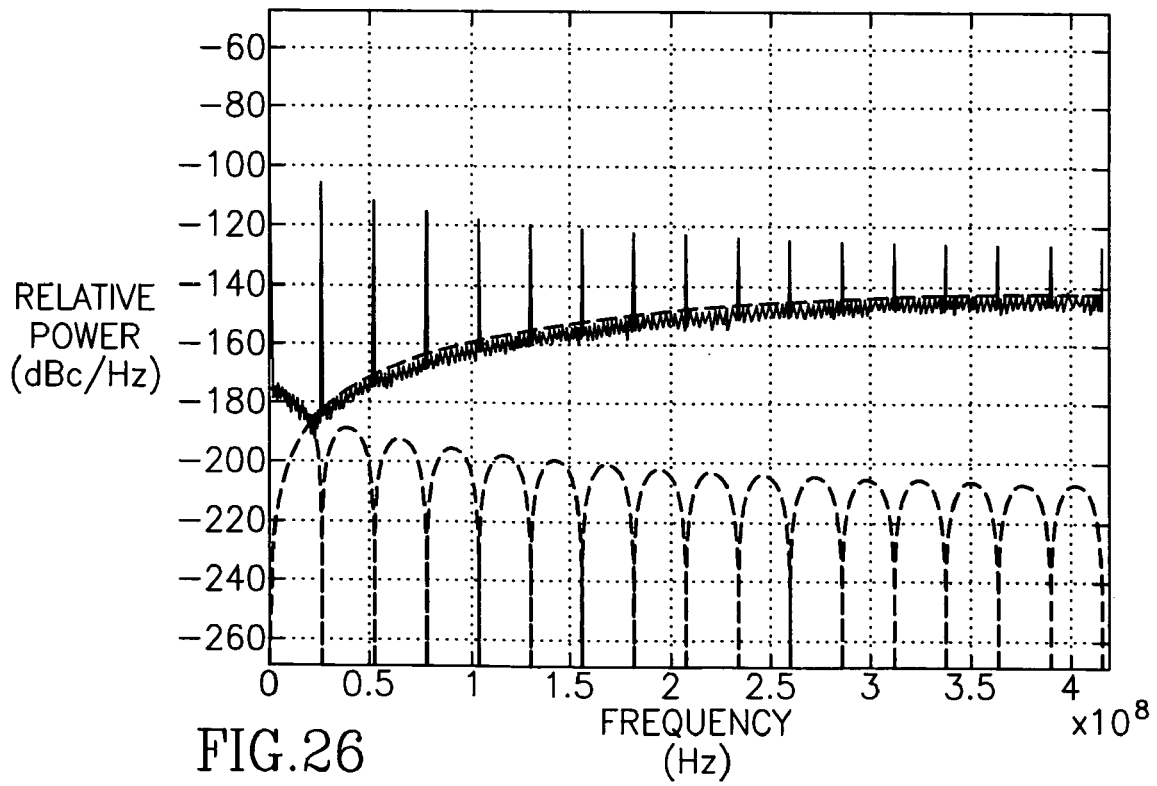
FIG. 26 is a plot illustrating the spectrum of the $2^{nd}$ order $\Sigma\Delta$ modulator.

For the second case, the following parameters were used: $N_i$=10, $N_f$=6, $Fs_{bb}$=26 MHz, $Fs_{rf}$=832 MHz, SD order=$2^{nd}$. A spectrum plot of the relative power versus frequency for the $2^{nd}$ order ΣΔ modulator is shown in FIG. 26.

Figure 27:
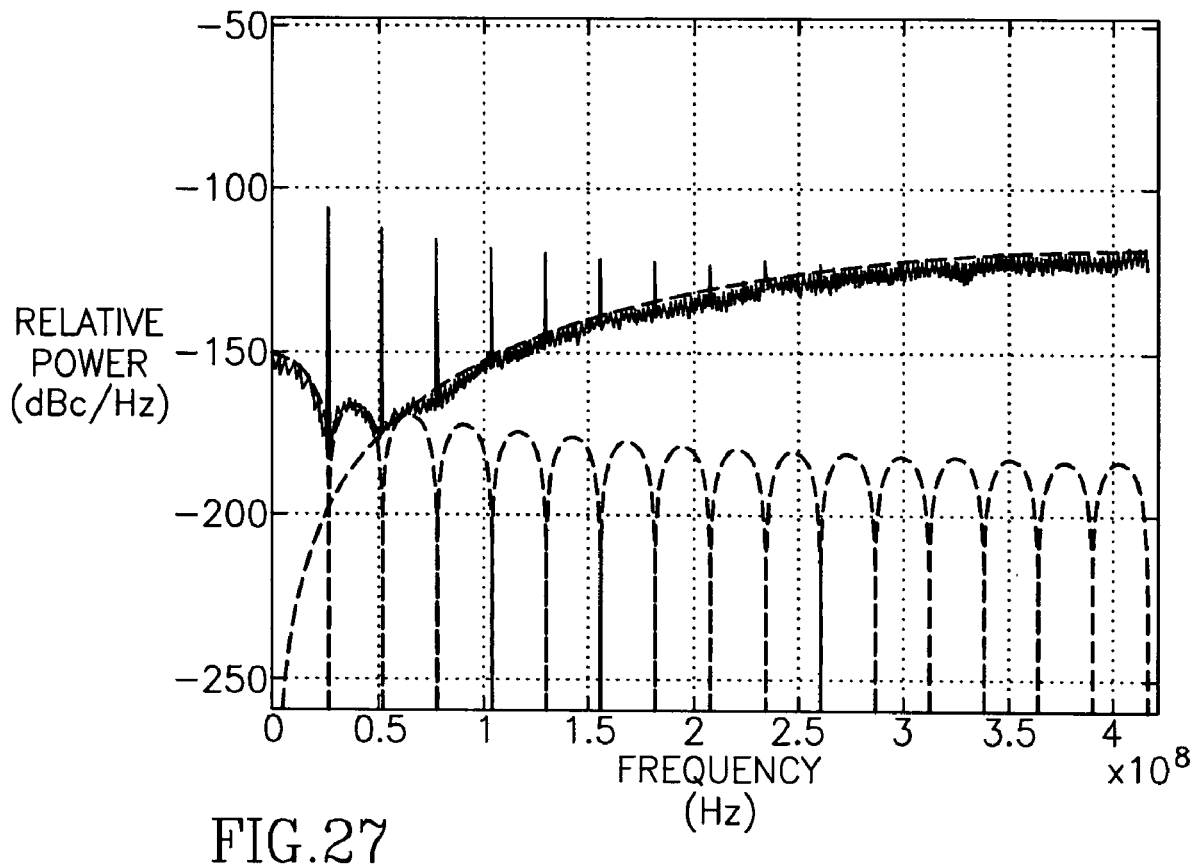
FIG. 27 is a plot illustrating the spectrum of a $4^{th}$ order $\Sigma\Delta$ modulator s with different bit allocation to integer and fractional parts.

For the third case, the following parameters were used: $N_i$=8, $N_f$=4, $Fs_{bb}$=26 MHz, $Fs_{rf}$=832 MHz, SD order=$4^{th}$. A spectrum plot of the relative power versus frequency for the $4^{th}$ order ΣΔ modulator is shown in FIG. 27.

3.5 Adding Notches in High Frequency

The low pass sigma delta modulation yields good noise rejection in frequency regions near the carrier. Since the noise is shaped to have stronger spectral content at higher frequencies, other bands of interest may be impacted by the high level of emissions. In order to avoid such impact in the absence of a SAW filter that could suppress such out-of-band noise, the invention provides several features that are added to the basic SAM block.

3.5.1 Feed Forward Comb Filter

Figure 28:
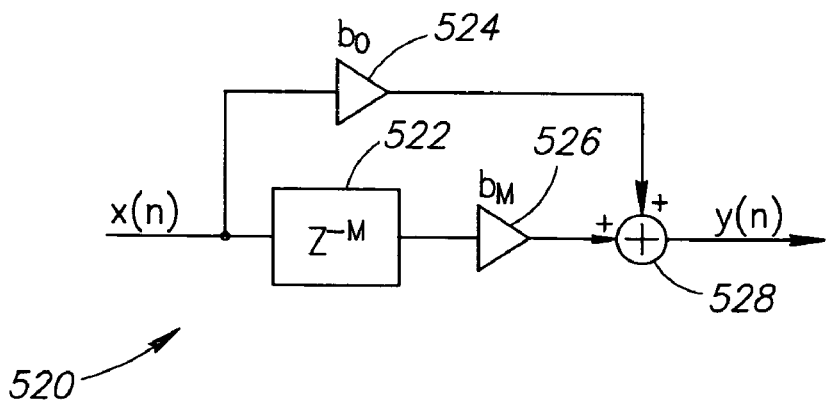
FIG. 28 is a block diagram illustrating a feed forward comb filter.

A comb filter is added to the SAM block in order to suppress unwanted spurs in the output spectrum. A feed forward comb filter is normally implemented as shown in FIG. 28, in which a direct signal x(n) feeds forward around the delay line 522 and sums with the delay line output via summer 528 and gain elements 524, 526. The difference equation for the feed forward Comb filter is given by $$y(n)=b_0 x(n)+b_M x(n-M)$$

The transfer function of the feed forward comb filter, assuming $b_0=b_M=0.5$, is $$H(z)=0.5\cdot(1+Z^{-M})$$

Therefore, the magnitude response (gain versus frequency, wherein $-\pi \leq \omega \leq \pi$) can be written as $$G(\omega) = |H(e^{j\omega T_s})| = 0.5 \cdot |1 + e^{-j\omega T_s M}| \quad (84)$$

$$= 0.5 * \left|e^{-j\omega T_s \frac{M}{2}}\right| \left|e^{j\omega T_s \frac{M}{2}} + e^{-j\omega T_s \frac{M}{2}}\right| = \left|\cos\left(\omega T_s \frac{M}{2}\right)\right|$$

The relationship between the location of notches in the output spectrum and the value of M is described in the following equation:

$$f_{nx} = \left\{\frac{F_s(2k+1)}{2M}\right\}_{k=0}^{\infty}, \text{ where } f_{nx} \leq \frac{F_s}{2}$$

For example, for M=6, the output spectrum will have notches at the following frequencies:

$$\frac{F_s}{12}, \frac{3F_s}{12} \text{ and } \frac{5F_s}{12}.$$

As the value of M increases, additional notches will appear in the output spectrum. The drawback is that the widths of these notches decreases as the number of notches increases.

Figure 29:
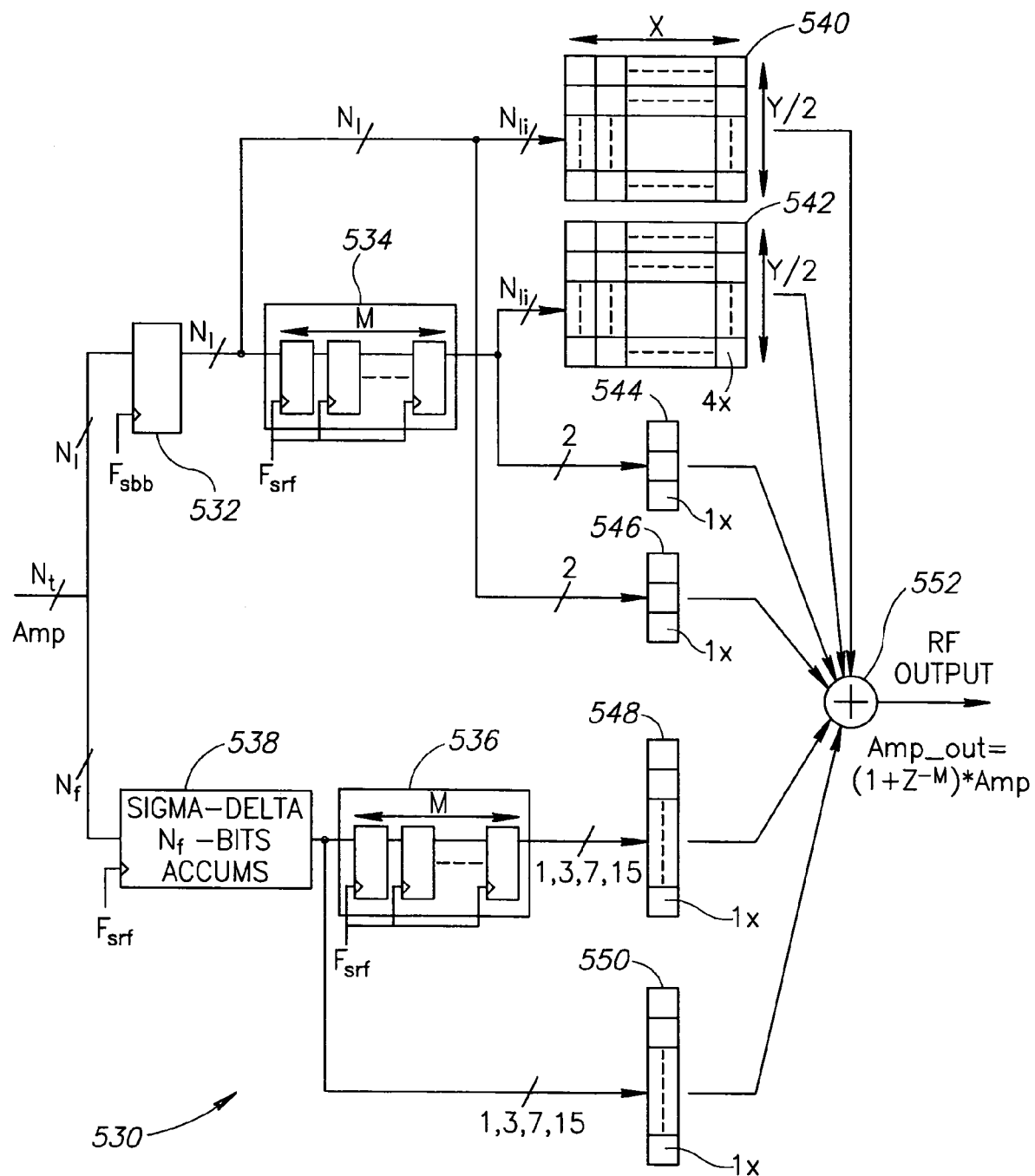
FIG. 29 is a block diagram illustrating a SAM block with comb filter attached.

FIG. 29 shows an example embodiment of the comb filter implemented in the SAM block as contemplated by the present invention. The SAM block, generally referenced 530, comprises register arrays 532, 534, 536, 540, 542, 544, 546, 548, 550, ΣΔ accumulator 538 and summer 552.

The number of integer bits used in this scenario is less than in the previous architecture by one bit. The reason is that the integer number of bits that can be used is derived from the number of transistors that can be implemented in the PPA. Since half the number of transistors must be used for the delayed version of the signal, the resolution of the signal is reduced by half, which is equivalent to one bit. The dimensions of the transistor matrix, however, remain the same. The maximum output power of the PPA is the same as the structure without the comb filter.

Equation (64) stated the power spectral density for the fractional part output from the ΣΔ:

$$P_{SD\_Comb}(f)_{dBc/Hz} = 20\text{Log}_{10}\left|\sigma_e\sqrt{2T_{srf}}\left[2\text{Sin}\left(\frac{\omega T_{srf}}{2}\right)\right]^L\right| - 6 \cdot N_i - 3$$

Adding the effect of the comb filter using Equation (84) yields $$P_{SD\_Comb}(f)_{dBc/Hz} = \qquad (85)$$

$$20\text{Log}_{10}\left(\left|\sigma_e\sqrt{2T_{srf}}\left[2\text{Sin}\left(\frac{\omega T_{srf}}{2}\right)\right]^L\right|\left|\text{Cos}\left(\frac{\omega T_{srf}M}{2}\right)\right|\right) - 6 \cdot N_i - 3$$

Similarly, Equation (71) stated the power spectral density of the Nyquist quantization noise $$P_{Nyq}(f)_{dBc/Hz} =$$

$$-6 \cdot (N_i + N_f) - 10\text{Log}_{10}\left(\frac{F_{sbb}}{2}\right) - 3 + S_x + 20\text{Log}_{10}\left(\left|\frac{\text{Sin}(\pi f T_{sbb})}{(\pi f T_{sbb})}\right|\right)$$

Adding the effect of the comb filter using Equation (84) gives $$P_{Nyq\_Comb}(f)_{dBc/Hz} = -6 \cdot (N_i + N_f) - 10\text{Log}_{10}\left(\frac{F_{sbb}}{2}\right) - \qquad (86)$$

$$3 + S_x + 20\text{Log}_{10}\left(\left|\frac{\text{Sin}(\pi f T_{sbb})}{(\pi f T_{sbb})}\right|\left|\text{Cos}\left(\frac{\omega T_{srf}M}{2}\right)\right|\right)$$

Figure 30:
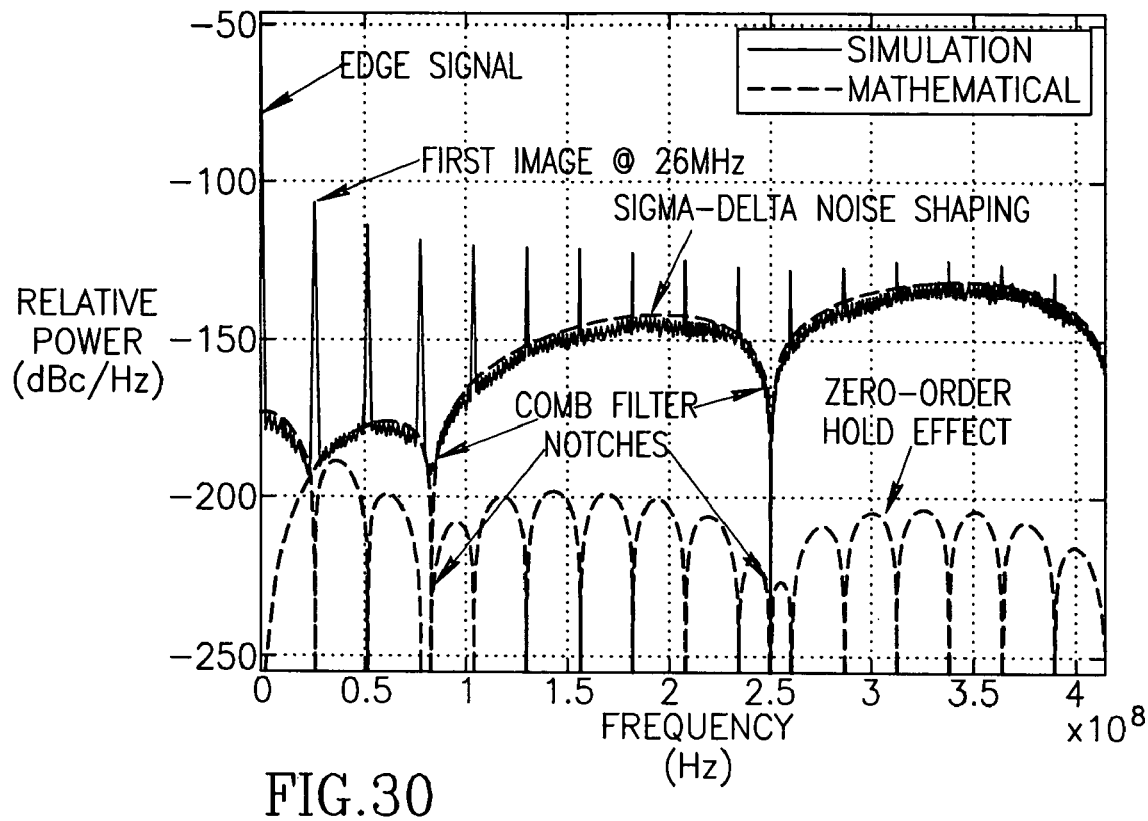
FIG. 30 is a plot illustrating the spectrum of a $3^{rd}$ order $\Sigma\Delta$ modulator and comb filter.

A plot illustrating an example of the output spectrum of the SAM block with the parameters: $N_i=9$, $N_f=7$, $3^{rd}$ order ΣΔ, $F_{sbb}=26$ MHz, $F_{rf}=832$ MHz, and comb filter M=5, is shown in FIG. 30.

3.5.2 MASH Band Pass Sigma Delta Stages

For a single notch ΣΔ modulator the noise is shaped by the transfer function $H(z)=(1-2\ \text{Cos}(\phi)Z^{-1}+Z^{-2})$, where $0 \leq \phi \leq \pi$, corresponds to the frequency range $$0 \leq f \leq \frac{F_s}{2}.$$

For example, if the band-pass notch needed to be at 52 MHz and $F_s=832$ MHz, then $$\phi = 52 \cdot 10^6 \cdot \pi \cdot \frac{2}{F_s} = \frac{\pi}{8}.$$

Converting the z-domain transfer function to the frequency domain yields:

$$H(\omega) = (1 - 2\ \text{Cos}(\phi)e^{-j\omega T_s} + e^{-j2\omega T_s})$$

Therefore, $$|H(\omega)| = |1 - 2\ \text{Cos}(\phi)e^{-j\omega T_s} + e^{-j2\omega T_s}| = |e^{-j\omega T_s}||e^{j\omega T_s} - 2\ \text{Cos}(\phi) + e^{-j\omega T_s}| = |2\ \text{Cos}(\omega T_s) - 2\ \text{Cos}(\phi)|$$

For a double notch ΣΔ modulator the noise is shaped by the transfer function $H(z)=(1-2\ \text{Cos}(\phi_1)Z^{-1}+Z^{-2})(1-2\ \text{Cos}(\phi_1)Z^{-1}+Z^{-2})$, where $\phi_1, \phi_2$ correspond to the locations of the two notches, as explained above.

$$|H(\omega)| = |[2\ \text{Cos}(\omega T_s) - 2\ \text{Cos}(\phi_1)][2\ \text{Cos}(\omega T_s) - 2\ \text{Cos}(\phi_2)]| \qquad (87)$$

From Equations (85) and (87), if the low pass ΣΔ is combined with the band-pass stages and the comb filter, the power spectral density of the noise shaping output of the fractional part of the SAM block is as follows:

$$P_{SD\_Comb}(f)_{dBc/Hz} = 20\text{Log}_{10}\left(\left|\sigma_e\sqrt{2T_{srf}}\left[2\text{Sin}\left(\frac{\omega T_{srf}}{2}\right)\right]^L\right|\left|\text{Cos}\left(\frac{\omega T_{srf}M}{2}\right)\right|\right.$$

$$\left. |[\text{Cos}(\omega T_s) - \text{Cos}(\phi_1)][\text{Cos}(\omega T_s) - \text{Cos}(\phi_2)]|\right) - 6 \cdot N_i - 3$$

Where

L controls the low pass ΣΔ order

M controls the location of the comb filter notches.

$\phi_1, \phi_2$ control the location of the double band-pass notches

3.6 Implementation of MASH Band-Pass ΣΔ

Figure 31:
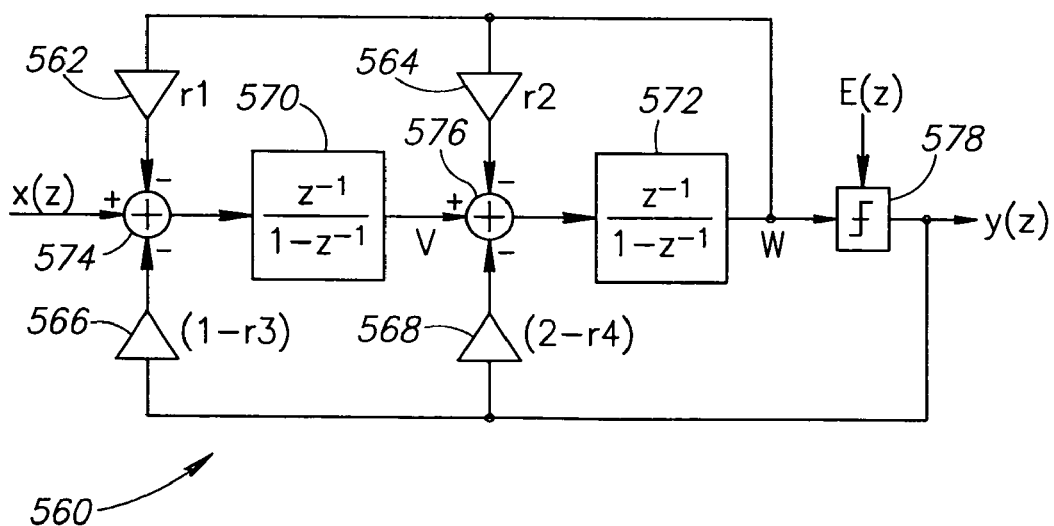
FIG. 31 is a block diagram illustrating the single notch band pass $\Sigma\Delta$ modulator.

A single notch band-pass ΣΔ modulator is shown in FIG. 31. The modulator, generally referenced 560, comprises accumulator blocks 570, 572, gain elements 562, 564, 566, 568, comparator 578 and summers 574, 576. Expressions for v(z) and w(z) are as follows $$v(z) = \frac{z^{-1}}{1 - z^{-1}}[x(z) - (1 - r_3)y(z) - r_1 w(z)] \qquad (88)$$

$$w(z) = \frac{z^{-1}}{1 - z^{-1}}[v(z) - r_2 w(z) - (2 - r_4)y(z)] \qquad (89)$$

Substituting Equation (88) into (89) yields:

$$w(z) = \frac{z^{-1}}{1-z^{-1}}\left[\frac{z^{-1}}{1-z^{-1}}[x(z)-(1-r_3)y(z)-r_1 w(z)] - r_2 w(z)-(2-r_4)y(z)\right] = \tag{90}$$

$$\frac{z^{-1}}{1-z^{-1}}\left[\frac{z^{-1}}{1-z^{-1}}x(z) - \frac{z^{-1}}{1-z^{-1}}(1-r_3)y(z) - \frac{z^{-1}}{1-z^{-1}}r_1 w(z) - r_2 w(z) - (2-r_4)y(z)\right] = \left[\frac{z^{-2}}{(1-z^{-1})^2}x(z) - \frac{z^{-2}}{(1-z^{-1})^2}(1-r_3)y(z) - \frac{z^{-2}}{(1-z^{-1})^2}r_1 w(z) - \frac{z^{-1}}{1-z^{-1}}r_2 w(z) - \frac{z^{-1}}{1-z^{-1}}(2-r_4)y(z)\right]$$

$$w(z)\left[1 + \frac{z^{-2}}{(1-z^{-1})^2}r_1 + \frac{z^{-1}}{1-z^{-1}}r_2\right] = \frac{z^{-2}}{(1-z^{-1})^2}x(z) - \left[\frac{z^{-2}}{(1-z^{-1})^2}(1-r_3) + \frac{z^{-1}}{1-z^{-1}}(2-r_4)\right]y(z)$$

$$w(z) = y(z) - E(z) \tag{91}$$

Substituting Equation (91) into (90) results in $$[y(z)-E(z)]\left[(1-z^{-1})^2 + z^{-2}r_1 + z^{-1}(1-z^{-1})r_2\right] = \tag{92}$$

$$z^{-2}x(z) - [z^{-2}(1-r_3) + z^{-1}(1-z^{-1})(2-r_4)]$$

$$y(z)y(z)\left[(1-z^{-1})^2 + z^{-2}r_1 + z^{-1}(1-z^{-1})r_2 + z^{-2}(1-r_3) + z^{-1}(1-z^{-1})(2-r_4)\right] =$$

$$z^{-2}x(z) + E(z)\left[(1-z^{-1})^2 + z^{-2}r_1 + z^{-1}(1-z^{-1})r_2\right]$$

$$y(z)[1 + z^{-1}(-2+r_2+2-r_4) + z^{-2}(1+r_1-r_2+1-r_3-2+r_4)] =$$

$$z^{-2}x(z) + E(z)[1 + z^{-1}(-2+r_2) + z^{-2}(1+r_1-r_2)]y$$

$$(z)[1 + z^{-1}(r_2-r_4) + z^{-2}(r_1-r_2-r_3+r_4)] =$$

$$z^{-2}x(z) + E(z)[1 - z^{-1}(2-r_2) + z^{-2}(1+r_1-r_2)]$$

Let
$$D(z) = 1 + z^{-1}(r_2-r_4) + z^{-2}(r_1-r_2-r_3+r_4)$$
$$T(z) = 1 - z^{-1}(2-r_2) + z^{-2}(1+r_1-r_2)$$

Then
$$Y(z) = \frac{z^{-2}x(z) + E(z)T(z)}{D(z)}$$

Let
$$r_1 = r_2 = r_3 = r_4 = r$$
$$D(z) = 1$$
$$T(z) = 1 - z^{-1}(2-r) + z^{-2}$$

$$Y(z) = z^{-2}x(z) + E(z)[1 - z^{-1}(2-r) + z^{-2}]$$

Where NTF(z)=1−(2−r)$z^{-1}$+$z^{-2}$ has a second order notch. If 0<r<4, NTF(z) can be written as $$NTF(z) = 1 - 2\cos(\phi)z^{-1} + z^{-2}$$

If r=0.03843, then $$\phi = \frac{\pi}{16}$$

$$\phi = \pi \to \frac{Fs}{2}$$

So, $\phi = \frac{\pi}{16} \to \frac{Fs}{32}$

If $F_s$=832 MHz, then the notch is located at 26 MHz.

Figure 32A:
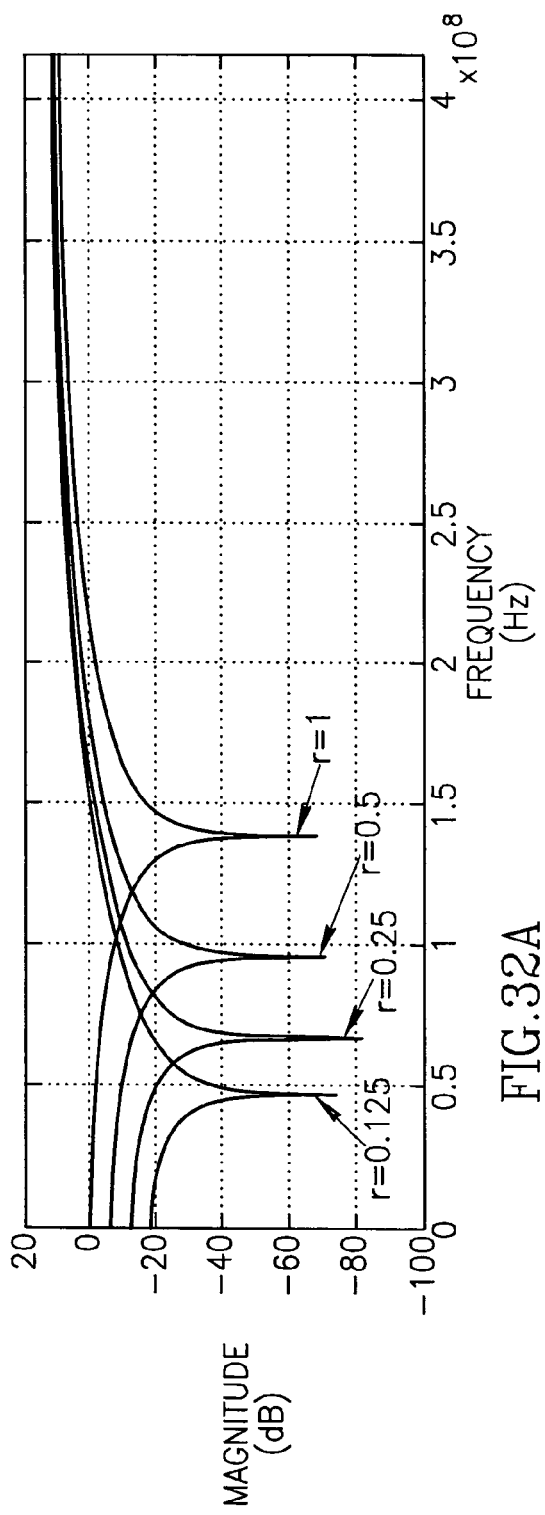
FIGS. 32A and 32B are plots illustrating the frequency response of a single notch band pass $\Sigma\Delta$ modulator for different values of r.
Figure 32B:
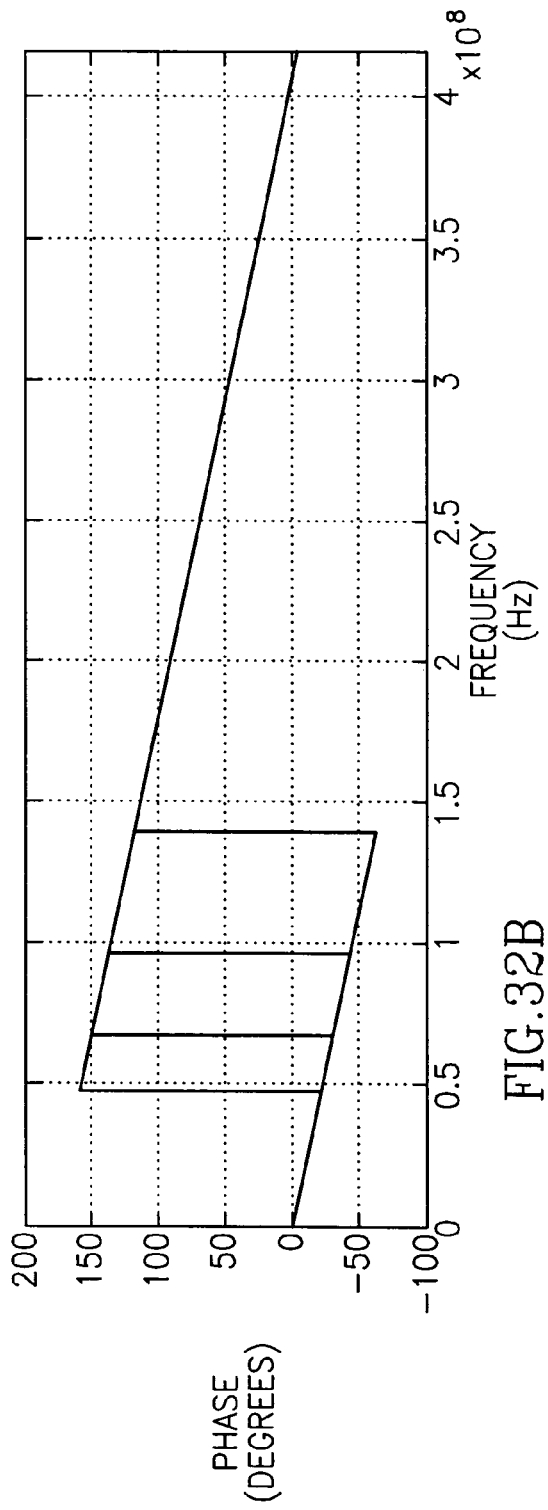

To simplify the implementation, we shall choose r to be a negative integer power of 2. FIGS. 32A and 32B show the frequency response of a single notch band pass ΣΔ for different values of r. Different locations for the notch correspond to different values of r. Table 7 below lists the exact locations of the notches for Fs=832 MHz.

TABLE 7

| Location of notches for different values of r | |
|---|---|
| r | Notch location (MHz) |
| 0.125 | 47.064 |
| 0.25 | 66.918 |
| 0.5 | 95.702 |
| 1.0 | 138.67 |

3.7 MASH Band Pass ΣΔ with Double Notches

Figure 33:
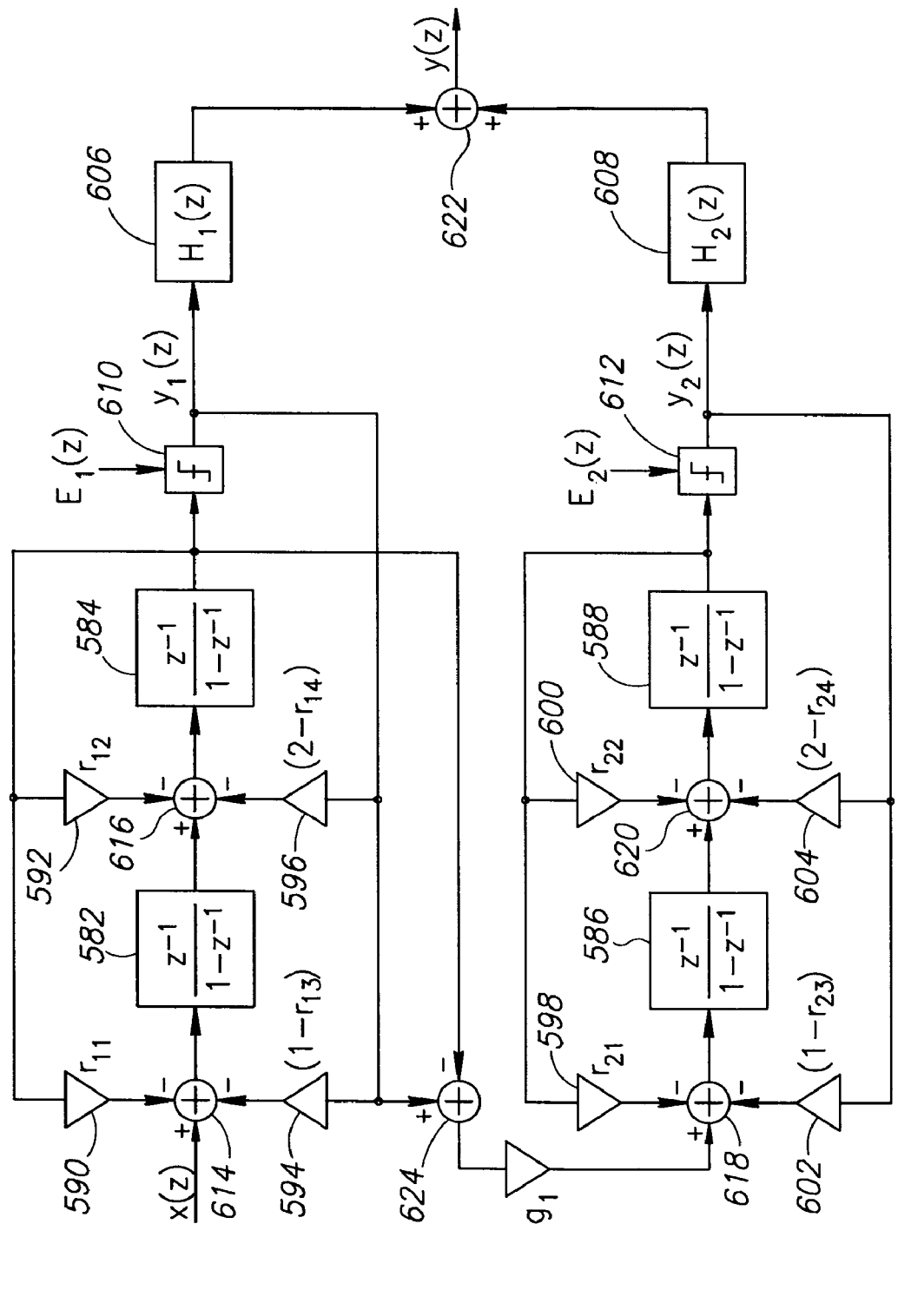
FIG. 33 is a block diagram illustrating the double notch band pass $\Sigma\Delta$ modulator.

Since this is a MASH structure, we use the single notch structure described supra to construct the double notch as shown in FIG. 33. The double notch ΣΔ modulator, generally referenced 580, comprises accumulator blocks 582, 584, 586, 588, transform blocks 606, 608, gain elements 590, 592, 594, 596, 598, 599, 600, 602, 604, comparators 610, 612 and summers 614, 616, 618, 620, 622. The error signal from the first stage is passed through to the second stage as an input signal. The output of the first and the second are passed through combiner blocks before added at the end.

From Equation (92) the output of a single stage is given by:

$$Y_1(z) = \frac{z^{-2}x(z) + E_1(z)T_1(z)}{D_1(z)}$$

Since the input to the second stage is $g_1 E_1(z)$, then the output of the second stage is given by $$Y_2(z) = \frac{z^{-2}g_1 E_1(z) + E_2(z)T_2(z)}{D_2(z)}$$

The final output of Y(z) after the combiners is $$Y(z) = H_1(z)Y_1(z) + H_2(z)Y_2(z)$$

Let
$$H_1(z) = z^{-2}D_1(z)$$
$$H_2(z) = T_1(z)D_2(z)$$

then

-continued $$Y(z) = \left[\frac{z^{-2}x(z) + E_1(z)T_1(z)}{D_1(z)}\right][z^{-2}D_1(z)] + \left[\frac{z^{-2}g_1E_1(z) + E_2(z)T_2(z)}{D_2(z)}\right][T_1(z)D_2(z)]$$

If $r_{11}=r_{12}=r_{13}=r_{14}=r_1$ and $r_{21}=r_{22}=r_{23}=r_{24}=r_2$ then $$D_1(z)=D_2(z)=1$$

Let $$g_1=-1$$

$$Y(z)=z^{-4}x(z)+z^{-2}E_1(z)T_1(z)-z^{-2}E_1(z)T_1(z)+E_2(z)T_1(z)T_2(z)$$

$$Y(z)=z^{-4}x(z)+E_2(z)T_1(z)T_2(z) \quad (93)$$

where $$T_1(z)=1-z^{-1}(2-r_1)+z^{-2}$$

$$T_2(z)=1-z^{-1}(2-r_2)+z^{-2}$$

where $T_1(z)$ and $T_2(z)$ represent two notches defined by $r_1$ and $r_2$, respectively.

Figure 34A:
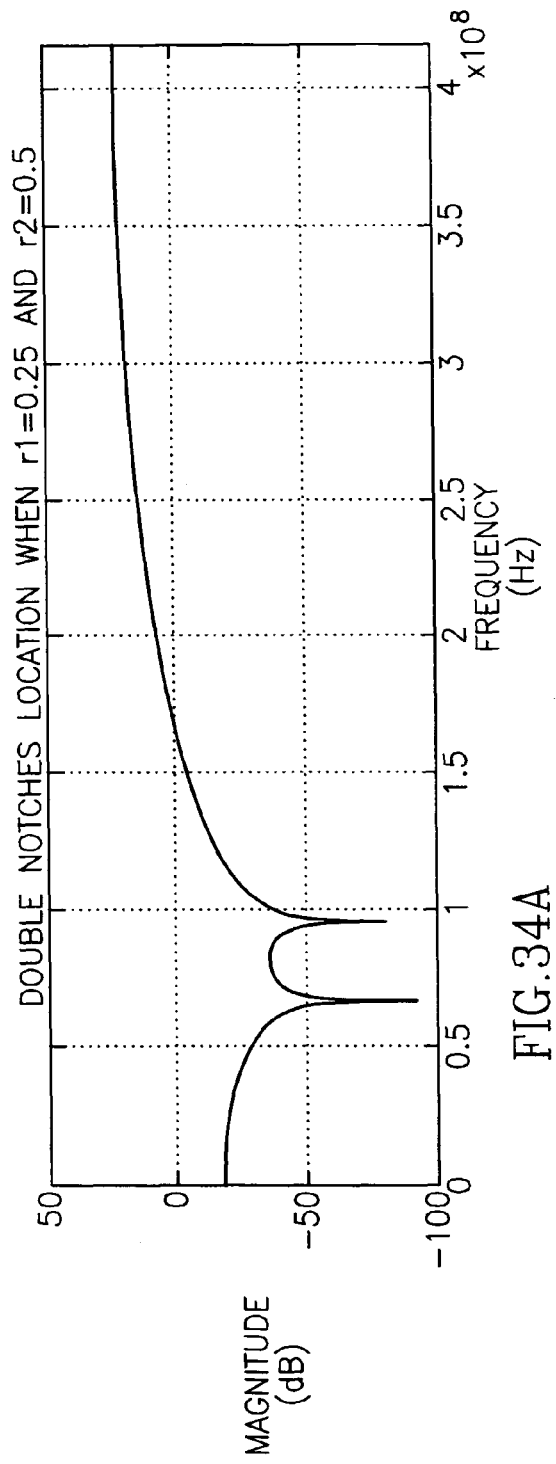
FIGS. 34A and 34B are plots illustrating the frequency response of double notches when $r_1=0.25$ and $r_2=0.5$.
Figure 34B:
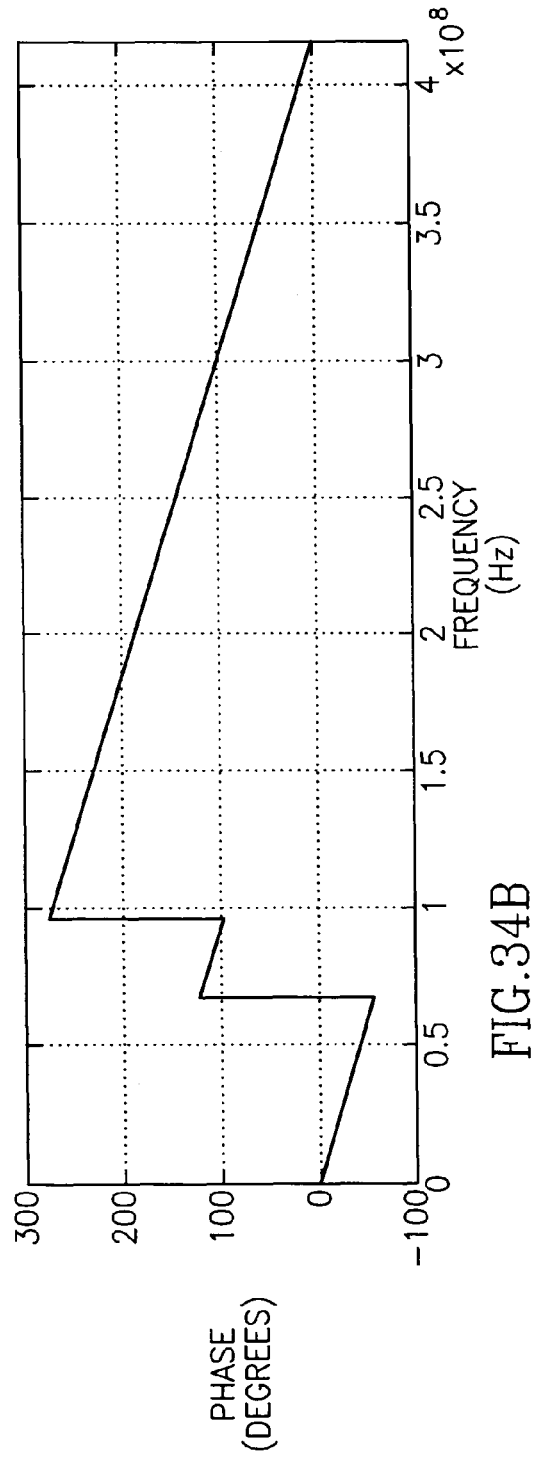

FIGS. 34A and 34B show the frequency spectrum of the double notched output of the modulator when $r_1=0.25$ and $r_2=0.5$. Note that since the system comprises a MASH structure, it is appreciated that one skilled in the art can further expand the system by adding additional stages.

A second example using a double notch band pass $\Sigma\Delta$ without a low pass $\Sigma\Delta$ uses the following parameters: $N_i=9$, $N_f=7$, $F_{Sbb}=26$ MHz, $F_{Srf}=832$ MHz. Let L=0 with no low pass $\Sigma\Delta$ in the fractional part. Let $r_1=0.5$ and $r_2=1.5$ for the double notches in the band-pass sigma-delta stage. This corresponds to $\phi_1=0.7227$ rad and $\phi_2=1.3181$, which are equivalent to frequencies $0.115 \cdot F_{Srf}$ and $0.21 \cdot F_{Srf}$. For $F_{Srf}=832$ MHz, the notches appear at 96 MHz and 174.5 MHz frequency distances from the carrier. Let M=3, which is the comb filter notch that appears at $$\frac{F_{Srf}}{6} = 138.7 \text{ MHz}.$$

Figure 35:
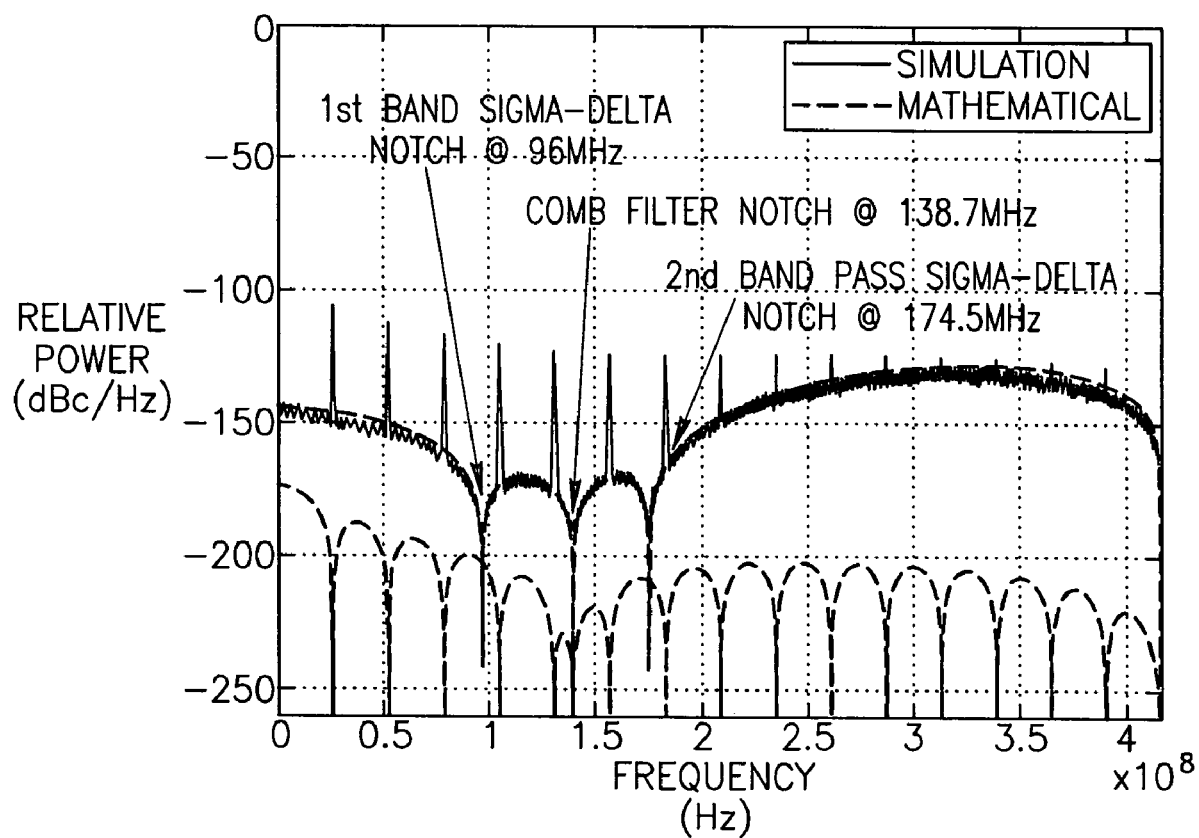
FIG. 35 is a plot illustrating the spectrum of an EDGE signal with double notch band pass $\Sigma\Delta$ modulator.

A frequency spectrum plot of a double notch band pass $\Sigma\Delta$ for EDGE is shown in FIG. 35.

3.8 Combining a Low Pass $\Sigma\Delta$ with a Band Pass Stage

Figure 36:
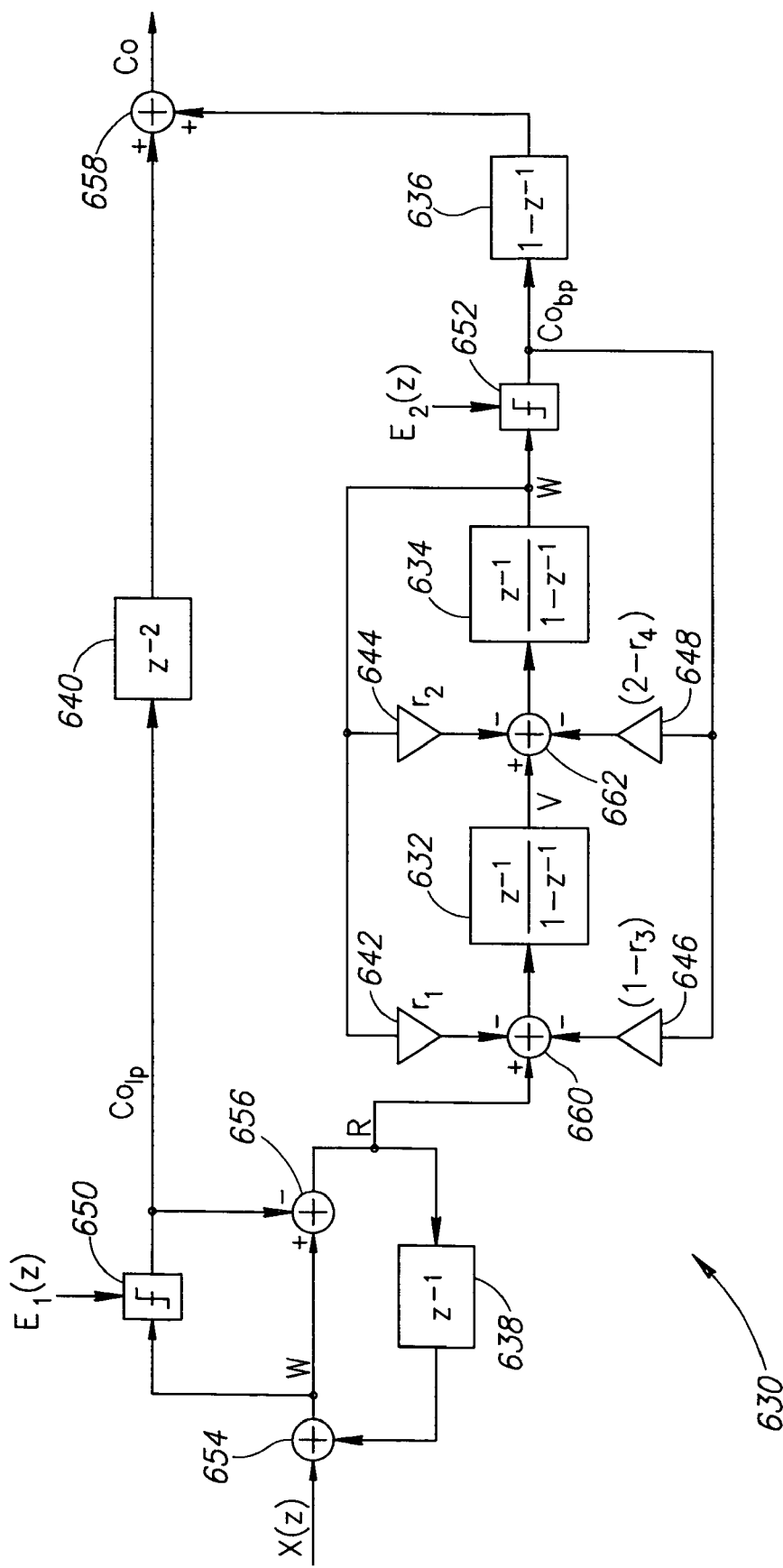
FIG. 36 is a block diagram illustrating the low pass $\Sigma\Delta$ modulator combined with a single notch band pass $\Sigma\Delta$ modulator.

As an illustrative example, we will derive the $1^{st}$ order low pass combined with the single notch band pass as shown in FIG. 36. The $\Sigma\Delta$ circuit, generally referenced 630, comprises accumulator blocks 632, 634, 636, delay element 638, 640, gain elements 642, 644, 646, 648, comparators 650, 652 and summers 654, 656, 658, 660, 662. From Equation (78):

$$R(z) = \frac{X(z) - Co_{lp}}{(1-Z^{-1})}$$

From Equation (77):

$$Co_{lp} = X(z) + E_1(z)(1-Z^{-1})$$

and from Equation (92)

$$Co_{bp} = Z^{-2}R(z) + E_2(z)[1 - 2\cos(\phi)Z^{-1} + Z^{-2}]$$
$$= Z^{-2}\left[\frac{X(z) - Co_{lp}}{(1-Z^{-1})}\right] + E_2(z)[1 - 2\cos(\phi)Z^{-1} + Z^{-2}]$$

$$Co = Z^{-2}Co_{lp} + (1 - Z^{-1})Co_{bp}$$
$$= Z^{-2}Co_{lp} + Z^{-2}X(z) - Z^{-2}Co_{lp} + E_2(z)(1-Z^{-1})(1-2\cos(\phi)Z^{-1}+Z^{-2})$$
$$= Z^{-2}X(z) + E_2(z)(1-Z^{-1})(1-2\cos(\phi)Z^{-1}+Z^{-2})$$

The quantization noise in the final output is shaped by both the low-pass and the band-pass transfer functions. It is appreciated by one skilled in the art that different combinations of different orders of low-pass and band-pass can be derived in a similar manner.

The following example illustrates the combination of a $2^{nd}$ order low pass $\Sigma\Delta$ stage, comb filter stage and a single notch band pass $\Sigma\Delta$ stage. We set $N_i=9$, $N_f=7$, $F_{Sbb}=26$ MHz, $F_{Srf}=832$ MHz. Let L=2, which enables a $2^{nd}$ order low pass $\Sigma\Delta$ in the fractional part. Let $r_1=0.5$ for a single notch in the band pass $\Sigma\Delta$ stage. This corresponds to $\phi_1=0.7227$ rad, which is equivalent to a frequency of $0.115 \cdot F_{Srf}$. For $F_{Srf}=832$ MHz, the notch occurs at 96 MHz. Let M=3, the comb filter notch that occurs at $$\frac{F_{Srf}}{6} = 138.7 \text{ MHz}.$$

Figure 37:
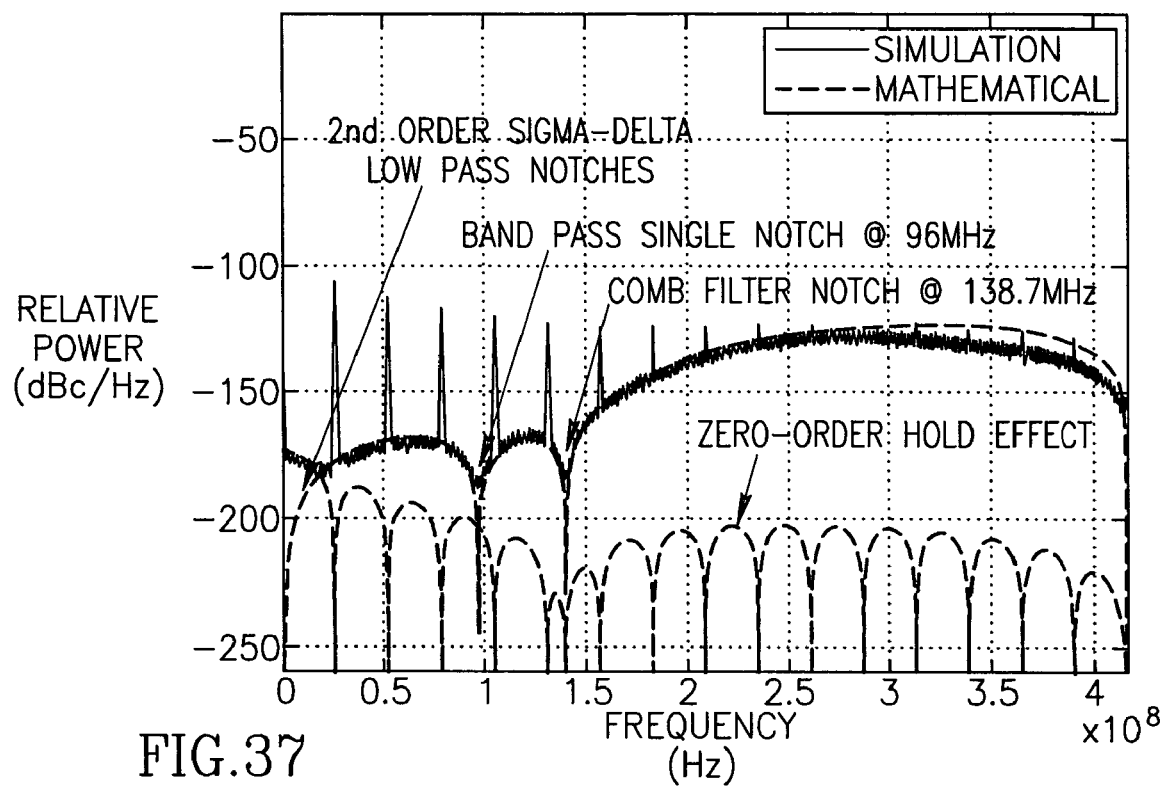
FIG. 37 is a plot illustrating the spectrum of an EDGE signal using low pass with $\Sigma\Delta$, band pass $\Sigma\Delta$ and a comb filter.

The output spectrum for this example EDGE system is shown in FIG. 37.

3.9 SAM Block Parameters for EDGE Far Out Noise Requirements

According to Table 6 presented above, we can set the different parameters for the SAM block to meet the receive band noise floor requirements. For all cases the following default parameters are used: $N_i=9$, $N_f=7$, $F_{Sbb}=104$ MHz, $F_{Srf}=832$ MHz.

For GSM-850, when the TX is at 824 MHz; the RX band starts 45 MHz from the TX and ends 70 MHz away. In this case a $3^{rd}$ order low pass $\Sigma\Delta$ and a comb filter with M=6 are used. With a TX frequency of 849 MHz, the RX band starts 20 MHz away and ends the RX band ends 45 MHz away. In this case, a $2^{nd}$ order low pass $\Sigma\Delta$ and a comb filter with M=9 are used.

For E-GSM, with a TX of 880 MHz, the RX band starts 45 MHz away and ends 80 MHz away. In this case a $3^{rd}$ order low pass $\Sigma\Delta$ and a comb filter with M=5 are used. With the TX at 915 MHz, the RX band starts 10 MHz away and ends 45 MHz away. In this case a $2^{nd}$ order low pass $\Sigma\Delta$ with a comb filter with M=9 are used.

Figure 38:
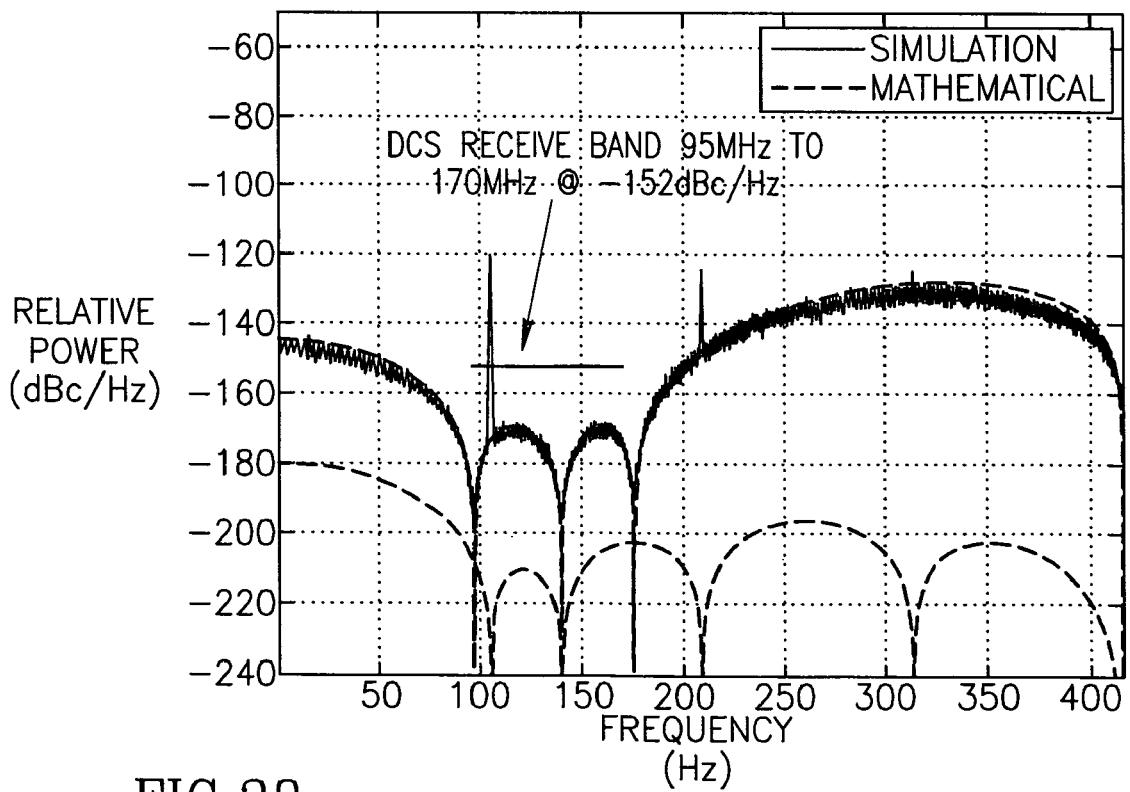
FIG. 38 is a plot illustrating the spectrum of an EDGE signal in the DCS band when the TX channel is at 1710 MHz.

For DCS-1800, with a TX channel at 1710 MHz, the RX band starts 95 MHz away and ends 170 MHz away. In this case we do not use a low pass $\Sigma\Delta$ but rather use a double notch band pass $\Sigma\Delta$ with $r_1=0.5$ and $r_2=1.5$ combined with a comb filter with M=3. The EDGE spectrum for this DCS-1800 band with a TX channel of 1710 MHz is shown in FIG. 38. With a TX channel at 1785 MHz, the RX band starts 20 MHz away and ends 95 MHz away. In this case a $2^{nd}$ order low pass ΣΔ, a single notch band pass ΣΔ and a comb filter with M=6 are used.

For PCS-1900, with a TX channel at 1850 MHz, the RX band starts 80 MHz away and ends 140 MHz away. In this case a $1^{st}$ order low pass ΣΔ, a double notch band pass ΣΔ with $r_1=0.5$ and $r_2=1$ and a comb filter with M=4 are used. With a TX channel at 1910 MHz, the RX band starts 20 MHz away and ends 80 MHz away. In this case a $3^{rd}$ order low pass ΣΔ and a comb filter with M=5 are used.

In an alternative embodiment, the spectral emission shaping sigma delta modulator scheme of the present invention can be applied to a fully digital Cartesian (I, Q) architecture for a complex modulator. An example Cartesian modulator suitable for use with the present invention is described in detail in U.S. application Ser. No. 11/203,504, filed Aug. 11, 2005, entitled "Method And Apparatus For A Fully Digital Quadrature Modulator," incorporated herein by reference in its entirety. The complex modulator described herein can substitute for existing prior art analog quadrature modulator structures. Further, the complex modulator can also substitute for existing prior art modulators based on a digital polar architecture (r, θ).

The digital complex modulator described herein may be regarded as a complex digital-to-analog converter where the digital inputs are given in Cartesian form (i.e. I and Q representing the complex number I+jQ) and the output is an RF signal having a corresponding amplitude and phase shift. The phase shift being with respect to a reference phase dictated by the local oscillator, which is also input to the converter/modulator.

The complex modulator can be constructed using dual I and Q transistor arrays, single ended and differential outputs, and single and dual polarities. Both positive and negative values of I and Q are supported. For a single polarity (i.e. single-ended structure), negative values of I and Q are effectively generated by phase shifting the I or Q value 180 degrees. This is realized by inverting the phase of the switching signal of the transistors such that they would be turned on during the negative portion rather than the positive portion of the RF cycle.

With reference to FIG. 6, instead of dedicating separate sigma-delta modulators to the I and Q branches (for resolution enhancement and spectral emission shaping) and then having to produce the I+Q and I−Q results at high rate (the sigma-dithering rate would be in the order of the RF carrier frequency), the sigma-delta branches receive at their inputs the I+Q and I−Q signals obtained at low rates. The two other phases, i.e. I+Q) and −(I−Q), can be easily generated at high rate using simple negation, for example, whereas the need for addition/subtraction at high-rate is thereby eliminated.

Figure 39:
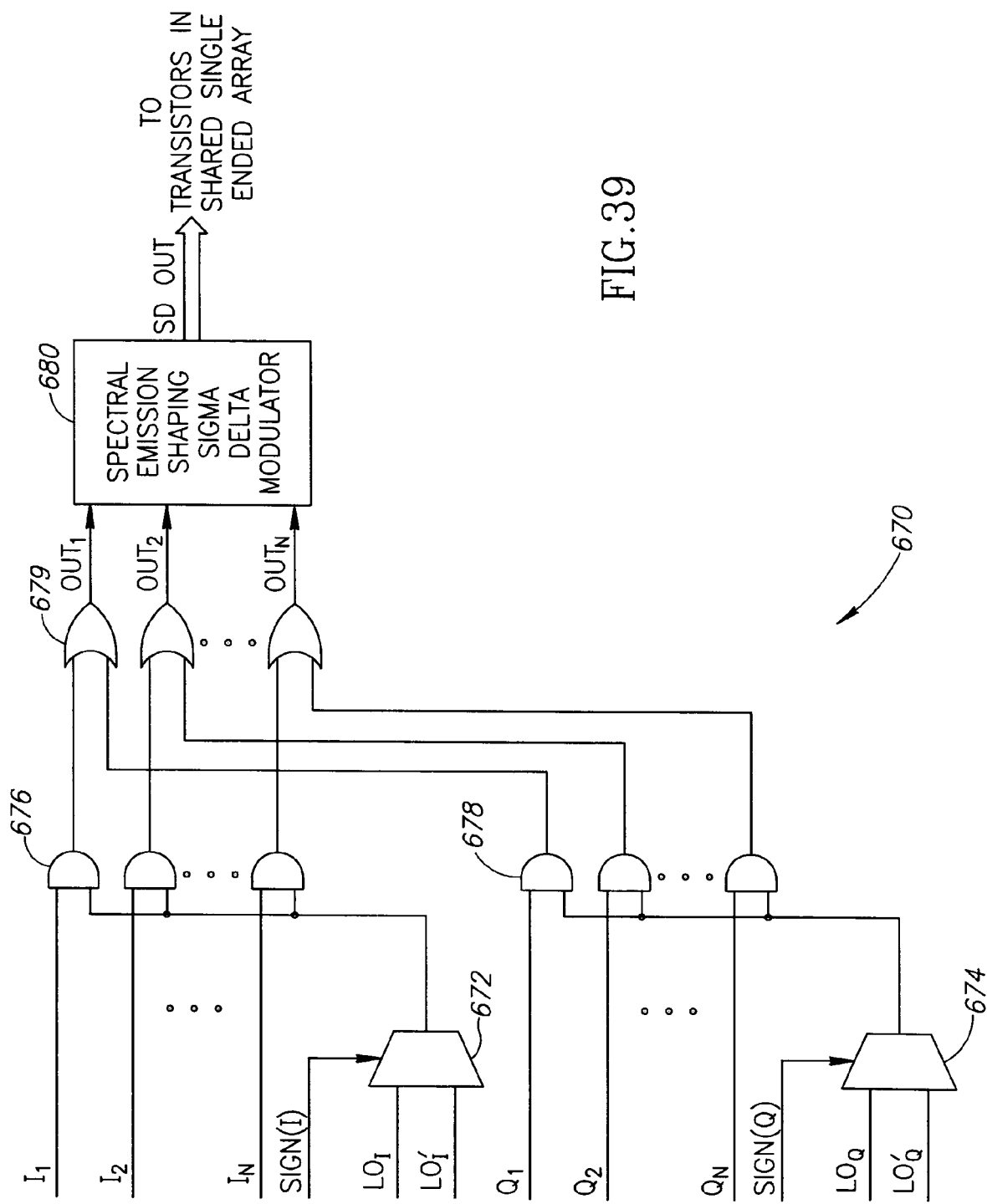
FIG. 39 is a block diagram illustrating an example structure of a complex digital modulator incorporating a single shared array of single-ended topology with binary weighting.

A block diagram illustrating an example structure of a complex digital modulator incorporating a single shared array of single-ended topology with binary weighting is shown in FIG. 39. The circuit, generally referenced 670, comprises I and Q multiplexers 672, 674, I and Q AND gates 676, 678 and OR gates 679. The circuit 670 functions to realize the gating function (i.e. multiplication with the LO signals) for each bit in the N-bit digital I and Q signals, where N is the width of the I and Q words (chosen according to the resolution to be supported). In operation, the select inputs of the multiplexers 672, 674 are the sign of I and Q, respectively. Positive values of I couple the $LO_I$ clock signal to the AND gates 676 while negative values of I couple the $LO'_I$ clock signal to the AND gates. Similarly, positive values of Q couple the $LO_Q$ clock signal to the AND gates 678 while negative values of Q couple the $LO'_Q$ clock signal to the AND gates. The outputs of the two sets of AND gates are ORed 679 to generate the output signals $OUT_1$ through $OUT_N$ which are subsequently input to a spectral emission shaping sigma delta modulator 680 which can be constructed using any of the techniques described hereinabove. The SD OUT output of the sigma delta modulator is then input to the gates of the transistors in the transistor array (not shown).

Note that only a single (i.e. combined) sigma delta dithering mechanism is required at the outputs of the complex modulator logic of FIG. 39. The sigma delta modulator applies dithering to the digital signal representing the I+jQ result (obtained by means of time-shifting). The pulses output of the quadrature modulator (see FIGS. 40A and 40B described below) have a finer magnitude resolution due to the dithering. Since the transistors are shared in this scheme, two separate banks for sigma delta modulation transistors are not needed. A single bank is shared for I and Q purposes thus saving the current associated with the high rate switching in the sigma delta logic.

Diagrams illustrating waveforms of example outputs of the array for the modulator structure of FIG. 39 are shown in FIGS. 40A and 40B. FIG. 40A illustrates the output waveform from the transistor array (not shown) for the values I=3 and Q=5. Since both I and Q are positive, the $LO_I$ and $LO_Q$ $T_P$ pulses are passed by the multiplexers 672, 674 (FIG. 39) and gated to generate the input signal to the array. The AND gates effectively perform the multiplication by 3 and 5 and the result is applied to the appropriate weights of the transistor array.

FIG. 40B illustrates the output waveform from the transistor array (not shown) for the values I=3 and Q=−4. Since I is positive and Q is negative, the $LO_I$ and $LO'_Q$ $T_p$ pulses are passed by the multiplexers 672, 674 (FIG. 39) and gated to generate the input signal to the array. The AND gates effectively perform the multiplication by 3 and 4 (positive four since $LO'_Q$ clock signal is used and the sign bit of Q is separated from the magnitude word) and the result is applied to the appropriate weights of the transistor array. Note that a pulse of magnitude 4 now appears half a cycle (180 degrees) shifted from where the pulse of magnitude 5 appeared in the previous example, thus representing the shift from the first quadrant to the fourth one.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A polar transmitter, comprising:
   a first input for receiving an amplitude information signal;
   a second input for receiving an angle information signal;
   a frequency synthesizer coupled to said second input and operative to generate an angle modulated carrier signal in accordance with said angle information signal;
   a sigma delta modulator having an associated noise transfer function, said sigma delta modulator coupled to said first input and operative to generate a dithered amplitude signal therefrom and to selectively attenuate said noise transfer function;
   an amplifier coupled to said frequency synthesizer and said sigma delta modulator, said amplifier operative to control the amplitude of said angle modulated carrier signal in accordance with said dithered amplitude signal;
   wherein quantization noise exhibited by said amplifier is significantly attenuated at one or more selected frequencies; and
   wherein said sigma delta modulator comprises:
      at least one sigma delta stage;
      a comb filter; and a combiner operative to combine the output of said at least one sigma delta stage and said comb filter.

2. The transmitter according to claim 1, wherein said frequency synthesizer comprises all digital phase locked loop (ADPLL).

3. The transmitter according to claim 1, wherein said amplifier comprises a digital power amplifier (DPA) comprising a plurality of discrete levels of amplitude.

4. The transmitter according to claim 1, wherein said sigma delta modulator noise transfer function (NTF) comprises four zeros and no poles thereby creating two spectral notches.

5. The transmitter according to claim 1, wherein said at least one sigma delta stage comprises a programmable order low pass sigma delta stage.

6. The transmitter according to claim 1, wherein said at least one sigma delta stage comprises a programmable order band pass sigma delta stage.

7. The transmitter according to claim 1, wherein said at least one sigma delta stage comprises:
- at least one programmable order low pass sigma delta stage; and
- at least one programmable order band pass sigma delta stage.

8. The transmitter according to claim 1, wherein the transmitter is adapted to be implemented in an Application Specific Integrated Circuit (ASIC).

9. The transmitter according to claim 1, wherein the transmitter is adapted to be implemented in a Field Programmable Gate Array (FPGA).

10. A radio frequency (RF) polar transmitter, comprising:
- a first digital input for receiving an amplitude control word signal;
- a second digital input for receiving a frequency control word signal;
- a frequency synthesizer coupled to said second digital input and operative to generate a phase modulated carrier signal in accordance with said frequency control word signal;
- a sigma delta modulator having an associated noise transfer function, said sigma delta modulator coupled to said first digital input and operative to generate a dithered amplitude control signal and to selectively attenuate said noise transfer function;
- a digitally controlled amplifier comprising a plurality of discrete levels of amplitude and coupled to said frequency synthesizer and said sigma delta modulator, said amplifier operative to control the amplitude of said phase modulated carrier signal in accordance with said dithered amplitude control signal;
- wherein quantization noise exhibited by said amplifier is significantly attenuated at one or more selected frequencies; and
- wherein said sigma delta modulator comprises:
  - at least one sigma delta stage;
  - a comb filter; and
  - a combiner operative to combine the output of said at least one sigma delta stage and said comb filter.

11. The transmitter according to claim 10, wherein said frequency synthesizer comprises an all digital phase locked loop (ADPLL).

12. The transmitter according to claim 10, wherein said at least one sigma delta stage comprises a programmable order low pass sigma delta stage.

13. The transmitter according to claim 10, wherein said at least one sigma delta stage comprises a programmable order band pass sigma delta stage.

14. The transmitter according to claim 10, wherein said at least one sigma delta stage comprises:
- at least one programmable order low pass sigma delta stage; and
- at least one programmable order band pass sigma delta stage.

15. The transmitter according to claim 10, wherein said sigma delta modulator noise transfer function (NTF) comprises four zeros and no poles thereby creating two spectral notches.

16. The transmitter according to claim 10, wherein the transmitter is adapted to be implemented in an Application Specific Integrated Circuit (ASIC).

17. The transmitter according to claim 10, wherein the transmitter is adapted to be implemented in a Field Programmable Gate Array (FPGA).

18. A quadrature transmitter, comprising:
- a first input for receiving an in-phase information signal;
- a second input for receiving a quadrature information signal;
- a first sigma delta modulator having an associated first noise transfer function, said first sigma delta modulator coupled to said first input and operative to generate a dithered in-phase signal therefrom and to selectively attenuate said first noise transfer function;
- a second sigma delta modulator having an associated second noise transfer function, said second sigma delta modulator coupled to said second input and operative to generate a dithered quadrature signal therefrom and to selectively attenuate said second noise transfer function;
- an amplifier coupled to said first sigma delta modulator and said second sigma delta modulator, said amplifier operative to combine the output of said first sigma delta modulator and said second sigma delta modulator to yield a combined radio frequency output signal; and
- wherein quantization noise exhibited by said amplifier is significantly attenuated at one or more selected frequencies.

19. A polar transmitter, comprising:
- a first input for receiving an amplitude information signal;
- a second input for receiving an angle information signal;
- a frequency synthesizer coupled to said second input and operative to generate an angle modulated carrier signal in accordance with said angle information signal;
- a sigma delta modulator having an associated noise transfer function, said sigma delta modulator coupled to said first input and operative to generate a dithered amplitude signal therefrom and to encode data such that quantization noise exhibited by an amplifier is distributed outside at least one frequency band of interest, said sigma delta modulator comprising:
  - a programmable order low pass sigma delta stage, a programmable order band pass sigma delta stage, or any combination thereof;
  - a comb filter;
  - a combiner operative to combine the output of said programmable order low pass sigma delta stage, said programmable order band pass sigma delta stage and said comb filter; and
- said amplifier comprising a plurality of discrete levels of amplitude and adapted to receive the output of said frequency synthesizer and said sigma delta modulator, said amplifier operative to control the amplitude of said angle modulated carrier signal in accordance with the output of said sigma delta modulator.

* * * * *